(12) United States Patent
Cruz

(10) Patent No.: US 10,177,708 B2
(45) Date of Patent: Jan. 8, 2019

(54) WIRE TENSIONING SYSTEM

(71) Applicant: Q Factory 33 LLC, Encinitas, CA (US)

(72) Inventor: Paul Martin Cruz, San Diego, CA (US)

( * ) Notice: Subject to any disclaimer, the term of this patent is extended or adjusted under 35 U.S.C. 154(b) by 0 days.

(21) Appl. No.: 15/699,891

(22) Filed: Sep. 8, 2017

(65) Prior Publication Data

US 2018/0076763 A1   Mar. 15, 2018

Related U.S. Application Data

(60) Provisional application No. 62/385,412, filed on Sep. 9, 2016.

(51) Int. Cl.
| | |
|---|---|
| *H01L 31/044* | (2014.01) |
| *H02S 40/36* | (2014.01) |
| *H02S 30/10* | (2014.01) |
| *H01L 31/00* | (2006.01) |
| *H05K 7/02* | (2006.01) |

(52) U.S. Cl.
CPC ............. *H02S 40/36* (2014.12); *H02S 30/10* (2014.12); *H01L 31/00* (2013.01); *H05K 7/02* (2013.01)

(58) Field of Classification Search
CPC ....... H01L 31/00–31/078; Y02E 10/50–10/60; H02S 10/00–10/40; H02S 20/00–20/32; H02S 30/00–30/20; H02S 40/00–40/40; H02S 50/00–50/15; H02S 99/00
See application file for complete search history.

(56) References Cited

U.S. PATENT DOCUMENTS

| | | | | |
|---|---|---|---|---|
| 6,634,615 | B1 * | 10/2003 | Bick ........................ | H02B 1/54 248/499 |
| 2005/0000561 | A1 * | 1/2005 | Baret .................... | H01L 31/048 136/244 |
| 2013/0075152 | A1 * | 3/2013 | Mazzone ................. | H02G 3/04 174/481 |
| 2016/0308489 | A1 * | 10/2016 | Hudson ................... | H02S 40/36 |

* cited by examiner

*Primary Examiner* — Bach T Dinh
(74) *Attorney, Agent, or Firm* — Knobbe, Martens, Olson & Bear, LLP

(57) ABSTRACT

A wire-tensioning system can be used to maintain tension in power wires extending from components of solar panels. A tensioning component attached to the frame of the solar panel and attached to the power wires can be used to maintain tension in the power wires, both when the power wires are unconnected to power wires of adjacent solar panels, and after the power wires are connected to the power wires of adjacent solar panels. Some attachment structures may be configured to be easily removable and re-attachable to the frame of the solar panel, while other attachment structures may be configured to penetrate or dig into the frame of the solar panel to form a more permanent attachment therebetween.

20 Claims, 47 Drawing Sheets

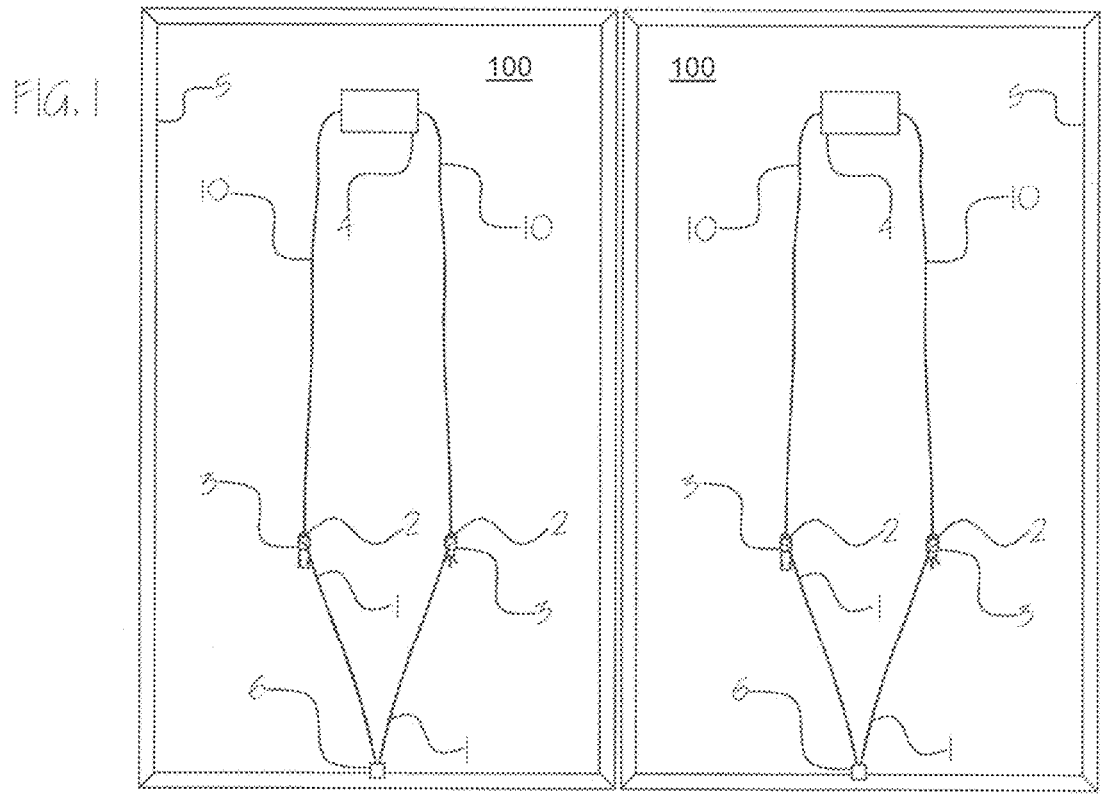
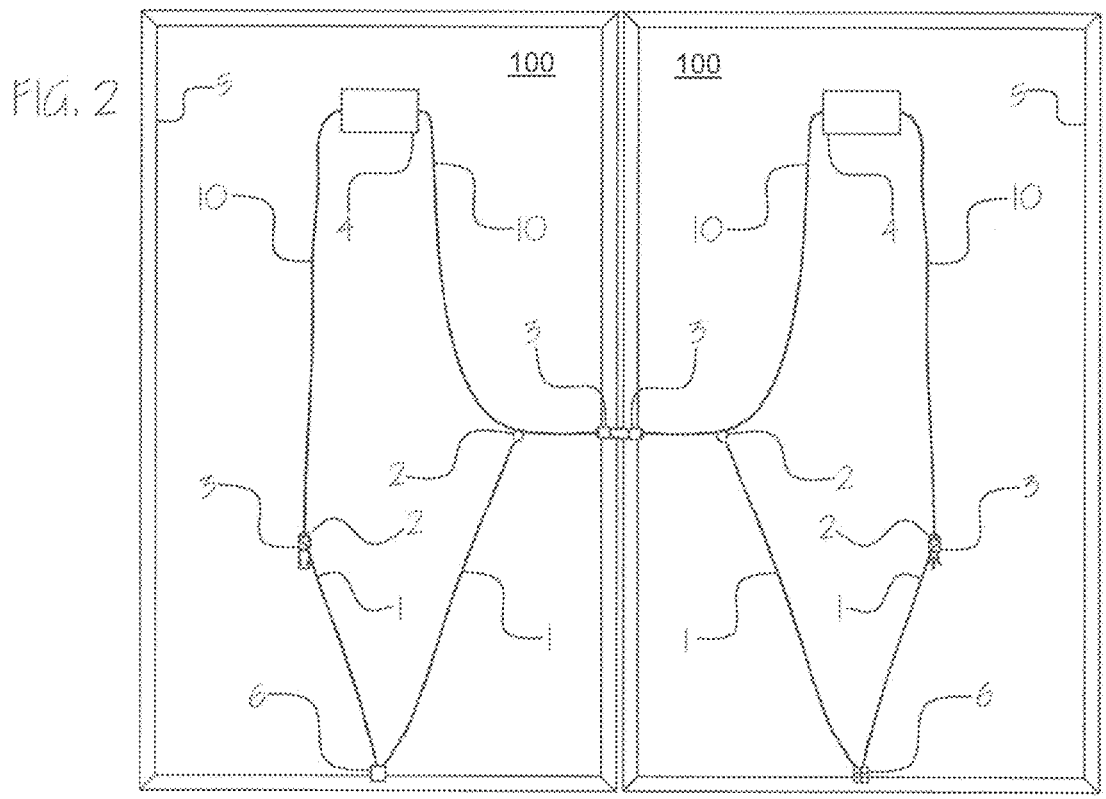

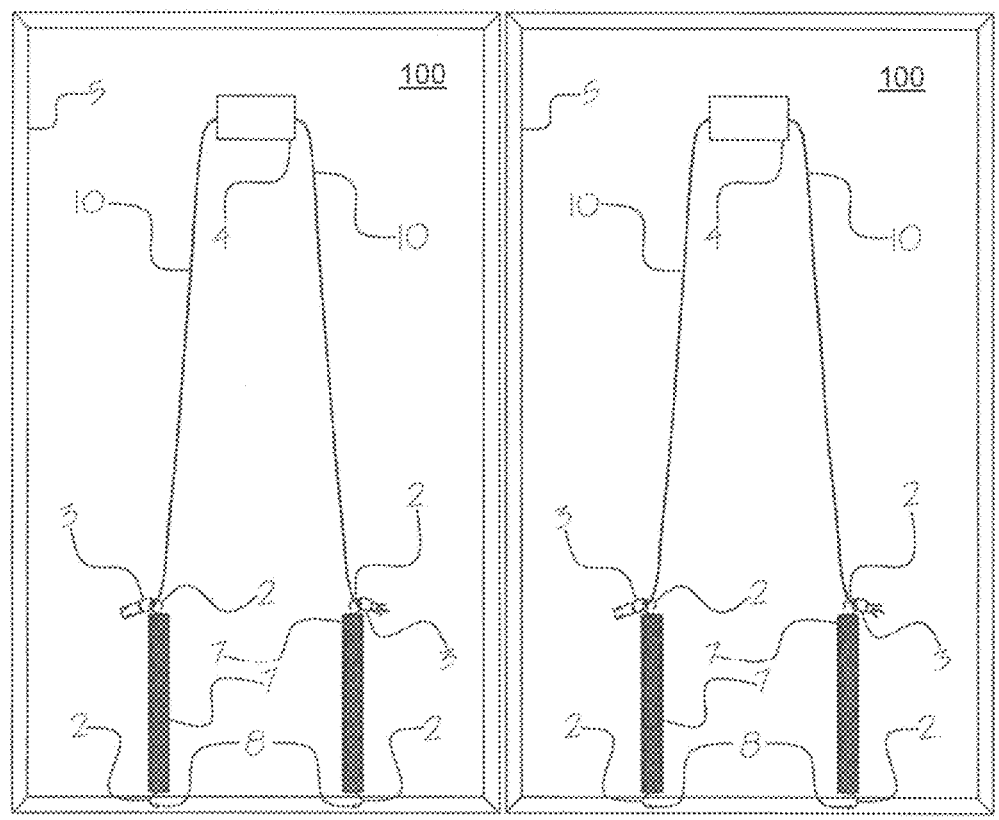
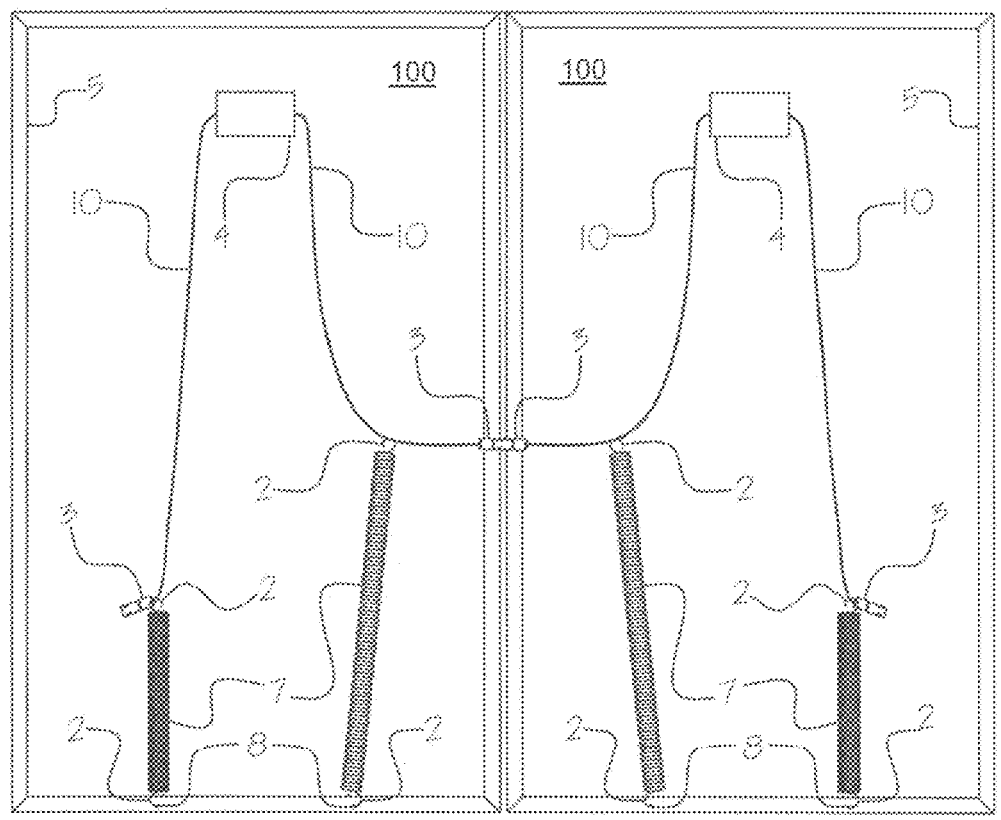

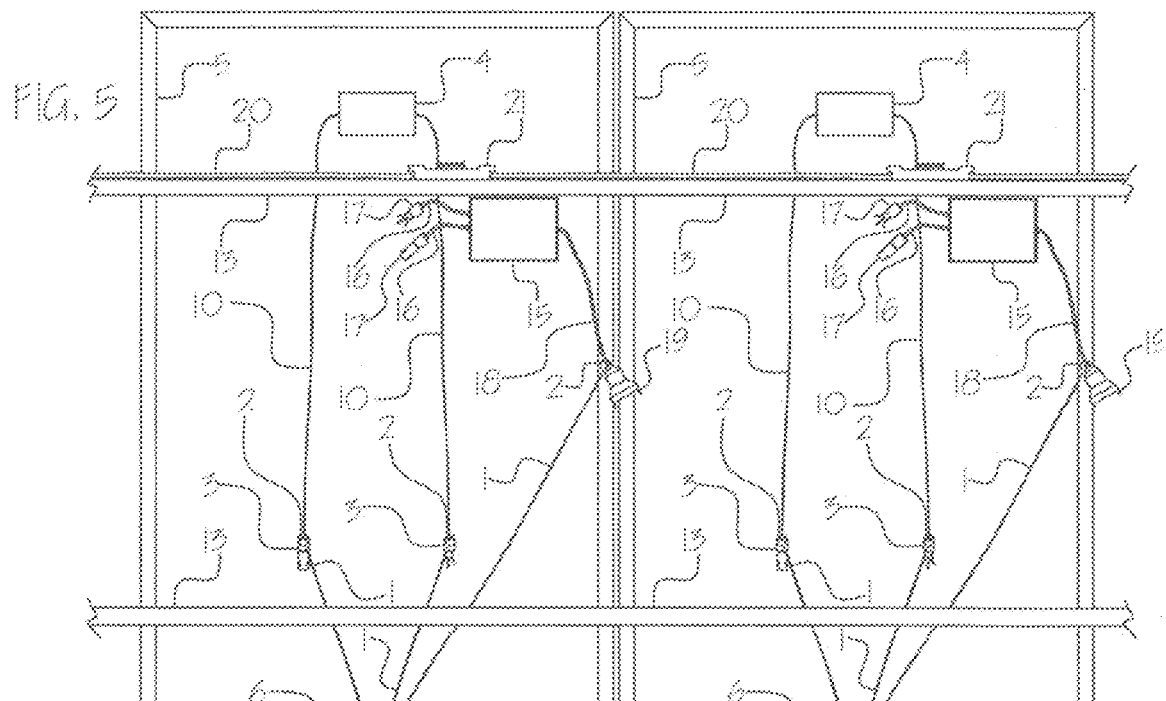
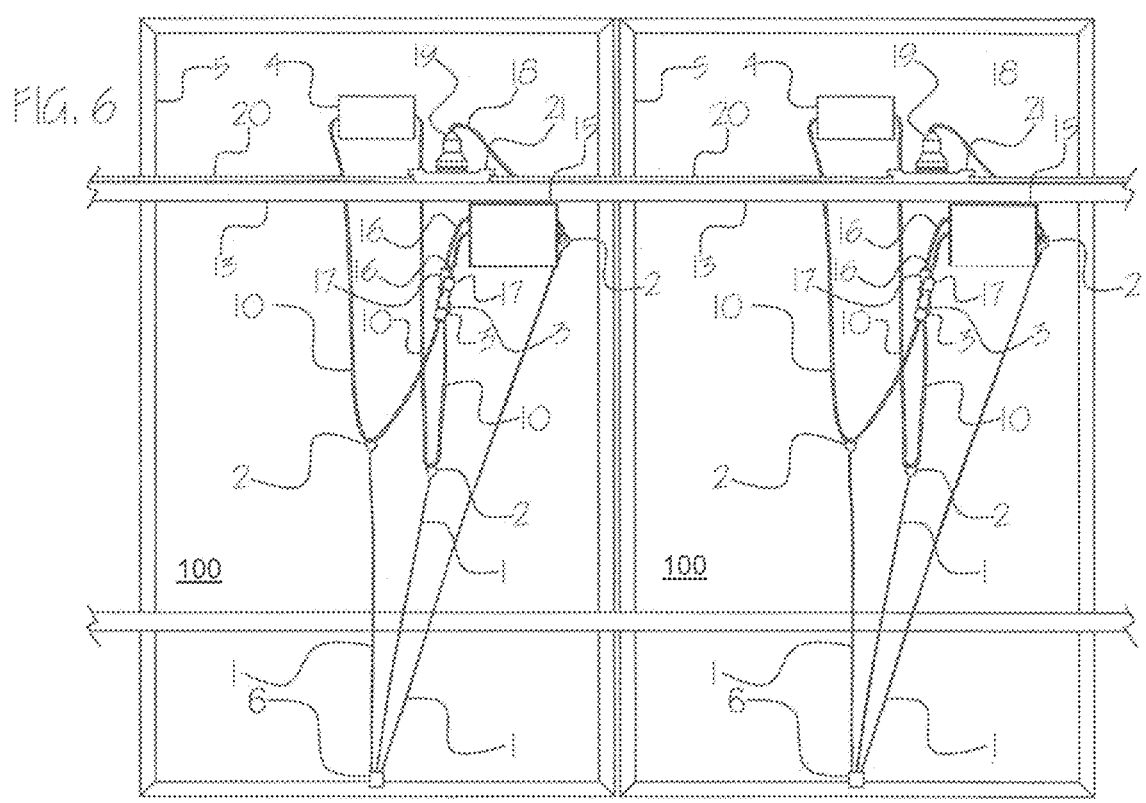

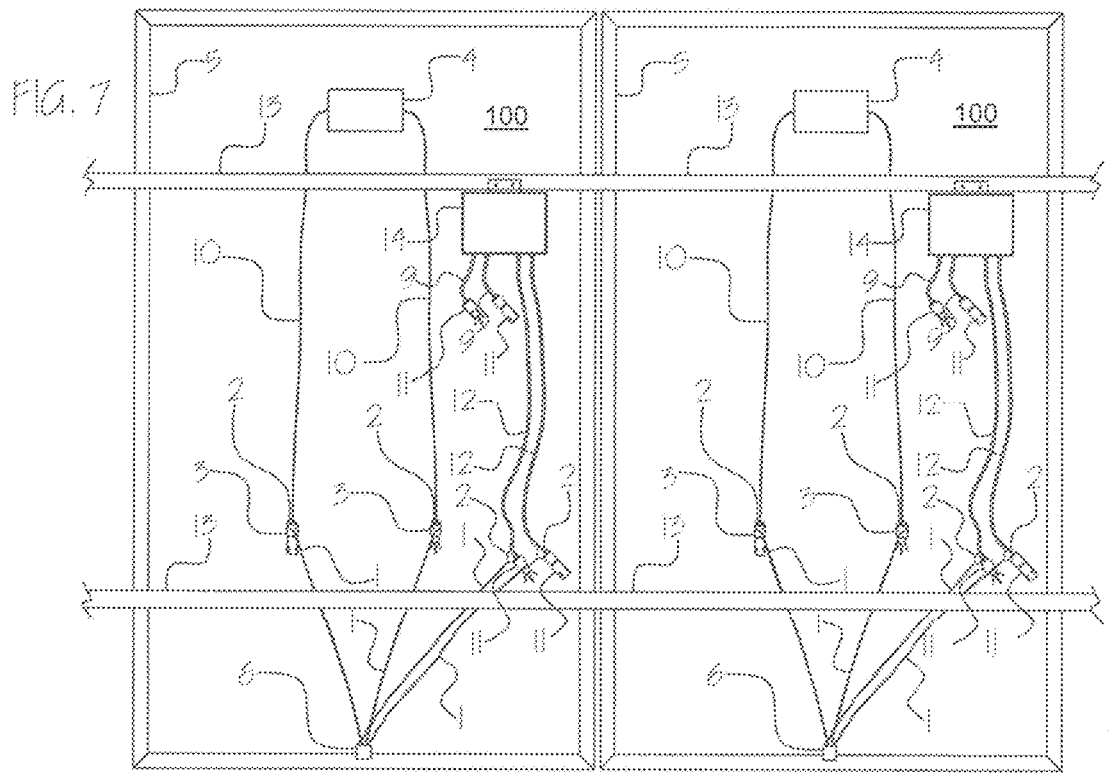
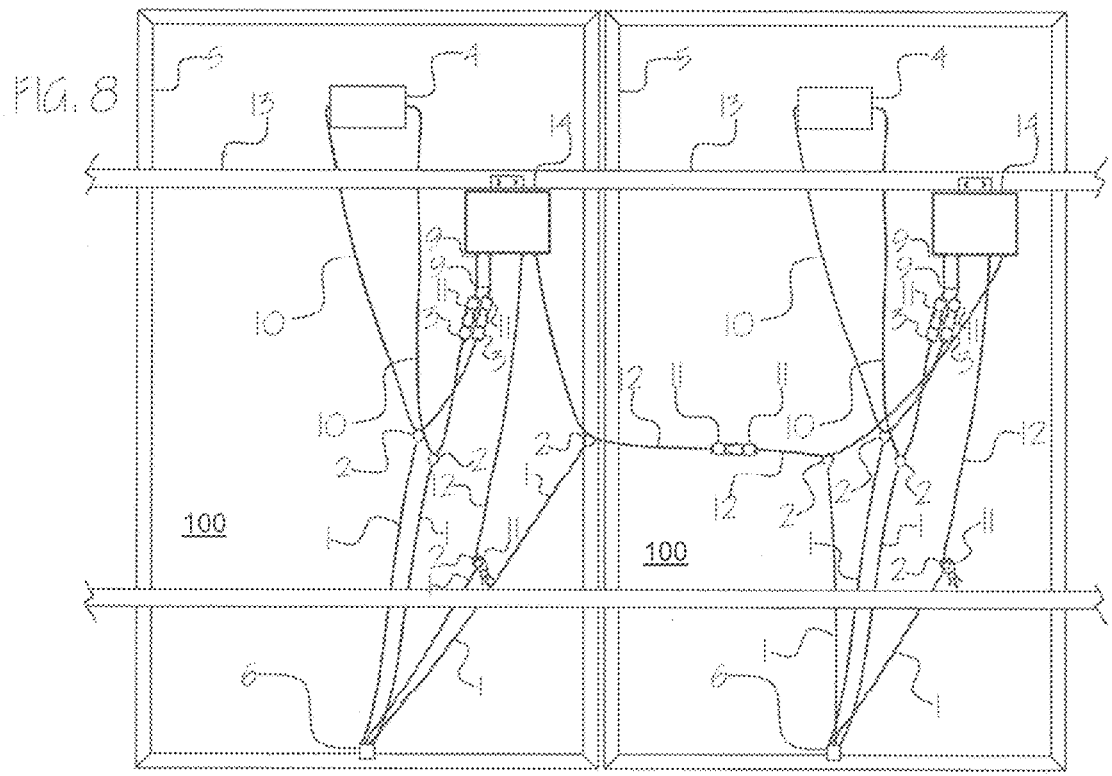

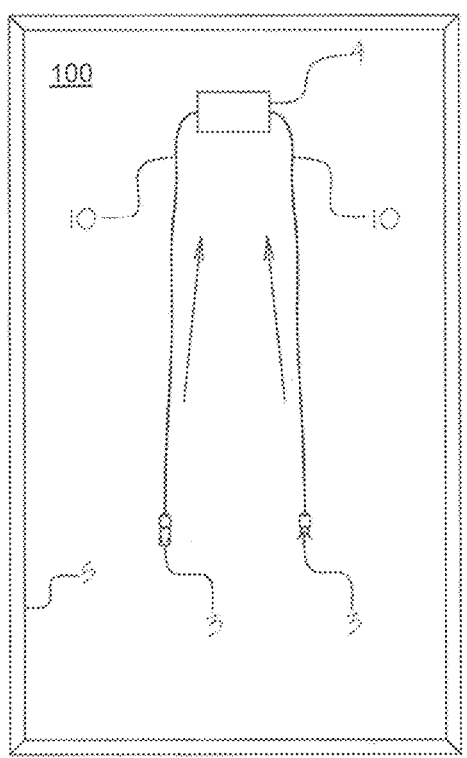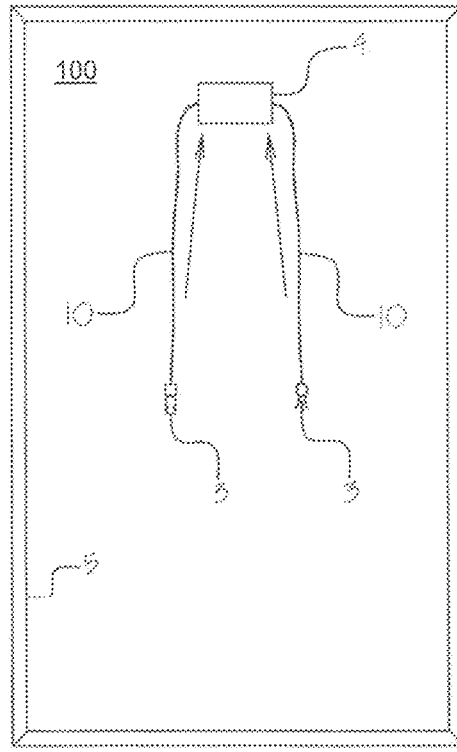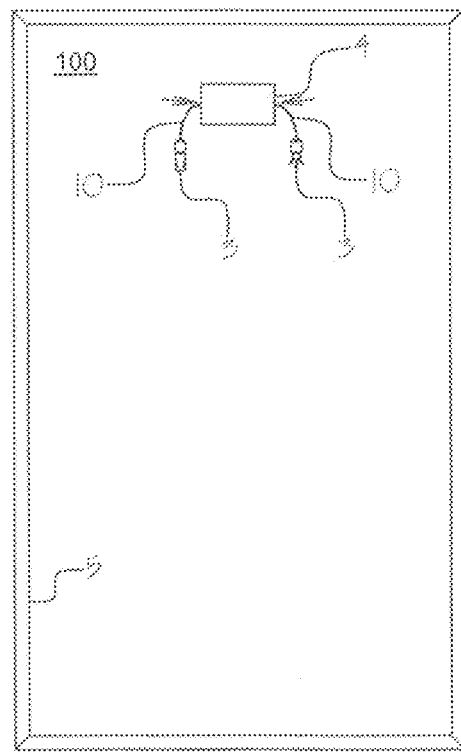

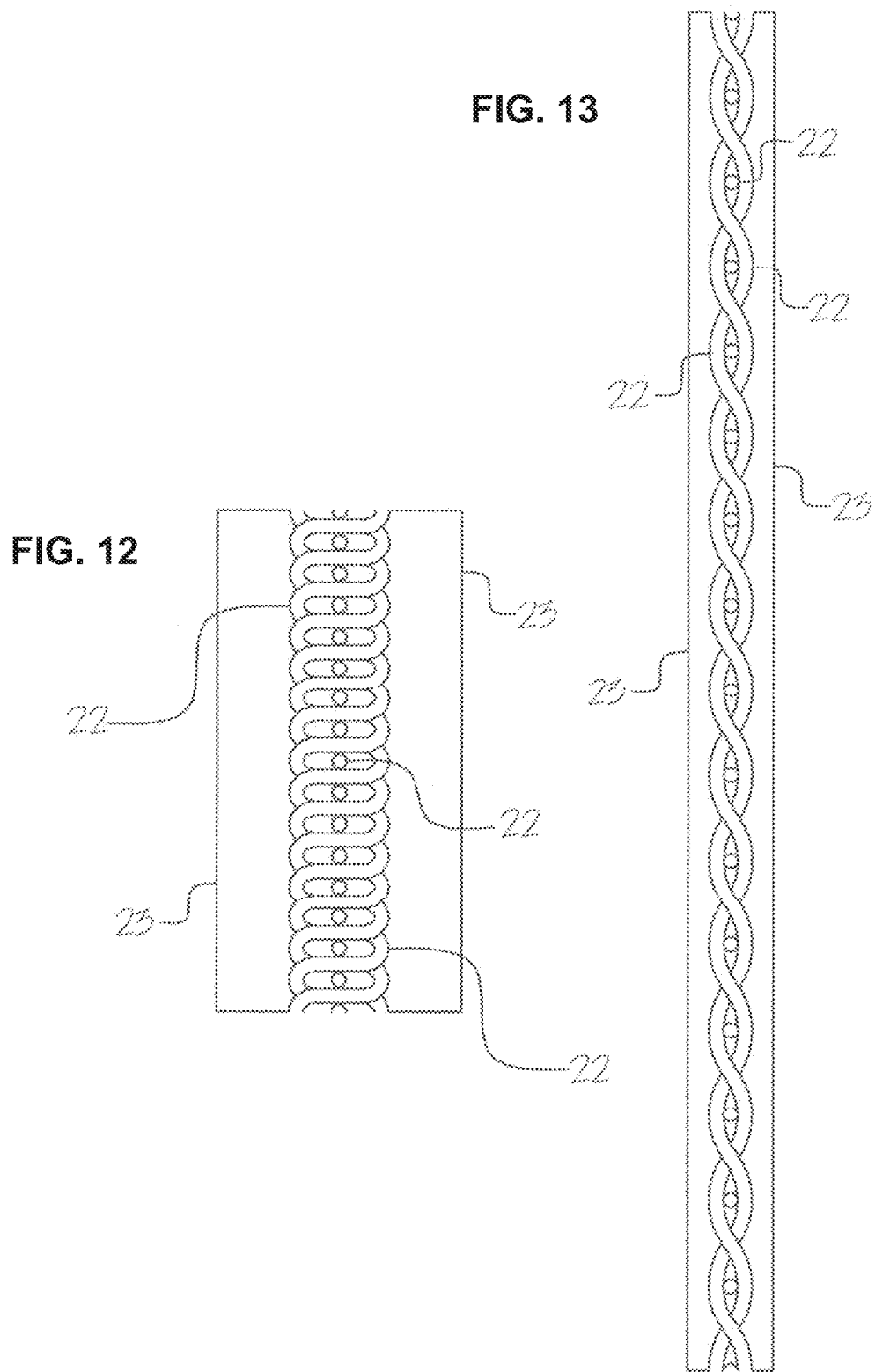

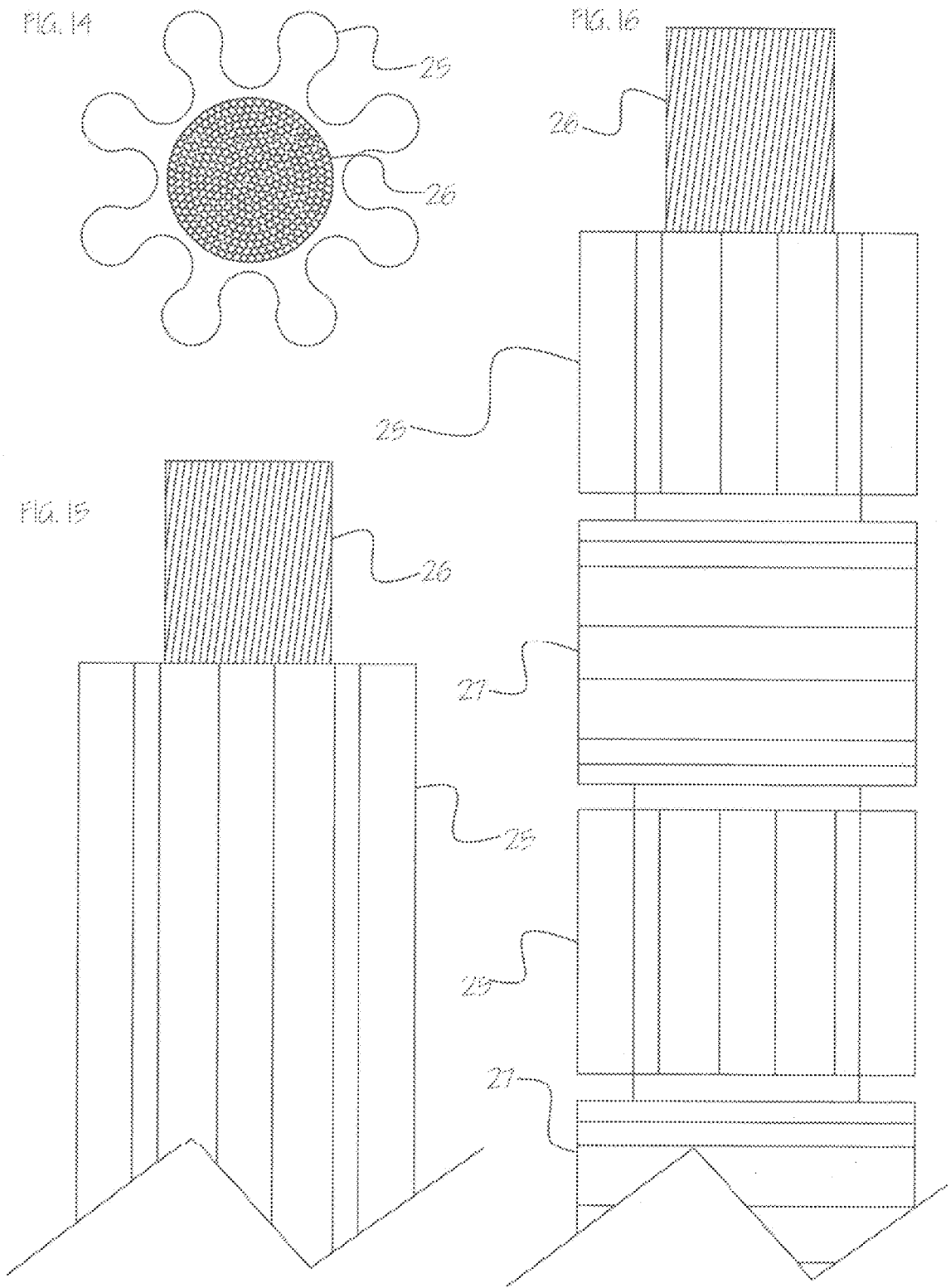

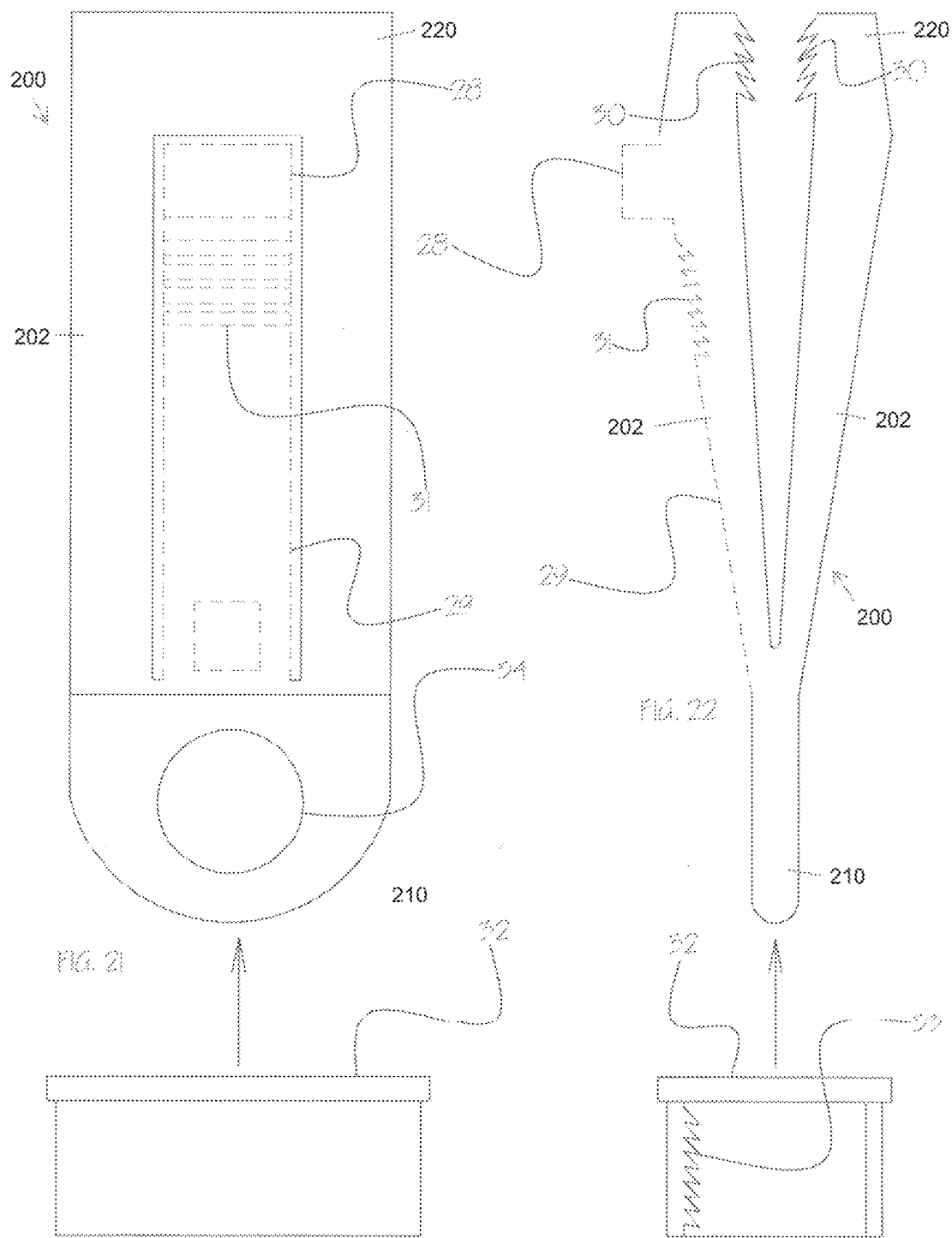

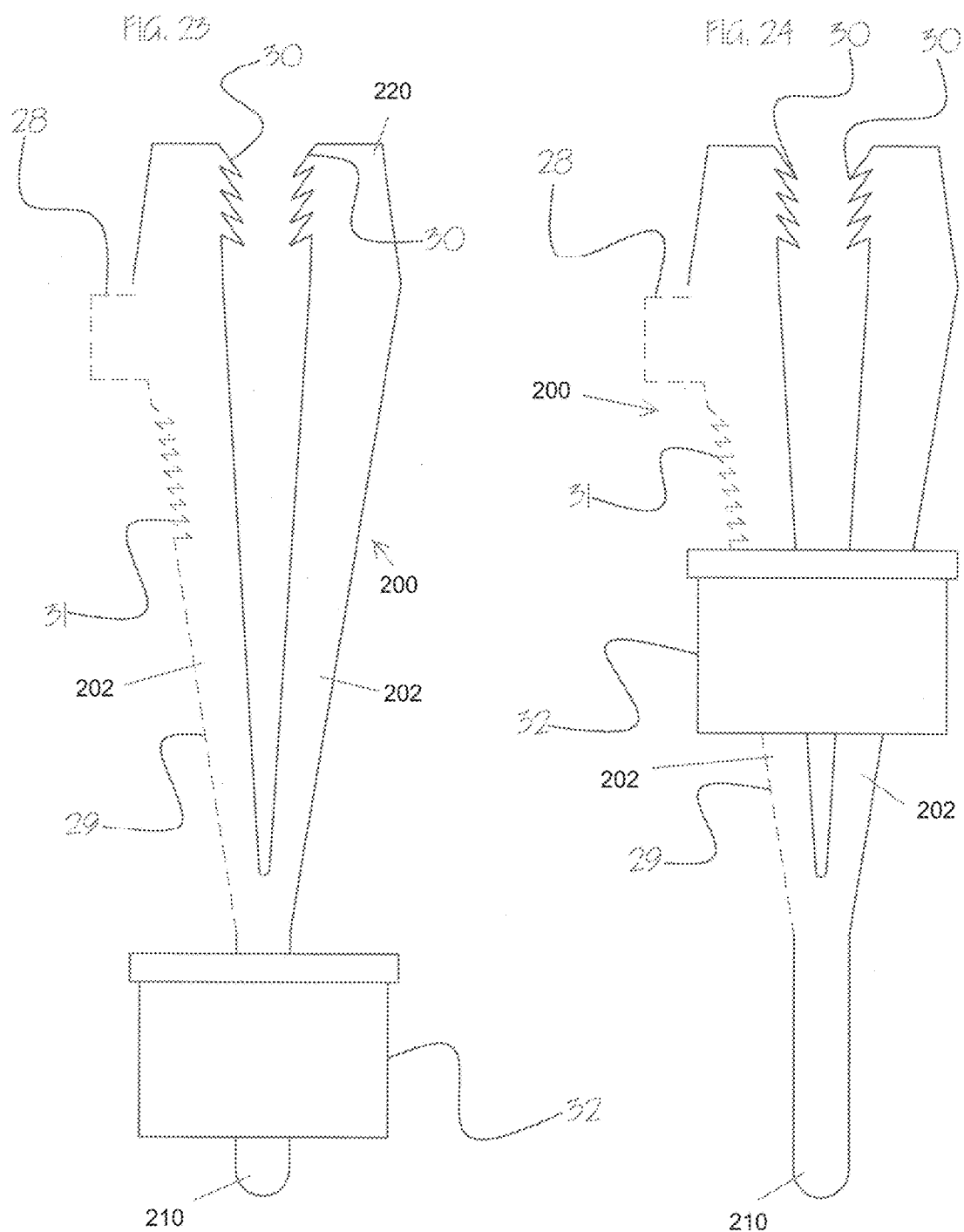

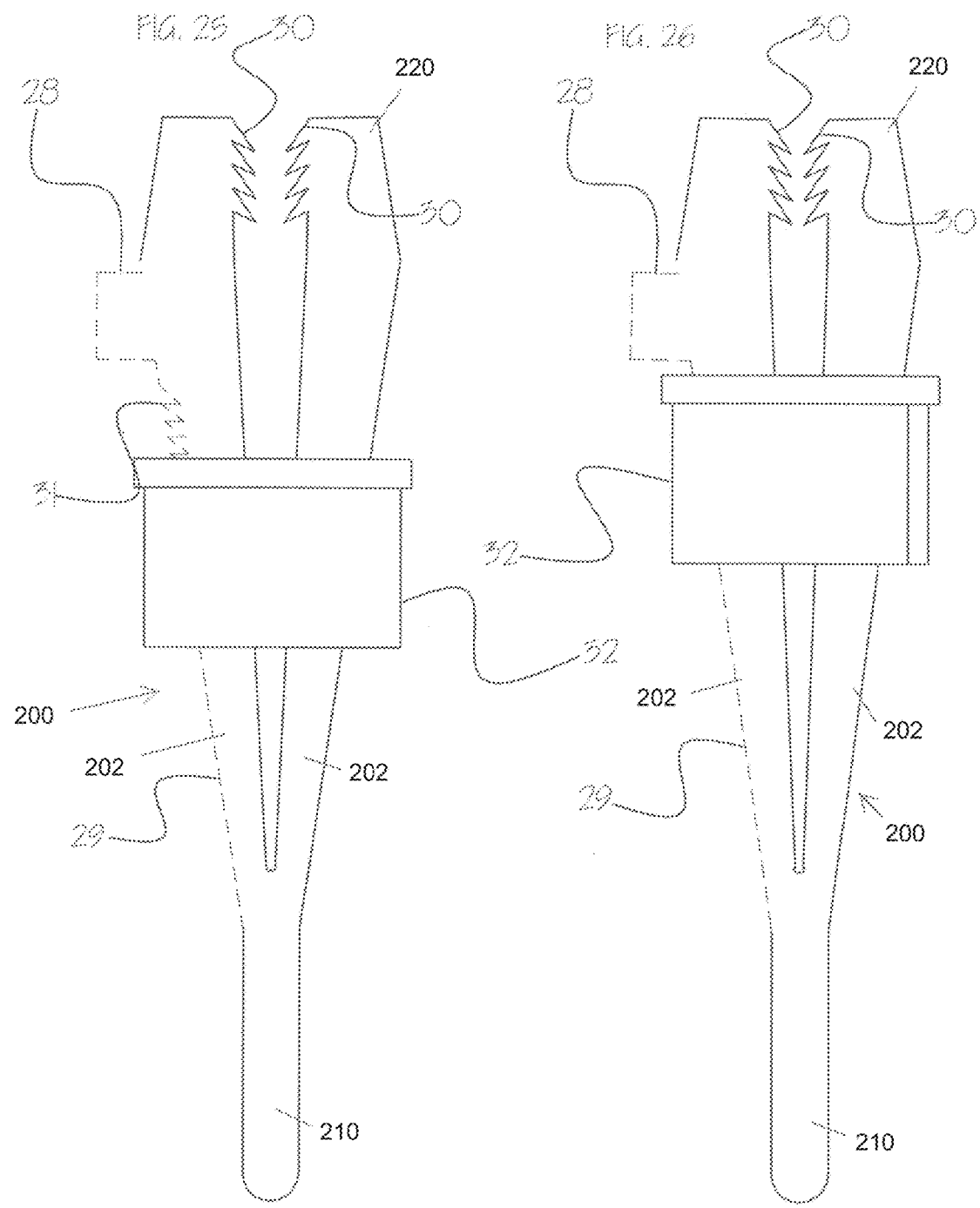

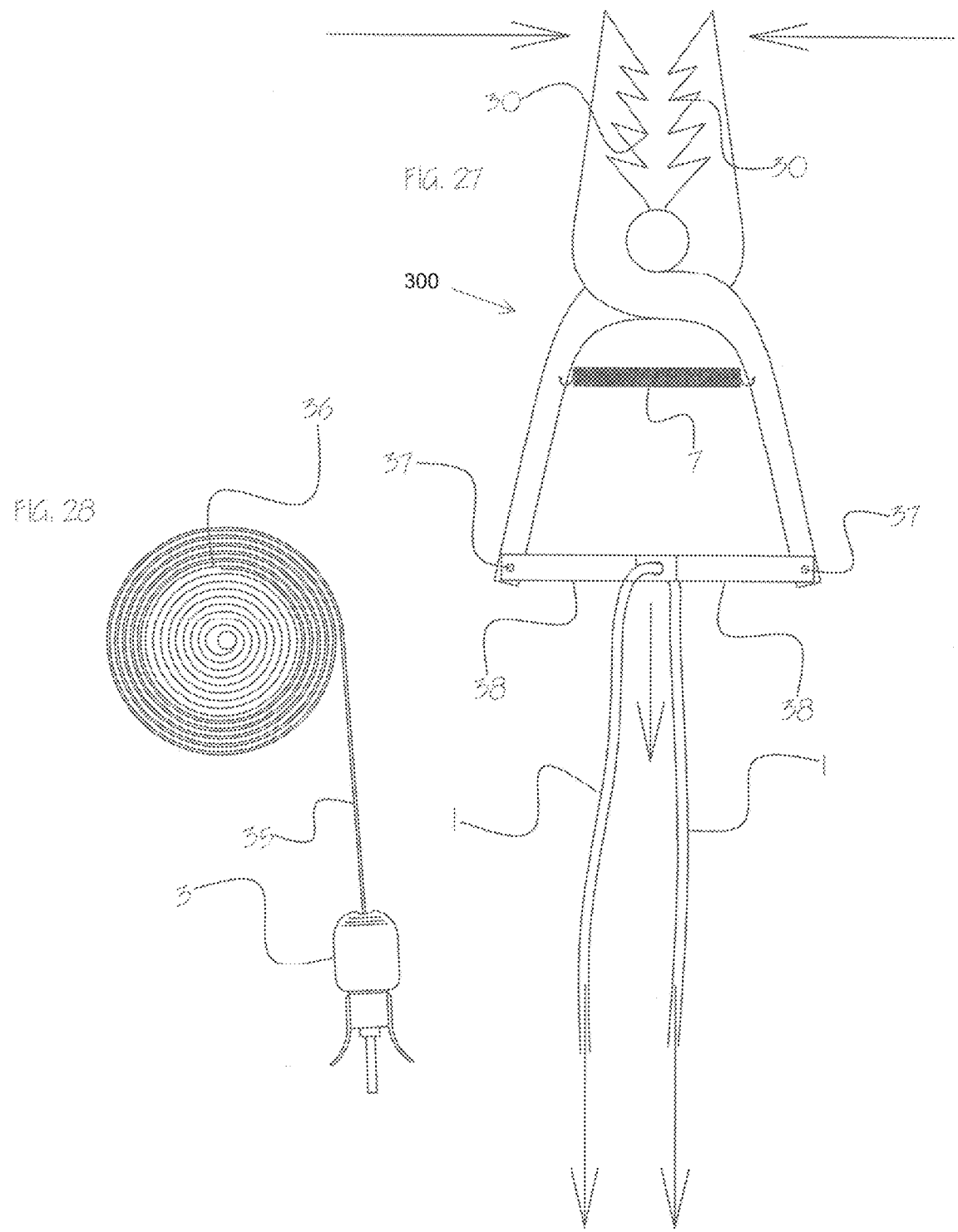

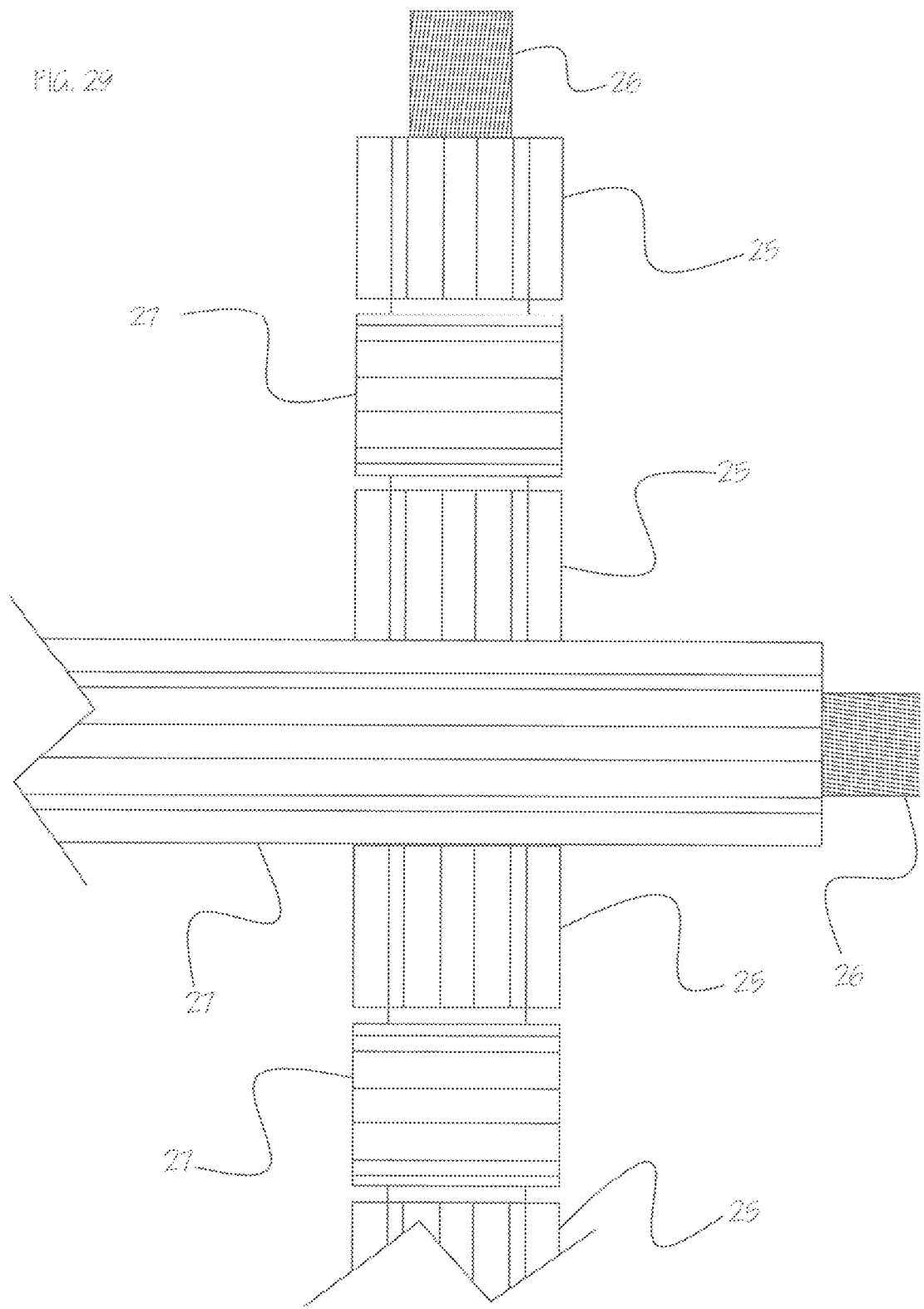

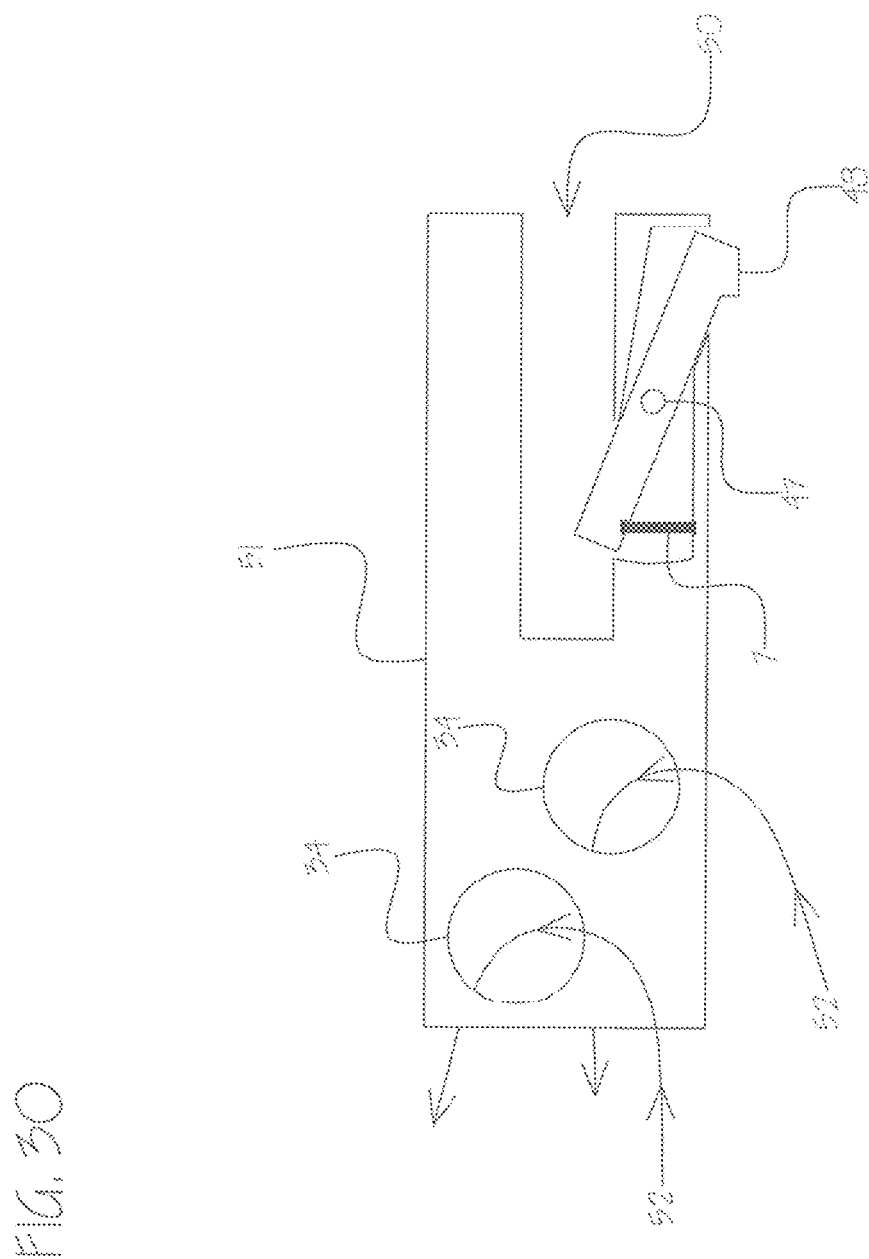

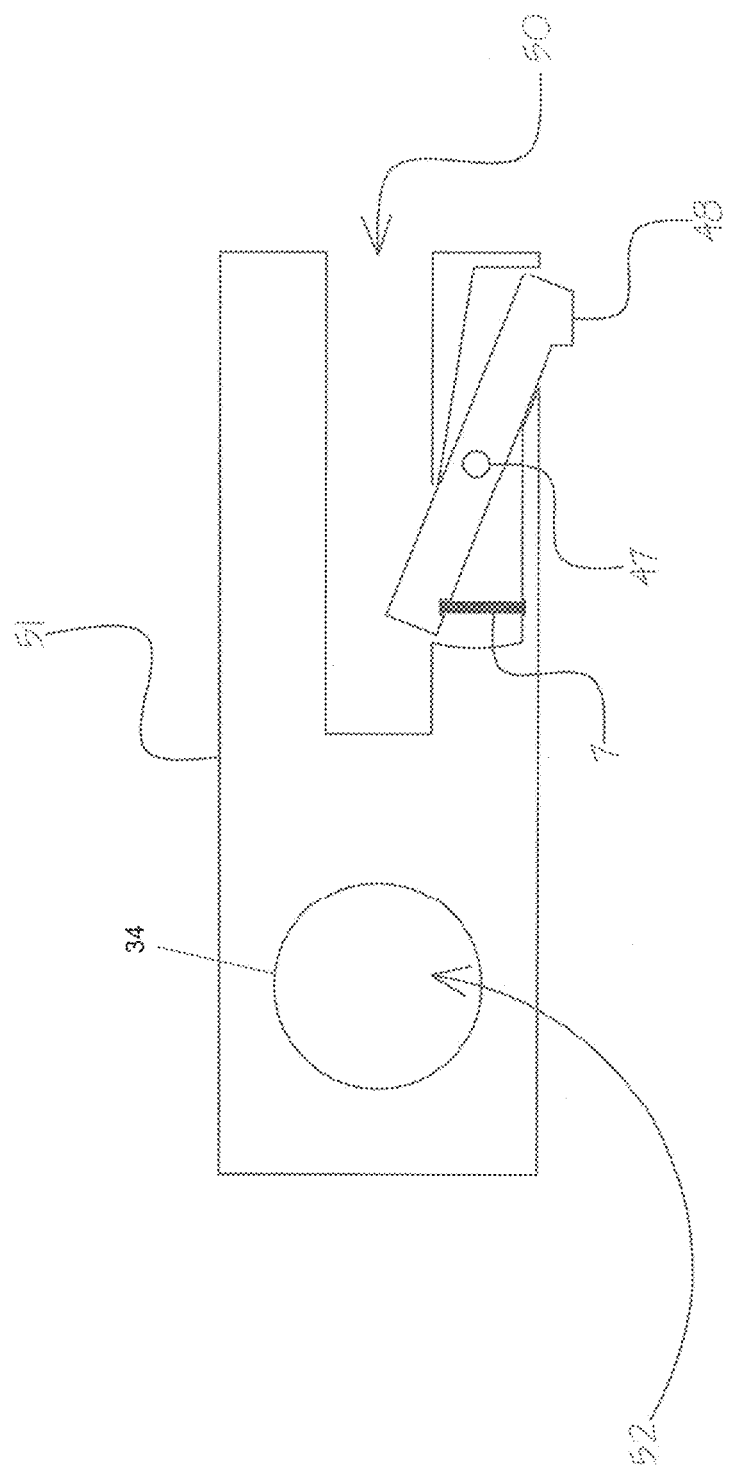

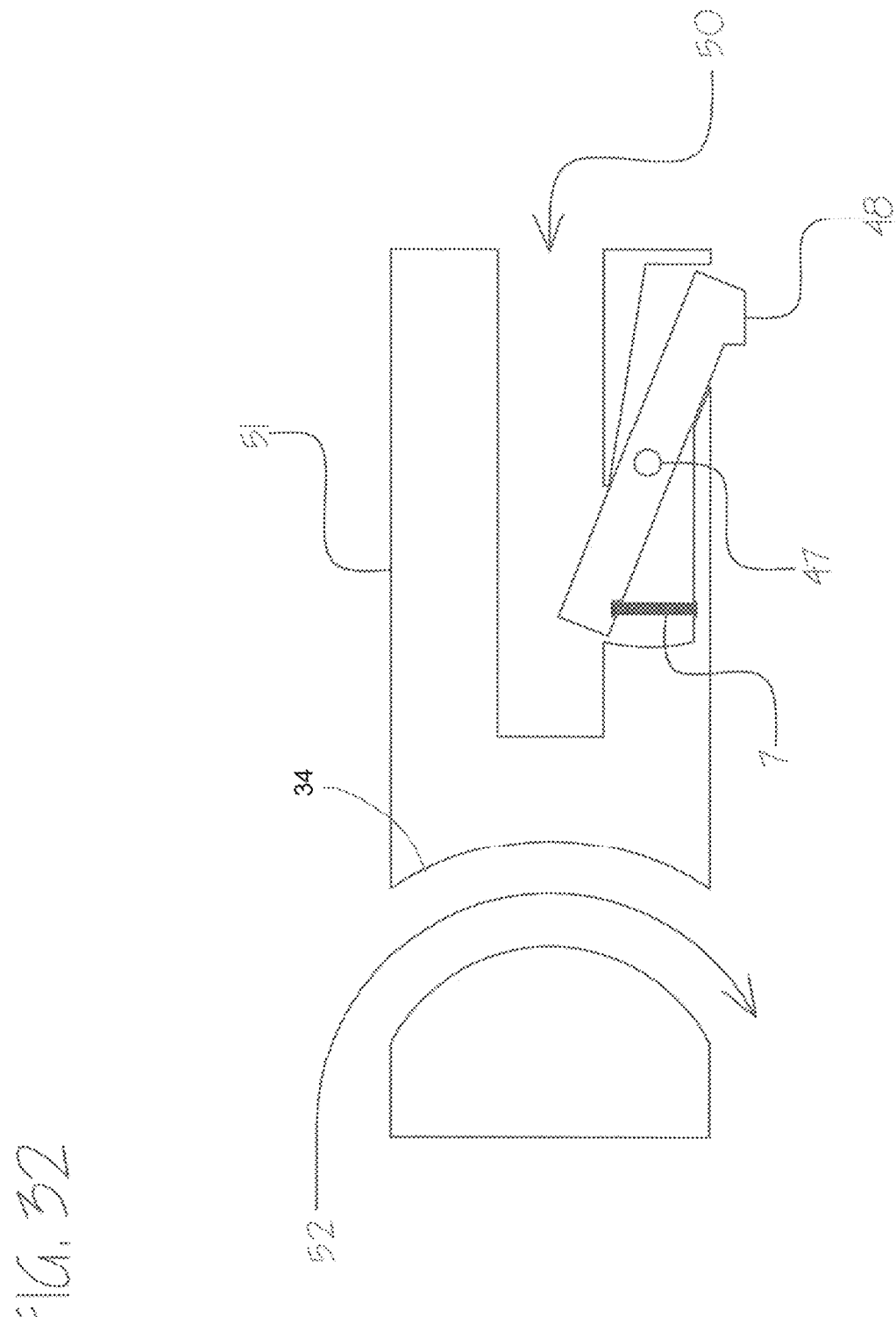

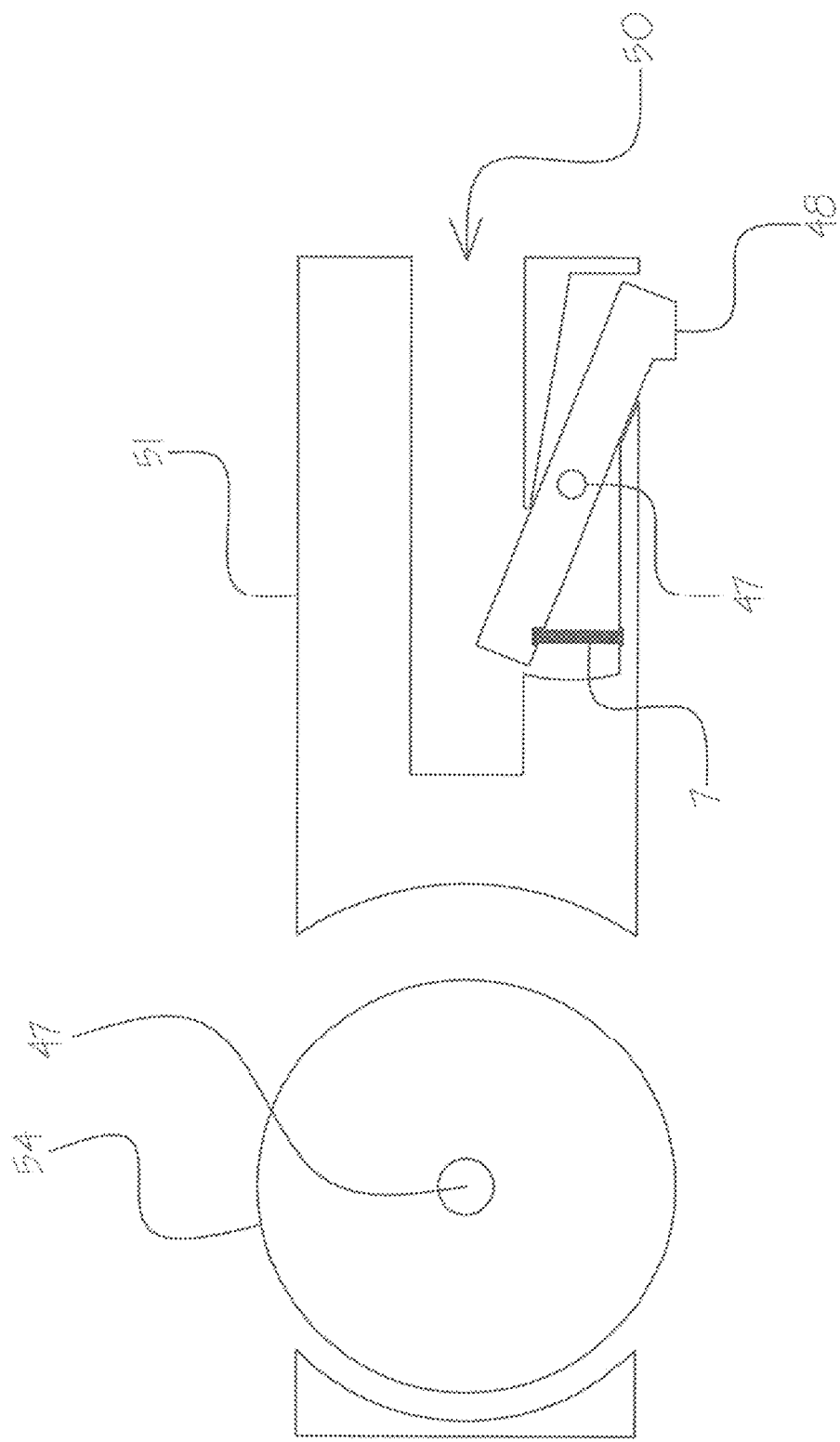

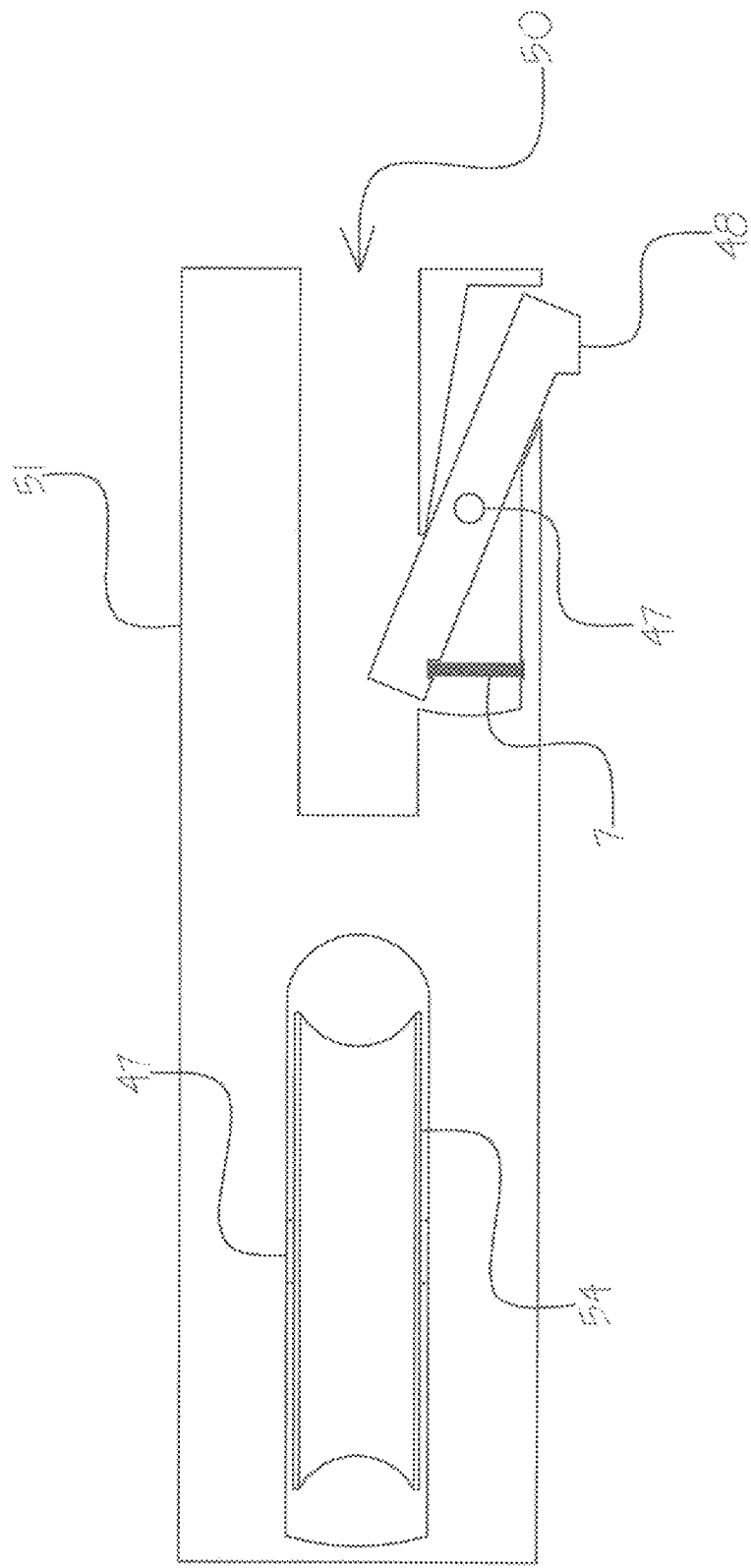

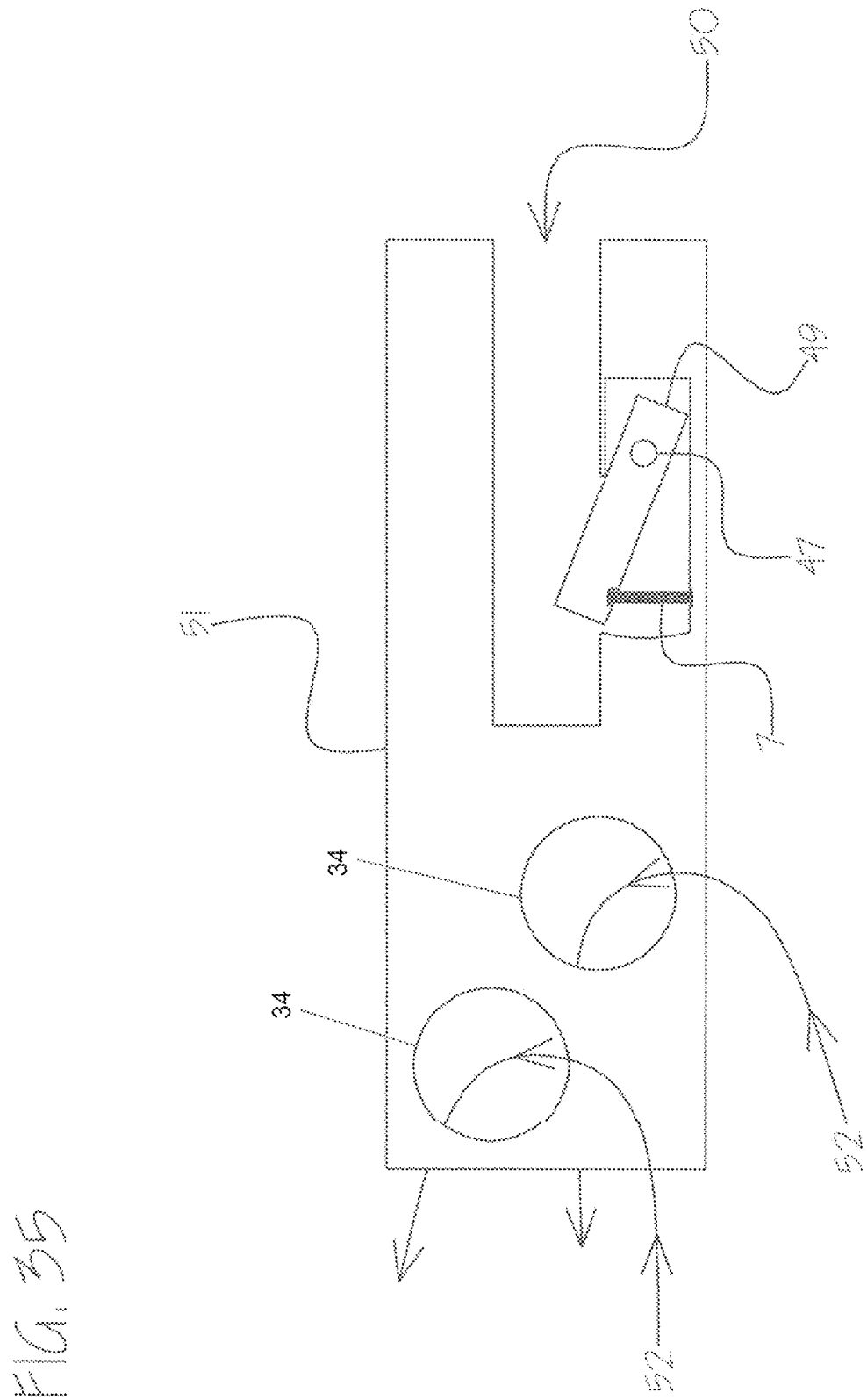

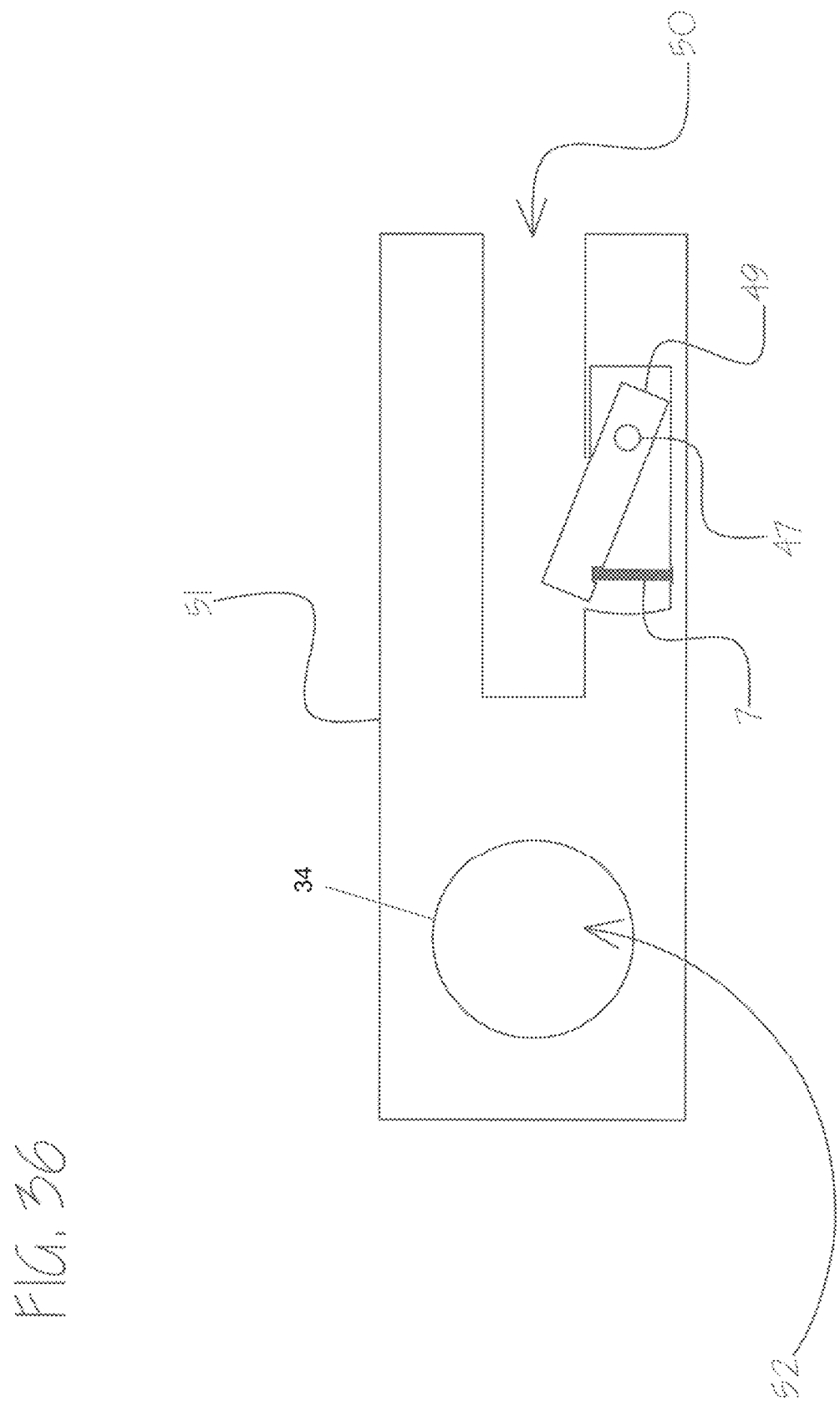

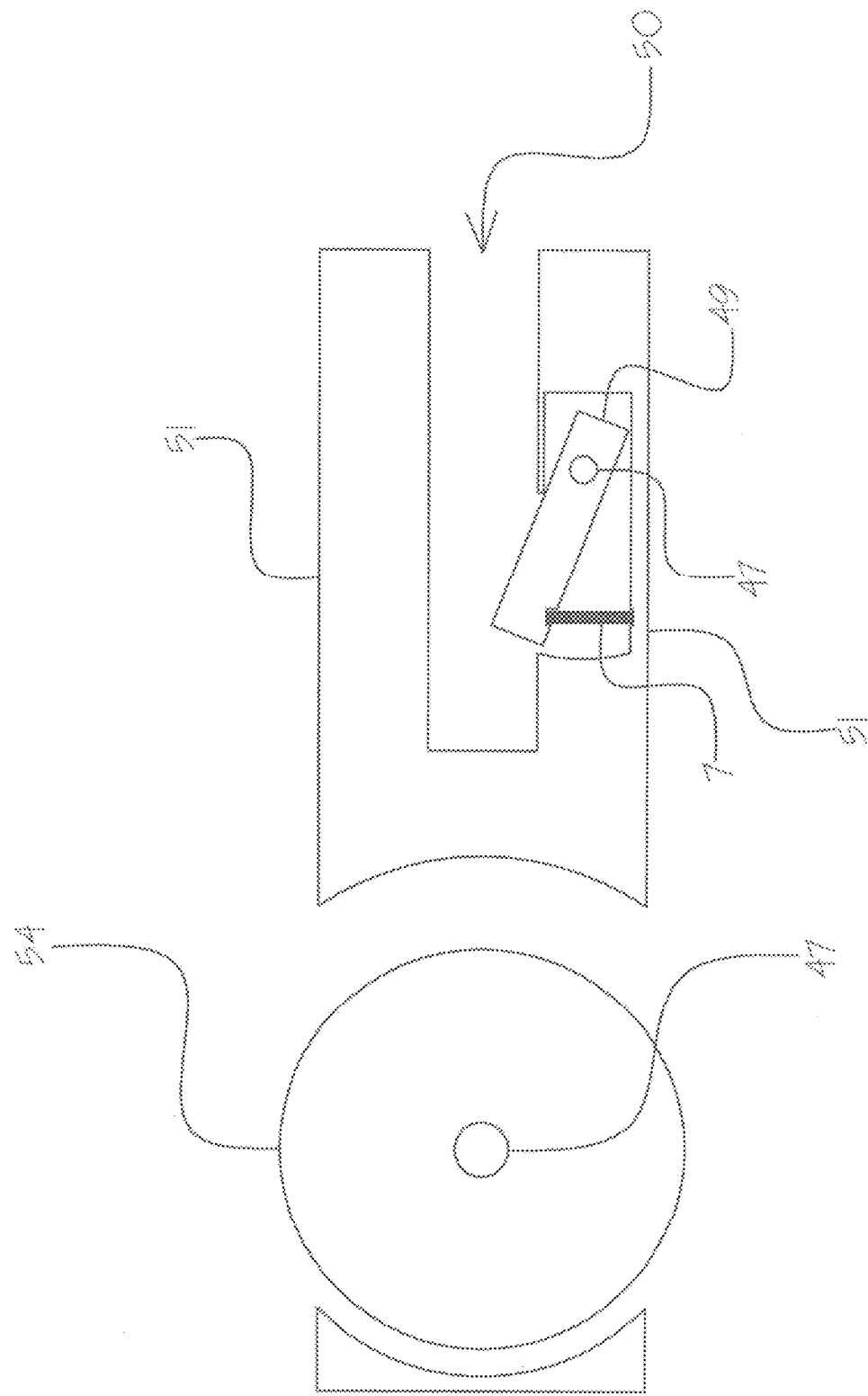

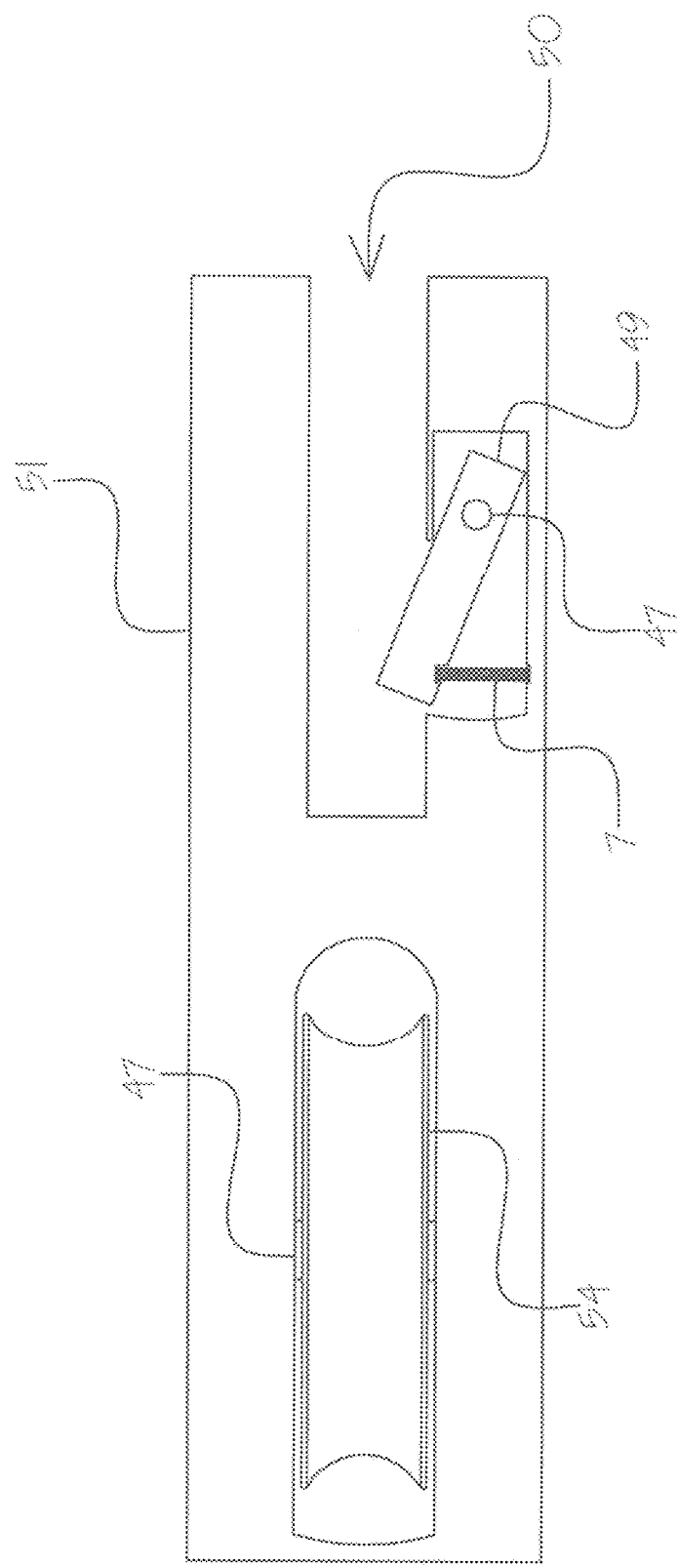

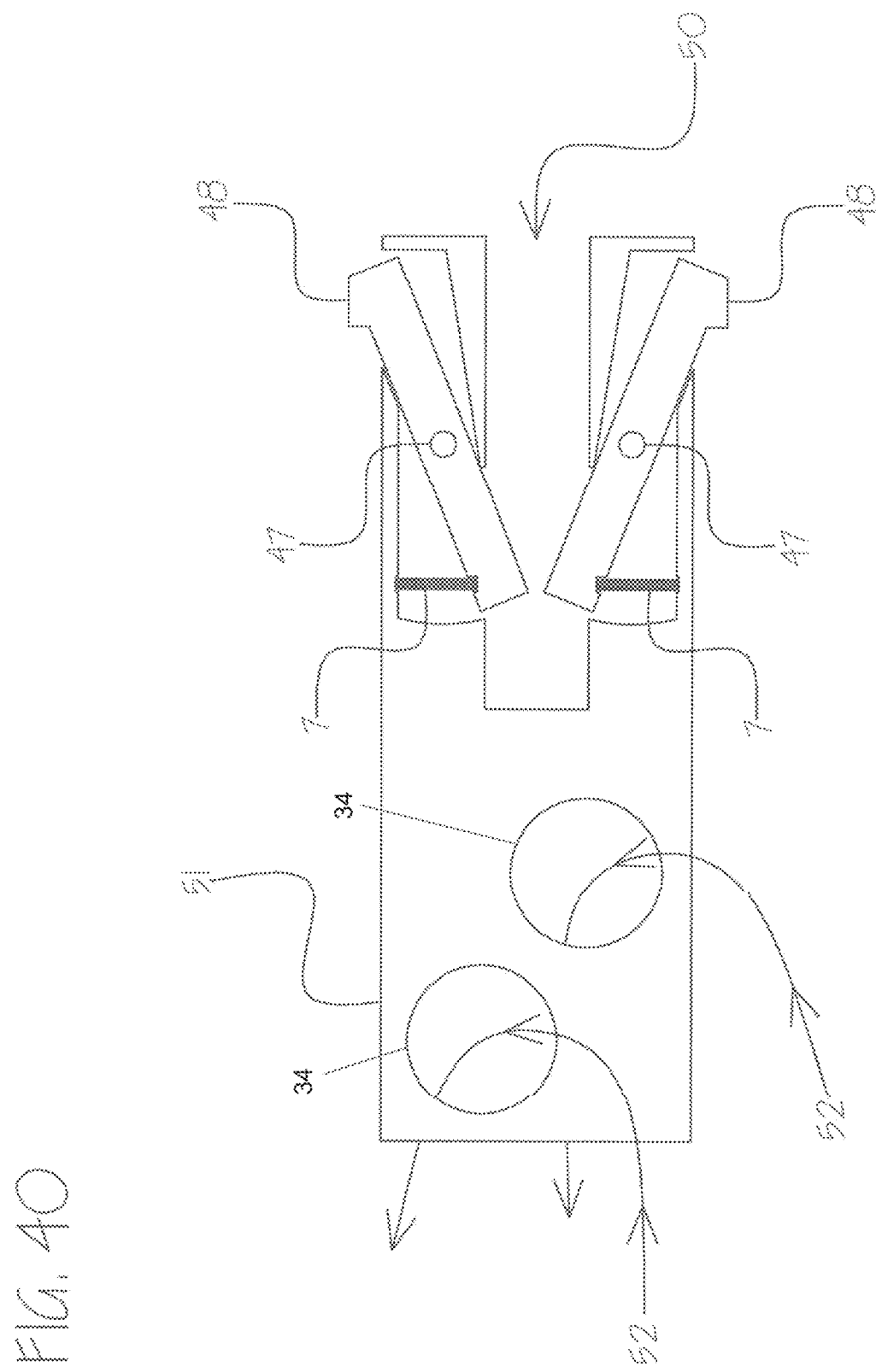

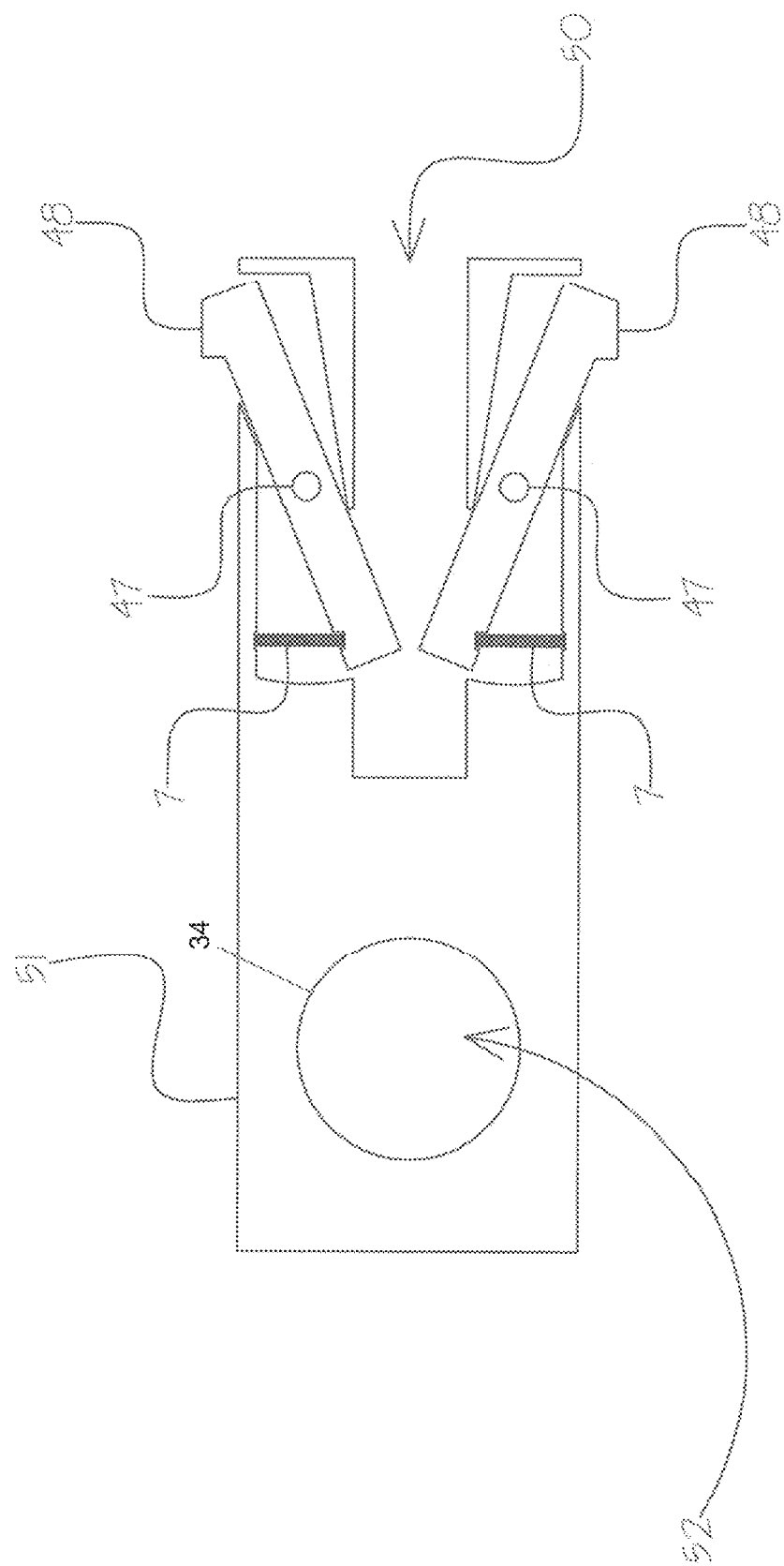

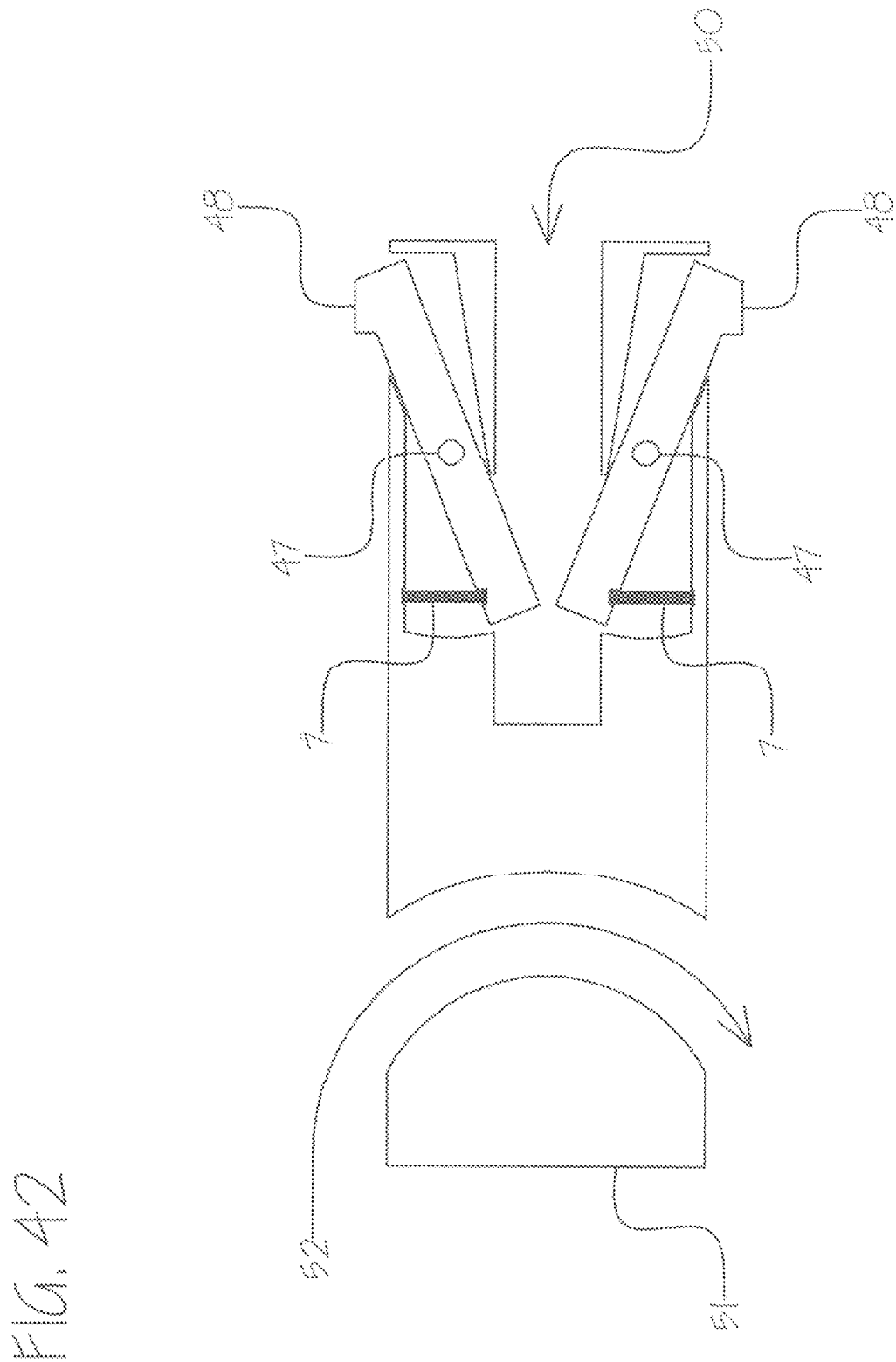

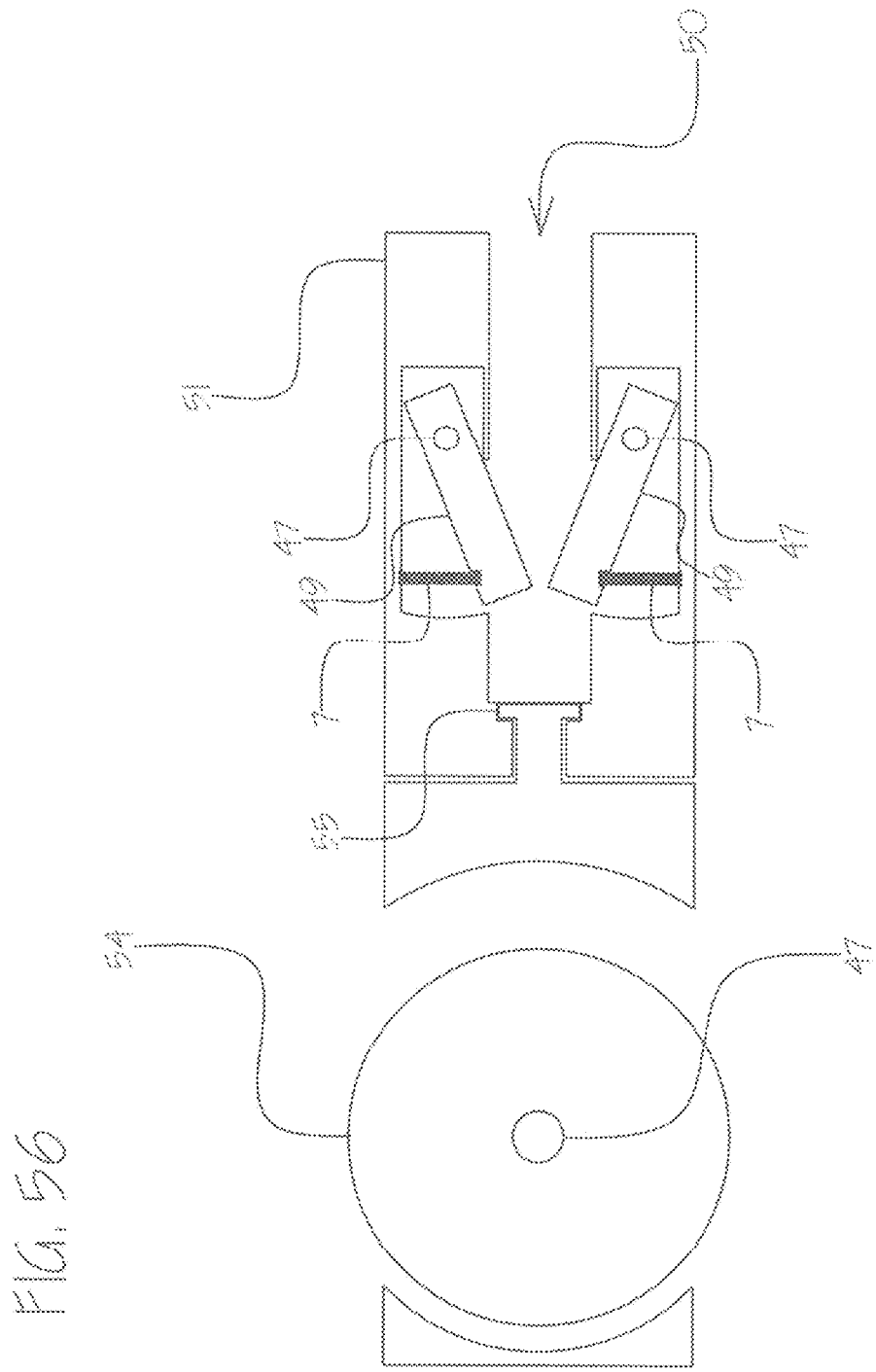

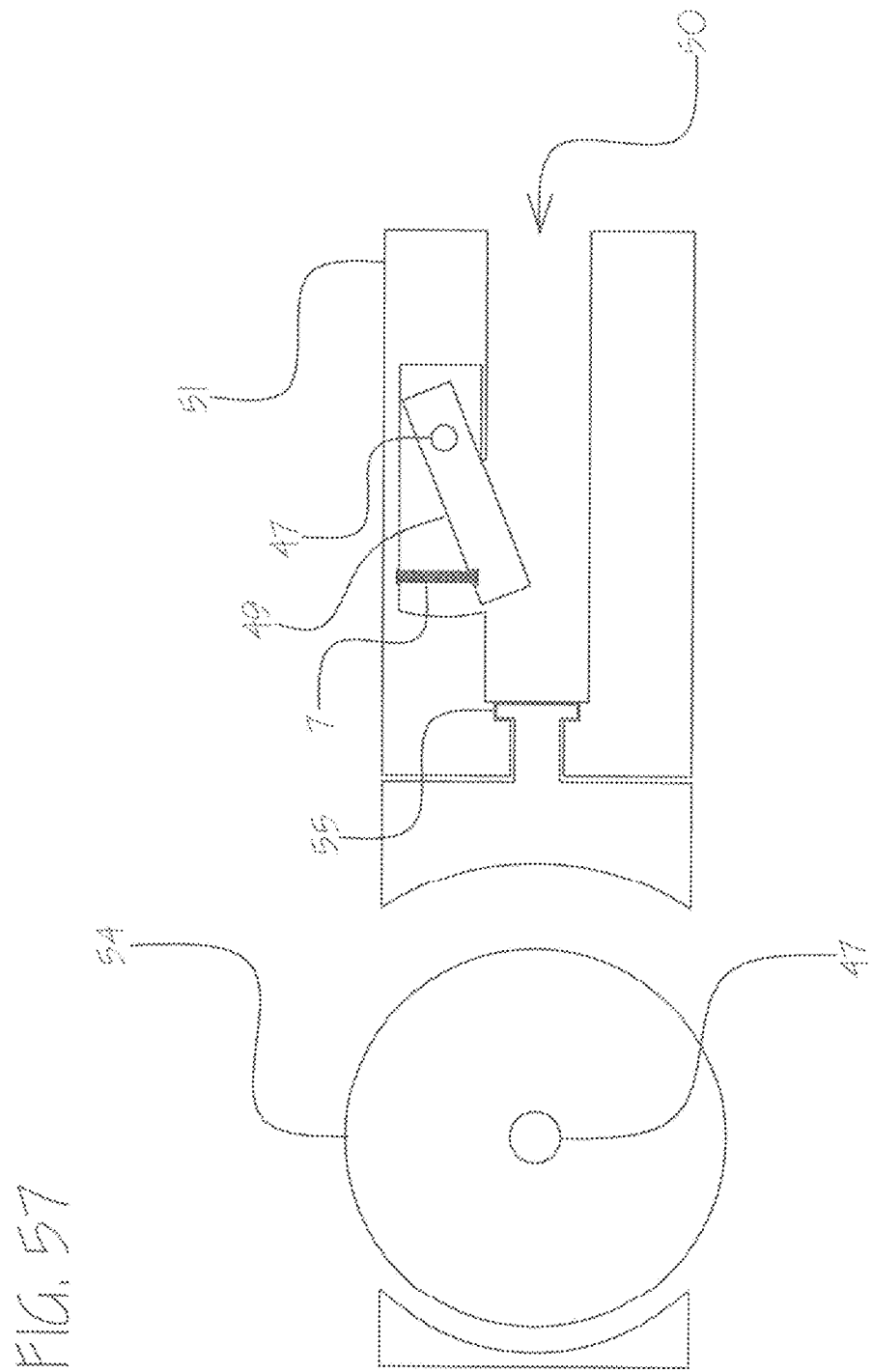

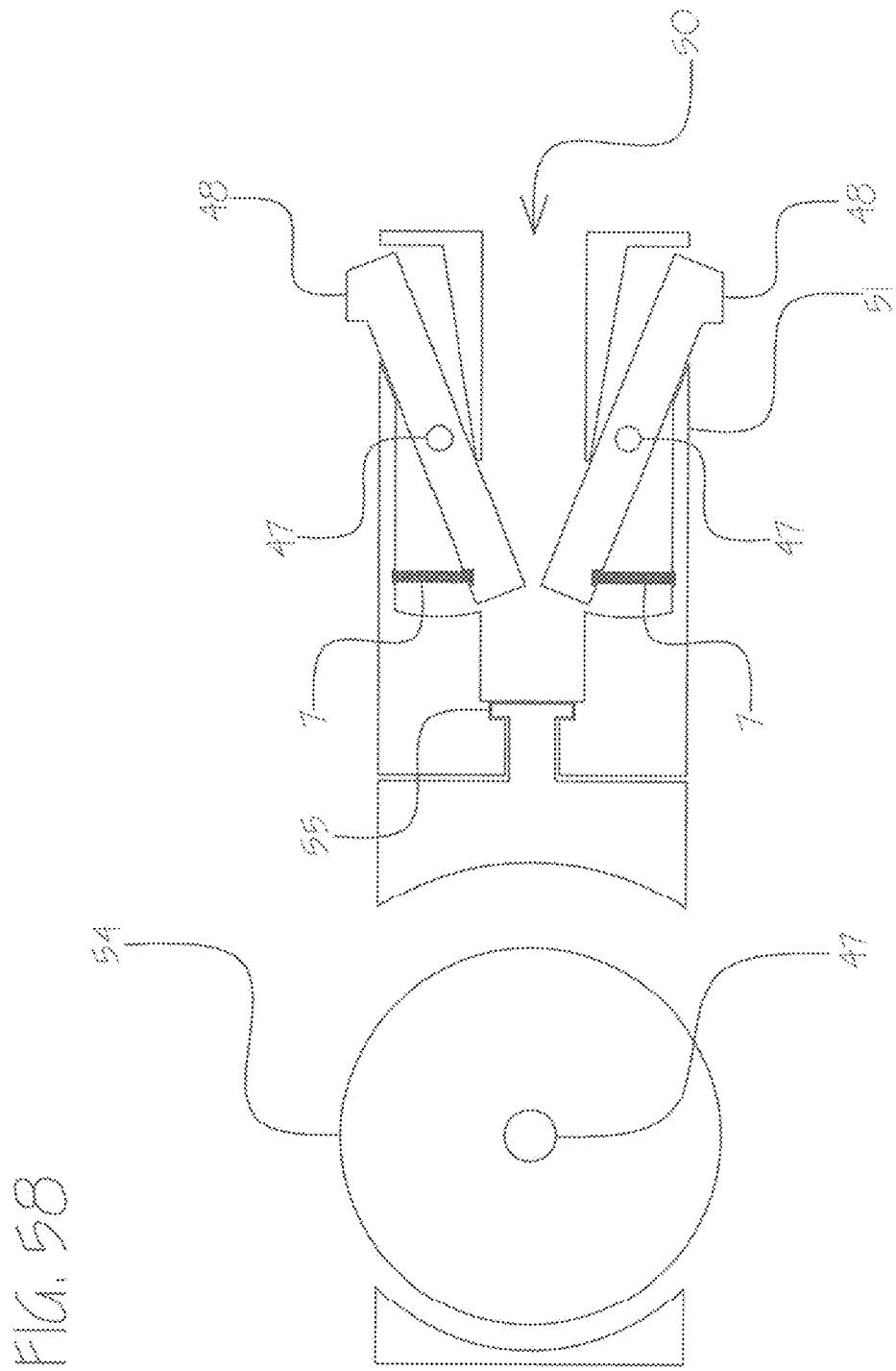

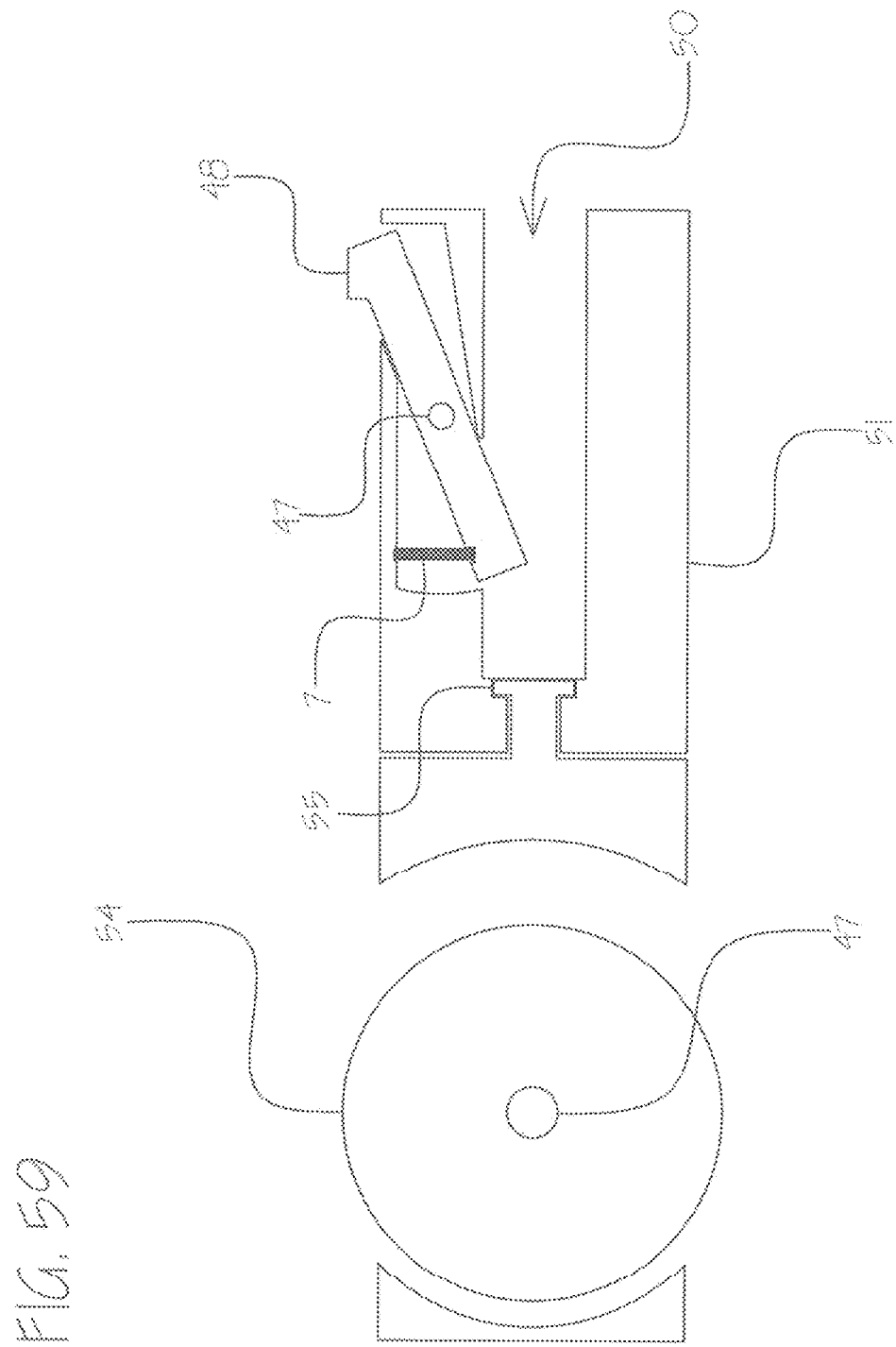

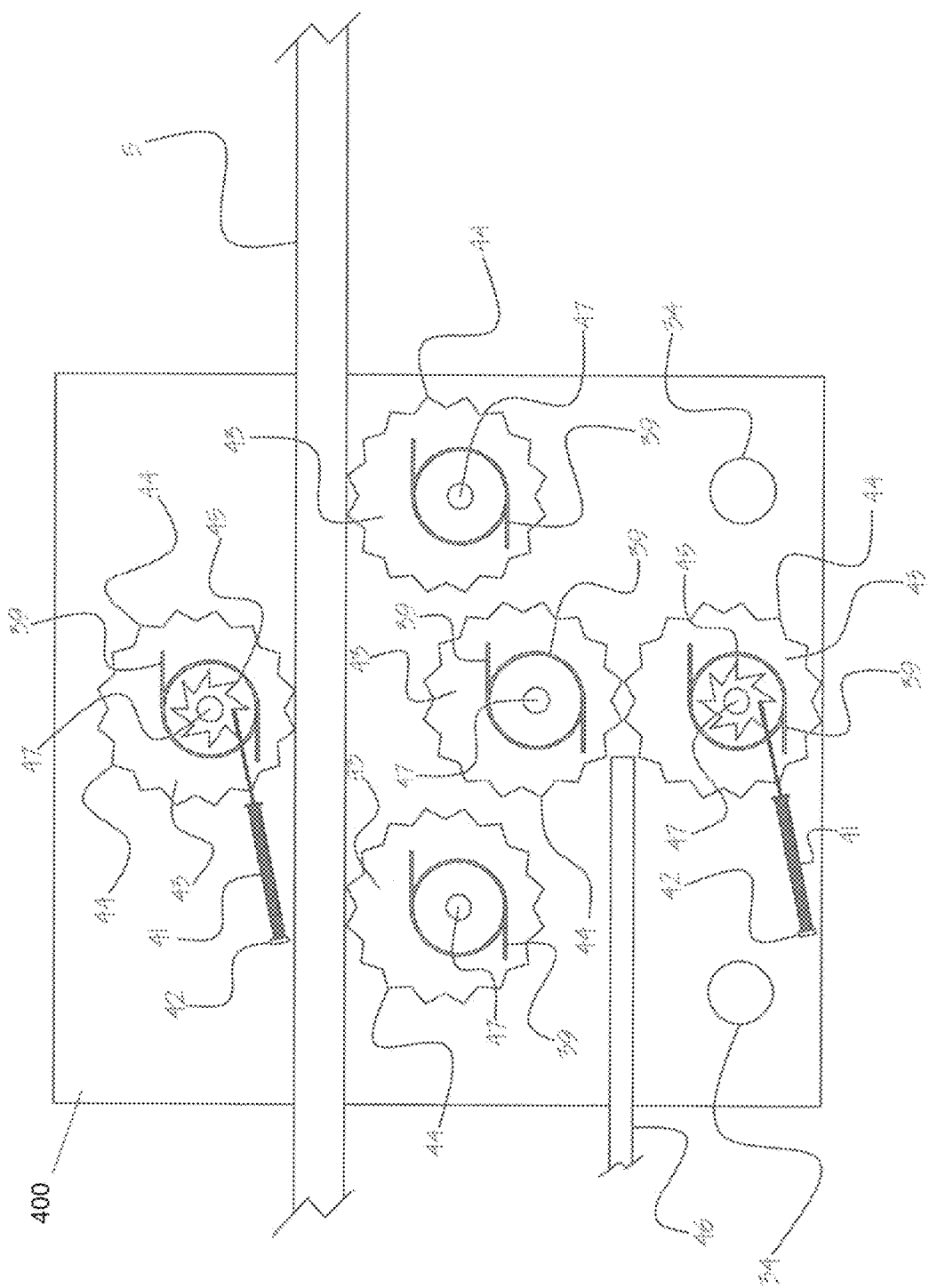

WIRE TENSIONING SYSTEM

CROSS-REFERENCE TO RELATED APPLICATIONS

This application claims the benefit of U.S. Provisional Application No. 62/385,412, filed Sep. 9, 2016, entitled WIRE TENSIONING SYSTEM, which is hereby incorporated by reference in its entirety.

BACKGROUND

During the installation of solar panels, the importance of ensuring that each and every installation is performed thoroughly and efficiently cannot be overstated. One of the most physically intensive and time-consuming tasks confronted by solar panel installers during the installation of a solar panel system is managing the wires used to establish electrical connection among the solar panels. A junction box is disposed on the underside of each solar panel, typically at one end of the longest dimension. The junction box provides one positive (+) wire and one negative (−) wire, each of which are in electrical communication with the modules comprising the face of the given panel.

During the installation of an multiple panel solar panel system, the positive and negative wires from the junction boxes on the undersides of adjacent solar panels must be connected to one another, panel to panel, in series (positive to negative or negative to positive, depending on direction) in a given row or column. The electrical connection of the solar panels may be repeated for the entire solar panel system, which may include dozens or even hundred (or more) individual solar panels. During the installation when the solar panels are electrically connected together, it is imperative that the electrical wires used to connect the solar panels are properly secured to meet applicable code requirements. This is often done using plastic ties, which are used to secure unneeded lengths of electrical wiring that is used for connecting the solar panels, to ensure that the wires do not hang down and contact with the roof or other features between the roof and the installed solar panels. Contact between the electrical wires and the roof, or other features of the roof, can compromise the integrity of the wire's insulation and thereby create a fire hazard. In addition, loose and dangling wires will cause an inspector not to pass the installation. If the loose/dangling wires are near/at the middle of an installed array, many hours of labor may be needed to get to the location and fix the problem.

SUMMARY

This disclosure provides devices and systems for that can be used to effectively secure wires on or near the back of a solar panel. The devices include mechanisms that attach to the edge of a solar panel and include an aperture or a pulley through which a tensioning wire is run, and then attached to electrical wiring on the back of the solar panel. In various embodiments, one or more of such devices may be attached to the solar panel to tension/hold the electrical wiring.

In some embodiments, a method is provided for managing electrical wiring for a solar panel system that includes a plurality of solar panels and an inter-panel wire arrangement of wires that carry power generated by the solar panels, each solar panel including a front side configured to receive light for converting into energy and a back side, the wire arrangement disposed proximal to the back side, the method including coupling an attachment device to a portion of one of the plurality of solar panels, the attachment device including a body having a first end and a second end, at least one aperture arranged proximate to a first end of the body, a channel having an opening on the second end of the body, and a securing mechanism disposed along at least a portion of the channel, the securing mechanism configured to allow a structure received in the channel to extend past the securing mechanism and secure the structure in the guide channel; placing a tensioning wire through the at least one aperture, the tensioning wire including a first end having a first fastener; and attaching the first fastener to a portion of the wire arrangement to provide tension on the wire arrangement.

In some embodiments, a method is provided for managing electrical wiring for a solar panel system that includes a plurality of solar panels and circuit connecting the plurality of solar panels, the circuit including wires that carry power generated by the solar panels, the method including coupling an attachment device to a portion of one of the plurality of solar panels, the attachment device including a body; a line coupling structure configured to attach to a line; a cavity configured to receive a structure therein; and a securing mechanism disposed along at least a portion of the cavity the securing mechanism configured to allow a structure received in the cavity to extend into the cavity and secure the attachment device to the structure extending into the cavity; connecting a tensioning wire to the line coupling structure, the tensioning wire including a first end having a first fastener; and connecting the first fastener to a wire of the circuit.

In some embodiments, a method is provided for managing electrical wiring for a solar panel system that includes a plurality of solar panels and an inter-panel wire arrangement of wires that carry power generated by the solar panels, each solar panel including a front side configured to receive light for converting into energy and a back side, the wire arrangement disposed proximal to the back side, the method including coupling an attachment device to a portion of one of the plurality of solar panels, the attachment device including a body having a first end and a second end, an one aperture arranged proximate to a first end of the body, a channel having an opening on the second end of the body, and placing a tensioning wire through the aperture, the tensioning wire including a first end having a first fastener; and attaching the first fastener to a portion of the wire arrangement to provide tension on the wire arrangement.

In some embodiments, a method is provided for managing electrical wiring for a solar panel system that includes a plurality of solar panels and an inter-panel wire arrangement of wires that carry power generated by the solar panels, the method including coupling an attachment device to a portion of one of the plurality of solar panels, the attachment device including a body having a first end and a second end, one aperture arranged proximate to a first end of the body, a channel having an opening on the second end of the body, and placing a tensioning wire through the aperture, the tensioning wire including a first end having a first fastener; and attaching the first fastener to a portion of the wire arrangement to provide tension on the wire arrangement. The attachment device may also include a securing mechanism disposed along at least a portion of the channel configured to secure the attachment device a solar panel.

In some embodiments, a wire tensioning device is provided, including a body first end and a second end, at least one aperture arranged proximate to a first end of the body; a guide channel arranged proximate to the second end of the body and extending into the body, the guide channel having an opening on the second end of the body, and a securing mechanism disposed along at least a portion of the guide channel, the securing mechanism configured to allow a structure in the guide channel to extend past the securing mechanism and secure the structure in the guide channel.

In some embodiments, the further includes two or more apertures arranged in the body. The device may also include a tension wire, the tension wire and the aperture corresponding sized to allow the tension wire to pass through the aperture. In some embodiments, the tension wire has a first end and a second end, and wherein the tension wire includes an attachment mechanism on each end of the first and second end. In some embodiments, the securing mechanism includes a spring biasing a contact member to secure the structure in the guide channel. In some embodiments, the securing mechanism includes one or more plastic members protruding into the guide channel, the one or more plastic members configured to allow the structure to move past the one or more plastic members and secure the structure into the guide channel. In some embodiments, the device further comprises a pulley, and the tensioning wire is disposed around the pulley. In various implementations, the guide channel is configured to allow a projection of a solar panel to be inserted therein. For example the device can be attached to any portion of a solar panel that can be inserted into the guide channel. In some embodiments, the wire tensioning device does not include a guide channel but instead includes another securing means (for example, as illustrated and described herein) to attach to a portion of the solar panel, for example, a projected structure of the solar panel.

BRIEF DESCRIPTION OF THE DRAWINGS

Certain inventive aspects will hereinafter be described in conjunction with the appended drawings, provided to illustrate and not to limit the disclosed aspects. In these figures, reference numerals are generally used to indicate the same component; however, for clarity of description, various configurations of an indicated component may all be referred to using the same reference numeral. In some figures, components that are indicated by a reference numeral, and that also are illustrated in other figures, may not be each time, again in the interest of clarity of disclosure; and in such cases, other description of such commonly referenced components in other implementations may apply, unless otherwise indicated, explicitly or by context.

FIG. 1 illustrates a tensioning cord- or cable-based PV wire-tensioning system, prior to the connection of PV wires between adjacent panels.

FIG. 2 illustrates the tensioning cord- or cable-based PV wire-tensioning system of FIG. 1, subsequent to the connection of PV wires between adjacent panels.

FIG. 3 illustrates a spring-based PV wire-tensioning system, prior to the connection of PV wires between adjacent panels.

FIG. 4 illustrates the spring-based PV wire-tensioning system of FIG. 3, subsequent to the connection of PV wires between adjacent panels.

FIG. 5 illustrates a tensioning cord- or cable-based PV wire-tensioning system in a micro-inverter-based solar panel system, prior to the connection of PV wires between adjacent panels.

FIG. 6 illustrates the tensioning cord- or cable-based PV wire-tensioning system of FIG. 5 in a micro-inverter-based solar panel system, subsequent to the connection of PV wires between adjacent panels.

FIG. 7 illustrates a tensioning cord- or cable-based PV wire-tensioning system in a DC-to-DC power optimizer-based solar panel system, prior to the connection of PV wires between adjacent panels.

FIG. 8 illustrates the tensioning cord- or cable-based PV wire-tensioning system of FIG. 7 in a DC-to-DC power optimizer-based solar panel system, subsequent to the connection of PV wires between adjacent panels.

FIG. 9 illustrates an example of a self-retracting solar panel wire/cable management system, including a constant-tension or constant-force spring within junction box 4, shown with the wires 10 extended fully or almost fully from the junction box.

FIG. 10 illustrates the self-retracting solar panel wire/cable management system of FIG. 9, shown with the wires retracted partially into the junction box.

FIG. 11 illustrates the self-retracting solar panel wire/cable management system of FIG. 9, shown with the wires fully or almost fully retracted into junction box.

FIG. 12 illustrates a cutaway view of a flexible and extensible insulated conductive wire or cable, in a contracted state, comprising braided wire surrounded by extensible insulation, with both the insulation and the conductive structure being able to expand or contract.

FIG. 13 illustrates a cutaway view of the flexible and extensible insulated conductive wire or cable embodiment of FIG. 12, in an extended state.

FIG. 14 illustrates a cross-sectional view of a wire or cable comprising a conductive core surrounded or ensheathed by a compressible sleeve material having alternating projections and recesses of like dimensions, such that when a length of the same wire or cable is pressed against another length of itself, either coiled or linear, the projections of the sleeve along one length mate with the recesses of the other, and vice versa.

FIG. 15 illustrates a linear portion of the wire or cable structure of FIG. 14, with a portion of the compressible sleeve material stripped away, exposing a conductive core.

FIG. 16 illustrates another embodiment of a wire or cable structure, differing from the structures of FIGS. 14 and 15 in that the compressible sleeve material is not disposed uniformly along the length of the wire or cable but has been broken up into to spaced-apart alternating parallel and perpendicular lengths of sleeve material along the length thereof.

FIG. 21-26 illustrate a wedging-toothed clamp device configured and dimensioned to permit releasable attachment to the underside of a solar panel frame, where a hole is used both to accommodate and secure any suitable constant-tensioning cable or cord, and an installation process of the same.

FIG. 27 illustrates an alternative wedging-toothed clamp device configured and dimensioned to attach to the underside of a solar panel frame, pivoting bars being used not only to accommodate and secure constant-tensioning cable or cord, but also, when pulled in the direction indicated by the arrow, to provide additional downward pressure on metal etching teeth.

FIG. 28 illustrates a flat PV power wire, terminated at one end in a male solar panel DC attachment, attached to a constant-tension, constant-force, power, or spiral spring, which may be used for the cables of the self-retracting solar panel wire/cable management system depicted in FIGS. 9-11.

FIG. 29 illustrates an interlocking wire/cable/hose management system that is bi-directional, which can be used to bundle wires or cables or hoses, such as those having such surface features that are perpendicular to each other, or otherwise oriented at an angle to each other, similar to those described above with regard to FIGS. 14-16.

FIG. 30 illustrates a left side view of an attachment device configured for attachment to the underside of the frame of a PV solar panel, comprising two through holes, through each of which a tensioning cable may be inserted, and an etching or retaining bar having a release.

FIG. 31 illustrates a left side view of an attachment device configured for attachment to the underside of the frame of a PV solar panel, comprising, among other things, as illustrated, a through hole 52, disposed horizontally near the distal end of the device, through which a tensioning cable 1 may be inserted and restrained, and a frame-catching or retaining bar 48 with a release.

FIG. 32 illustrates a left side cutaway view of an attachment device similar to those described above with regard to FIGS. 30 & 31, in which the through hole of the attachment device is shaped to assume a curved contour through the body of the device.

FIG. 33 illustrates a left side cutaway view of an attachment device similar to those described above with regard to FIGS. 30-32, in which a pulley is disposed near the distal end of the attachment device, and a tensioning cable is guided onto and restrained by the outer circumferential contour of the pulley, which is held in place and is able to rotate when tensioning cable is pulled about metal pin.

FIG. 34 illustrates a left side view of an attachment device similar to that described above with regard to FIG. 33, except that the pulley is disposed parallel to the horizontal dimension of receiving cavity.

FIG. 35 illustrates a left side view of an attachment device as described in FIG. 30, except that a permanent frame-catching or penetrating bar is used in lieu of a releasable retaining bar 48.

FIG. 36 illustrates a left side view of an attachment device as described with regard to FIG. 31, except that a permanent frame-catching or penetrating bar 49 is used in lieu of a releasable retaining bar 48.

FIG. 37 illustrates a left side cutaway view of an attachment device as described with regard to FIG. 32, except that a permanent frame-catching or penetrating bar 49 is used in lieu of releasable retaining bar 48.

FIG. 38 illustrates a left side cutaway view of an attachment device as described with regard to FIG. 32, except that a permanent frame-catching or bar is used in lieu of a releasable retaining bar.

FIG. 39 illustrates a left side view of an attachment device as that described with regard to FIG. 34, except that a permanent frame-catching or penetrating bar is used in lieu of a releasable retaining bar.

FIG. 40 illustrates a left side view of an attachment device such as that described with regard to FIG. 30, including an additional releasable retaining bar disposed above a retaining cavity.

FIG. 41 illustrates a left side view of an attachment device such as that described above with regard to FIG. 31, but with an additional releasable retaining bar disposed above a retaining cavity.

FIG. 42 illustrates a left side cutaway view of an attachment device such as that described with regard to FIG. 32, but with an additional releasable retaining bar disposed above a retaining cavity.

FIGS. 56-59 illustrate other embodiments of attachment devices, similar to the embodiment of FIG. 55 but with different attachment/securement means.

FIGS. 60 and 61 illustrate an embodiment of a grounding wire attachment device.

DETAILED DESCRIPTION

Figure 17:
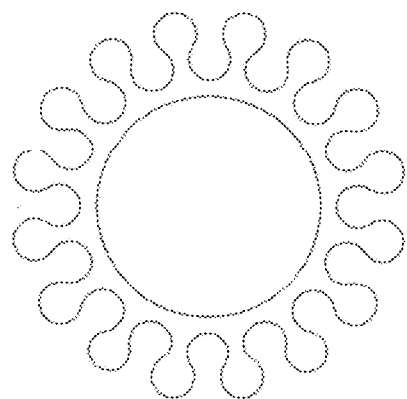
FIGS. 17-20 illustrate variously sized projections and recesses of the compressible sleeve material, separately and mated together.

Although various embodiments are described herein and depicted in the figures, these embodiments are not intended to be limiting. The features of any of the embodiments described herein can be modified and/or combined with features of any of the other embodiments described herein or additional features that will be apparent to a person of ordinary skill in the art based on this disclosure.

FIG. 1 schematically illustrates a multi-panel solar system, prior to connection of the solar panel power wires. FIG. 2 schematically illustrates the multi-panel solar system of FIG. 1, after the solar panel power wires have been connected to one another.

In particular, FIG. 1 illustrates two solar panels 100 arranged side-by-side, with each solar panel 100 including a frame 5 extending around the periphery of the solar panel 100. In some embodiments, the frame 5 may be made from or include anodized aluminum, but other materials and treatments may also be used. The solar panels 100 also include a solar panel junction box 4, which provides electrical communication between the silicon modules of the solar panel 100 and the solar panel power (PV) wires 10. The PV wires 10 extend from the solar panel junction box 4 to the solar panel DC connectors 3. One of the PV wires 10 extending from the solar panel junction box 4 may be a positive wire, and the other of the PV wires 10 extending from the solar panel junction box 4 may be a negative wire.

In the illustrated embodiment, the solar panel also includes at least one tensioning component 1 extending between the PV wires 10 and an attachment point 6 of the frame 5. The tensioning component 1 may extend from the attachment point 6 of the frame 5 to one of the PV wires 10, with a separate tensioning component 1 extending from the attachment point 6 to the other of the PV wires 10. In another embodiment, a single tensioning component 1 may extend from one of the PV wires 10 to the other of the PV wires 10, passing through the attachment point 6 at a point along the length of the tensioning component 1. The tensioning component 1 may be any suitable cord, cable, or similar device, which may be made from a suitably stable elastic, flexible, stretchy, or extensible material. In order to protect the integrity of the tensioning component 1 during extended exposure to the elements, the tensioning component 1 may be made from or sheathed in a suitable material that is UV-resistant, water resistant, or weather-resistant. This material may be UL-compliant, or compliant with the standards of another recognized safety consulting and certification organization. The tensioning component may be secured to the PV wires 10 via connectors 2, which may be any suitable hooking, latching, or retaining device.

In a multi-panel system, the positive PV wire 10 of one of the panels 100 must be connected to the negative PV wire 10 of the adjacent panel 100. FIG. 2 shows the multi-system of FIG. 1, in which a PV wire 10 of one of the panels 100 is connected to a PV wire 10 of the other panel, by connecting the DC connectors 3 of the PV wires 10 to one another.

As can be seen in FIG. 2, the tensioning components 1 of each panel 100 remain connected to the PV wires 10 which have been connected together. The attachment point where the connector 2 contacts the PV wires 10 may move in response to the force applied by the tensioning component, or may be moved by an installer to an appropriate location. The tension in the tensioning component 1 may, by itself or in conjunction with other structures, maintain the PV wires in a position which is sufficiently taut that the PV wires 10 will not contact the underlying roof or other structures near the panels 5.

Figure 62:
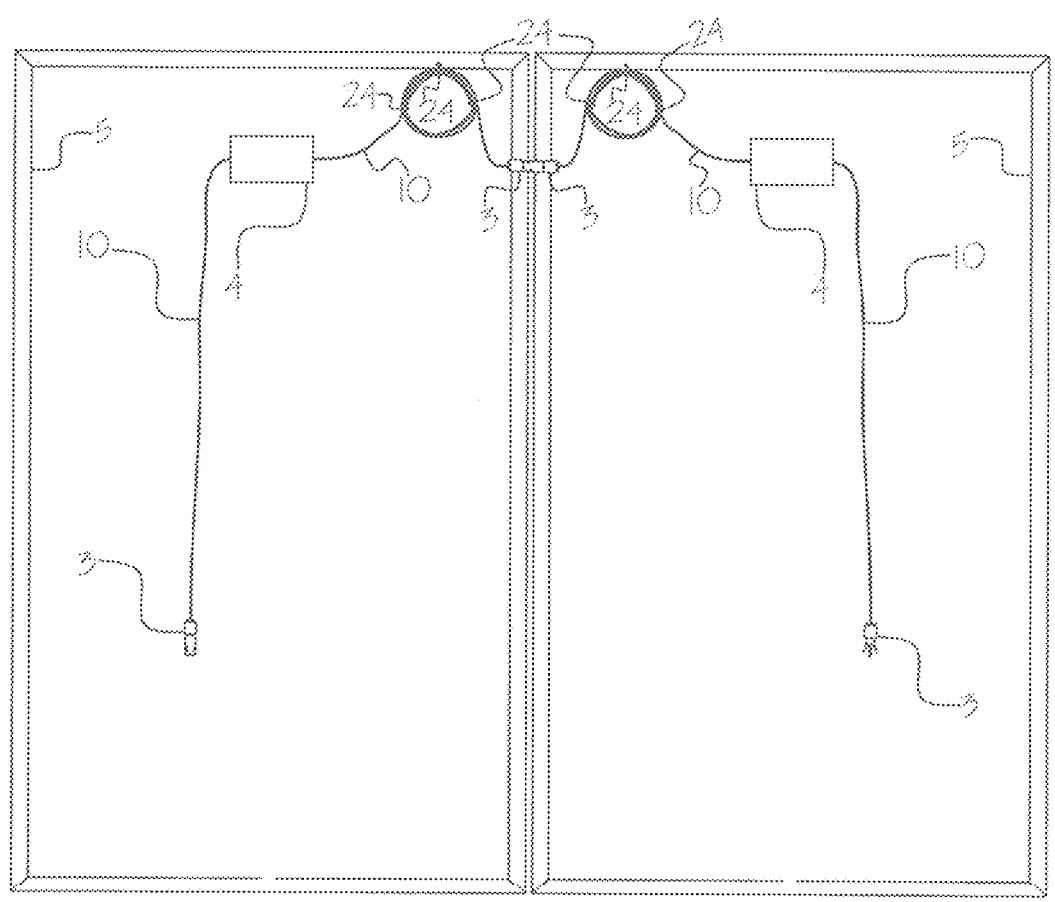
FIG. 62 illustrates an example of an installation without the use of the embodiments discussed herein, in which wires coming out of the junction box of the solar panel on the left are longer than needed to attach to corresponding wires of the solar panel on the right.

The securement of the wires illustrated in FIGS. 1 and 2 through the use of tensioning components secured to the frame may be less labor intensive and more reliable than other methods of securing excess wiring. FIG. 62 illustrates an embodiment in which the wires 10 are secured without the use of tensioning components, During installation, the wires may be looped and secured to the frame using plastic ties. Holes are drilled in the frame of the solar panel to secure the ties to. Such a procedure takes several minutes to do per panel, and the results may be inconsistent in terms of efficacy and retention of the wires over time. When installations include dozens or hundreds of panels, the total labor required is significant, and can be minimized or eliminated by using embodiments described herein.

FIG. 3 schematically illustrates an alternative embodiment of a multi-panel solar system to that depicted in FIGS. 1 and 2. As illustrated, each solar panel 100 includes two springs 7 or other resilient members that may be made from any suitable material, including, in some embodiments, spring materials having memory retention. Each spring 7 has two ends, both of which may terminate in connectors 2, which may be any suitable hooking, latching, or retaining device. One end of each spring 7 may be attached to the frame 5 via connector 2 at an attachment site such as attachment hole 8, which may be drilled in the solar panel frame and used to attach components of a wire-tensioning system. As further illustrated, the other end of each spring 7 may be secured to a PV wire 10 via a connector 2.

As can be seen in FIG. 4, a PV wire 10 of one of the panels 100 is connected to a PV wire 10 of the other panel, by connecting the DC connectors 3 of the PV wires 10 to one another. As shown, the two springs 7 attached to the connected PV wires 10 are in an extended compared to the two springs 7 attached to the unconnected PV wires 10. The point at which the connector 2 is connected to the wires 10 is also different when the wires 10 are connected to one another, due to the tension in the wires 10 and in the springs 7. In the illustrated embodiment, the connection point in FIG. 4 is closer to the midpoint of the wire 10 than when the wires 10 are unconnected and the spring 7 is in a less-extended or relaxed position (see FIG. 3)

Some solar panel installations may include microinverters or similar components. Inverters can be used to convert direct current (DC) electricity to alternating current (AC) electricity usable in a home. AC electricity is provided from the electrical grid, and may also be backfed to the electrical grid. In the context of solar module systems, some installations may be a string or central inverter-based system, and other installations may be a microinverter-based system. In a string inverter-based solar module system, the electrical wires/leads of a series of solar modules are daisy-chained, connected together in series either negative to positive or positive to negative, with either the negative or the positive polarity lead of the first module and the opposite polarity lead of the final panel ultimately being connected to the string inverter. The string inverter then outputs AC electricity, when the solar module system is outputting power. Although string inverter-based solar module systems may offer lower initial costs per Watt peak than those associated with microinverter-based solar module systems, they also suffer from the "Christmas lights effect," in which the output of the entire string of panels is only as high as the least productive module in the string. As such, a shaded panel, one covered with snow, or an otherwise compromised panel decreases the output of the entire solar module system.

By contrast, microinverter-based solar module systems utilize power-point tracking, so that if one panel is shaded or otherwise underperforming, the other panels of the system are not affected, because each module has its own microinverter. Moreover, microinverter-based solar module systems are easier to troubleshoot than string inverter-based systems because there is typically only a single point of failure, which can be identified through remote monitoring.

FIG. 5 illustrates an alternative embodiment of a two-panel solar system that, among other elements, comprises two mounting rails 13 and two microinverters 15. The microinverters 15 each comprise, among other elements, two microinverter DC input cables 16, each terminated in microinverter DC input connectors 17, and a microinverter AC output cable 18 terminated in a microinverter AC output connector 19. The panels 100 are mounted to the mounting rails 13, which, in turn, may be mounted to a roof or any other suitable structure (not shown), and the two microinverters 15 are mechanically attached to one of the mounting rails 13.

In the illustrated embodiment, the tensioning components 1 extending from attachment point 6 of each solar panel 100 may be three independent tensioning components 1, each of which extending from attachment point 6 and having a free end that may terminate in a connector 2, or two separate tensioning components 1, the first tensioning component 1 passing through the attachment point 6 and having two ends, each of which may terminate in a connector 2, and the second tensioning component 1 extending from attachment point 6 and having a free end that may terminate in a connector 2. In the case of three independent tensioning components 1, the free ends of two of the independent tensioning components 1 each terminate, as shown, in connectors 2, each of which is connected to a PV wire 10 whose DC connector 3 has not been connected to another DC connector, while the free end of the third tensioning component 1 terminates in a connector 2 connected to a microinverter AC output cable 18 that is terminated in a microinverter AC output connector 19. This embodiment also includes a microinverter AC trunk cable 20, which, as shown, may run along one of the mounting rails 13, and two microinverter trunk cable connectors 21 in electrical communication with trunk cable 20.

Although tensioning systems are described in certain embodiments herein as terminating in a connector, it will be understood that in other embodiments, the connector may also be attached or otherwise secured to the tensioning component, and that this securement or attachment need not occur at the very end of the tensioning component, but may occur at some distance from the end of the tensioning component.

FIG. 6 illustrates the embodiment of FIG. 5 after each of the DC connectors 3 of the two PV wires 10 of each panel 100 have been connected to one of the two DC input connectors 17 of a microinverter 15, and after the microinverter AC output connector 19 of each microinverter 15 has been connected to the closest microinverter AC trunk cable connector 21, thereby establishing electrical communication between the AC output from each microinverter 15 and the microinverter trunk cable 20. As can be seen in FIG. 6, the tensioning components 1 provide tension sufficient to keep PV wires 10 and microinverter AC out cables 18 at a desired level of tautness. It will be understood that the desired or necessary level of tautness may vary depending on the specific parameters of the panel or the installation. Thus, the resulting arrangement of the tensioning component and the wires to which they are attached may vary within a wide range of acceptable resulting configurations, depending on the restoring force of the tensioning component used, the point of attachment between the two, and the other parameters of the components involved.

Some solar panel installations may include DC-to-DC power optimizers or similar components. DC-to-DC power optimizers are DC-to-DC converters which can be embedded by module manufacturers, typically replacing the traditional solar junction box, or can be connected by installers to each PV module prior to installation. DC-to-DC power optimizers increase energy output from PV systems by constantly tracking the maximum power point (MDPT) of each module individually.

DC-to-DC power optimizers are similar to microinverters, in that both can be used in an attempt to isolate the performance of individual panels in order to optimize overall system performance. A microinverter essentially combines a DC-to-DC power optimizer with a small inverter in a single unit, used on every module, while DC-to-DC power optimizers used on every module can rely on a single string inverter for the entire array of modules.

FIG. 7 illustrates another embodiment of a multi-panel solar system that comprises, among other elements, two DC-to-DC power optimizers 14, each of which may be attached to one of two or more mounting rails 13. Each DC-to-DC power optimizer 14 further comprises two input DC power wires 9, each of which may be terminated in DC connectors 11, and two output DC power wires 12, each of which may also be terminated in DC connectors 11.

As further illustrated in this embodiment, a plurality of tensioning components 1 may extend from attachment point 6 of each panel 100. In one embodiment, two independent tensioning components 1 may be used, with each tensioning component passes through attachment point 6, and each of its two ends may be terminated in any suitable connector 2. Each of the two ends of the first of the two independent tensioning components 1 may, as shown in FIG. 7, be connected to PV wires 10 behind a DC connector 3, while each of the two ends of the second of the two independent tensioning components 1 may, as shown, be connected to a DC-to-DC power optimizer wire 12 behind DC connector 11.

In another embodiment, four independent tensioning components 1 may be used, such that each tensioning components 1 extends from the attachment point 6, and the free end of each may terminate in any suitable connector 2. As still further illustrated in FIG. 7, each unconnected DC connector 3 terminating each of the two PV wires 10 in electrical communication with each junction box 4 of each panel 100 are held taut by one or two independent tensioning components 1, the free ends of which terminate in any suitable connector 2 that, as shown, may be connected to PV wires 10 behind DC connectors 3. Likewise, the two free ends of the remaining two independent tensioning components 1 hold the two pairs of DC-to-DC power optimizer wires 12 taut, one pair in each panel 100, by virtue of connecting connectors 2 behind DC connectors 11.

FIG. 8 illustrates the embodiment depicted in FIG. 7 after, for each panel 100, the two PV wires 10 have been connected to the input of that particular panel's DC-to-DC power optimizer 14, via the respective connection of DC connectors 3 with DC connectors 11, and after electrical communication has been established between the two DC-to-DC power optimizers 14, one DC-to-DC power optimizer being associated with each panel 100. Because only one connection between adjacent panels 100 is made, one output power wire 12 of each DC-to-DC power optimizer 14 remains unconnected after electrical communication has been established between the two DC-to-DC power optimizers 14. However, all wires connected to the tensioning components 1 are sufficiently taut.

FIGS. 9-11 depict an embodiment of a solar panel having a junction box 4 in which PV wires 10 emanating therefrom are under tension due to the presence of two tensioning systems (not illustrated here, see FIG. 28), one attached to each PV wire 10. Tensioning system 36 may include, for example, any suitable constant-tension, constant-force, power, or spiral spring mechanism.

As illustrated in FIG. 11, PV wires 10 are retracted within junction box 4, due to the action of the restoring force (depicted by the arrowheads) associated with each tensioning system 36 on the PV wire 10 to which it is attached.

FIG. 10 depicts the tensioning force created by the two tensioning systems 36 within a junction box 4 on the PV wires 10 as each of them are pulled out of such a junction box. It is important to note that in this embodiment, no attachment to the frame of the solar panel 100 is required to establish and maintain tension on PV wires 10, but rather, such tension on each pair of PV wires 10 is both created and maintained by the two tensioning systems 36 contained within each junction box 4 of each panel 100.

FIG. 9 depicts the tensioning force established on each of the PV wires 10 as these wires are pulled out ever farther from junction box 4. The restorative force resulting from this tension may be proportional to the distance, gauged by the total displacement of the DC connectors 3, at or near the end of the PV wires 10, from their retracted position (shown in FIG. 11).

FIG. 28 illustrates a flat PV power wire 35 (terminated at one end in a male solar panel DC attachment 3) attached to a constant-tension, constant-force, power, or spiral spring 36. However, a similar tension-inducing structure can be used without a flat PV power wire. Additional stability for the coil can be provided by, for example, utilizing a retaining space which is the same or similar width as a wire of any suitable cross-section, including circular cross section, to ensure that the coil wraps and unwraps in an orderly fashion.

FIG. 12 illustrates a flexible, extensible, braided conductor 22 in a relaxed state. As illustrated, the braided conductor 22 may be ensheathed in any suitably elastic, extensible, and code-compliant insulation material 23. In some embodiments, the conductor 22 may include copper or tinned copper. As further illustrated in FIGS. 12 and 13, the width of the braid of wires comprising the braided conductor 22 varies depending on whether the conductor 22 is in a relaxed state or a longitudinally stretched (in the direction of its length) state. In its relaxed state, shown in FIG. 12, the braided conductor 22 is wider than is the case when the braided conductor 22 is stretched along its length, as illustrated in FIG. 13. The same narrowing effect occurs to the extensible insulation material between its relaxed and longitudinally stretched states. One effect, therefore, of longitudinally stretching both the extensible braided conductor 22 and the extensible insulation material 23 surrounding it, is to increase, if needed, the length of insulated conductor available in any desired embodiment.

FIG. 14 illustrates a cross-sectional view of insulation material 25 surrounding an electrical conductor 26. As illustrated, insulation material 25 is configured as an alternating number of projections and recesses disposed circumferentially about the conductor 26 that either may extend along all or a majority of the length of the conductor 26, as illustrated in FIG. 15, or may, as illustrated in FIG. 16, only extend along a discrete portion of the length of the conductor 26 before the projections and recesses are truncated and an integral length of smooth insulation material 26 without projections or recesses covers a short portion the conductor 26 before a another integral but discrete length of alternating number of projections and recessed, oriented perpendicularly with respect to the preceding discrete portion of insulation having alternating projections and recesses. This pattern may be repeated along the entire length of insulation material 25 covering the electrical conductor 26.

Whether the insulation 25 is disposed in a uniform fashion, as illustrated in FIG. 15, or in a series of discrete lengths oriented perpendicularly with respect to one another, as illustrated in FIG. 16, bringing sections of such insulated wire close to each other and pressing them together, serves to connect looped lengths (not shown) of wire together in a stable fashion without having to resort to cable ties, etc.

Figure 19:
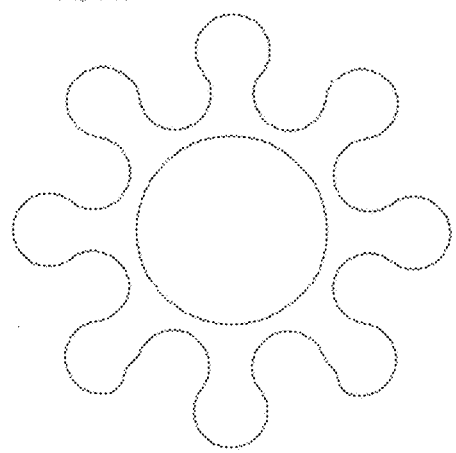
Figure 18:
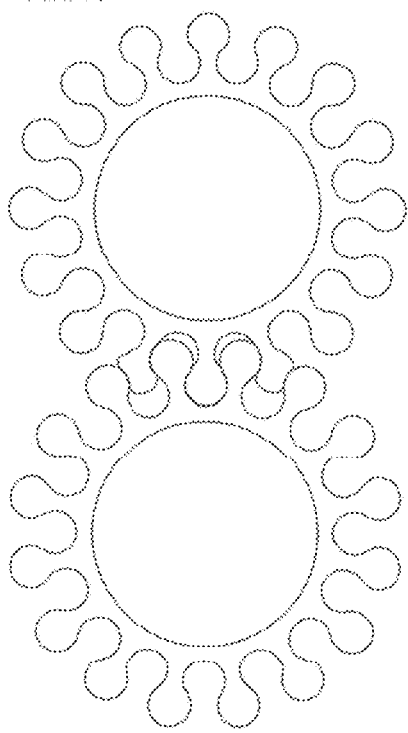
Figure 20:
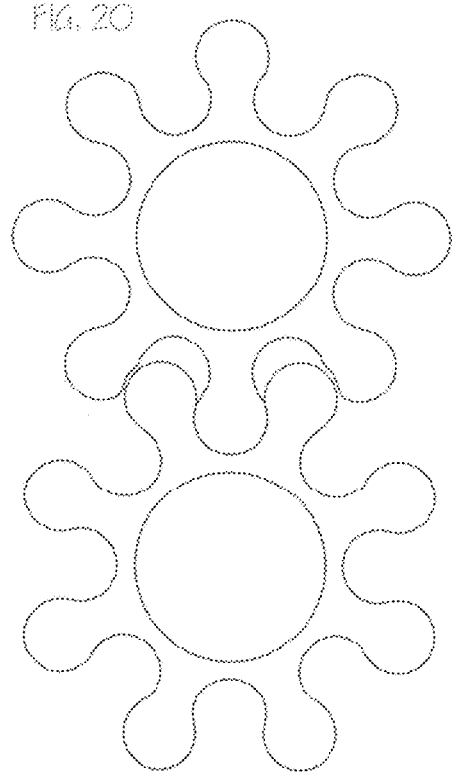

FIG. 17 shows one example of wiring having a pattern of recesses and projections, and FIG. 18 shows how similar or identical sections of the wiring of FIG. 17 can be secured to each other. FIG. 19 shows another example of wiring having a thicker pattern of recesses and projections, and FIG. 20 shows how similar or identical sections of the wiring of FIG. 21 can be secured to each other. Such interdigitation of the projections of adjacent lengths of wire is a convenient way to keep a long extension cord in a coiled loop. The number, size, orientation, and design of the projections of the insulating material may be chosen to ensure a desired ease of connection and retention of adjacent lengths of wire or cable so insulated. FIG. 29 illustrates another example of securement of a patterned section of wiring relative to another patterned section of wiring, in a perpendicular orientation.

With regard to FIGS. 14-16, similar structures may be utilized, for example, in other structures which may be looped and stored. For example, in other embodiments, material 25 may not be solid insulating material, but may instead be suitable hose wall material, with the volume shown as occupied by electrical conductor 26 left hollow. Then, as with the long extension cord example mentioned above, garden hoses or other tubing could be easily and stably looped together when not in use.

FIGS. 21-26 illustrate various views of a clamping structure configured and dimensioned to permit releasable attachment to any suitable surface projection, including but not limited to a flange on the underside of a solar panel frame 5, or a flange of a mounting rail 13 onto which panels 100 of a multi-panel solar system are mounted. FIG. 21 illustrates a top view of the wedging-tooth clamping structure 200 and a wedging cover or collar 32. FIG. 22 illustrates a right side view of the wedging-tooth clamping structure 200, along with a cross-section illustrating the toothed section on an interior surface of the the wedging cover or collar 32. FIGS. 23-26 illustrate the installation of the wedging-tooth clamping structure by sliding the wedging cover or collar along the length of the clamping structure and advancing it along the toothed outer portion of the wedging-tooth clamping structure to clamp the structure onto a portion of the frame or rail.

It can be seen in FIG. 22 that the wedging-tooth clamping structure 200 includes a wishbone or tweezer shaped structure including a pair of arms 202 joined near a proximal end 210 of the clamping structure 200, each of which have a toothed section 30 on their facing interior sides, near the distal end 220 of the clamping structure 200. The proximal end of the structure also includes at least one aperture 34 extending therethrough, which may be a circular aperture.

One of the arms 202 includes an outer toothed section 31 on an outer face of the arm 202. In the illustrated embodiment, the outer toothed section 31 is formed on a flexible section 29 of the arm 202. In particular, it can be seen that in the illustrated embodiment, the flexible section 29 may be a generally rectangular cantilevered section of the arm 202, with a fixed end at the end closest to the proximal end 210 of the clamping structure, and a free end closest to the distal end 220 of the clamping structure 200. A release button 28 or other projection may be provided at the distal end of the flexible section 29. In other embodiments, the flexible section 29 may not be cantilevered, but may be otherwise displaceable to allow the outer toothed section 31 to be displaced inward. The toothed sections 31 and 30 may include a plurality of grooves and ridges extending perpendicular to the plane of FIG. 22, although other structures may also be used.

The wedging cover or collar 32 may include a hollow interior section having a toothed inner face 33 configured to interact with the outer toothed section 31 of the clamping structure 200, with the orientation of the teeth such that the wedging cover or collar 32 can be slid in the distal direction without significant resistance, but the angles of the teeth prevent retraction of the wedging cover or collar 32 in the proximal direction.

FIGS. 23-26 illustrate the operation of the wedging-teeth clamping structure 200. The wedging cover or collar 32 is slid over the thinner proximal end of the clamping structure 200. In an initial step, the wedging cover or collar 32 may be slid to a position such that it passes beyond the distal end of the aperture 34, fully exposing the aperture 34 to allow insertion or retention of a tensioning structure, while not yet engaging the toothed outer surface 31 of the clamping structure 200. Such a position is illustrated, for example, in FIG. 24.

The clamping structure 200 may then be positioned such that a flange of a solar panel frame or support rail, or other structure, is positioned between the toothed sections 30 on the interior of the distal sections of arms 202. The wedging cover or collar 32 may be slid further in the direction of the distal end 220 of the clamping structure 200, such that the toothed inner face 33 of the wedging cover or collar 32 begins to engage in a complementary fashion with the toothed outer surface 31 of the clamping structure 200. At the same time, because the arms 202 of the clamping structure have surfaces which taper outwardly in the distal direction, advancement of the wedging cover or collar 32 towards the distal end 220 of the clamping structure 200 forces the arms together, due to the width of the hollow interior section of the wedging cover or collar 32.

As the wedging cover or collar 32 may be slid further in the direction of the distal end 220 of the clamping structure 200, the toothed inner face 33 of the wedging cover or collar 32 slides further down the toothed outer surface 31, pressing the arms 202 tighter together, such that the toothed inner surfaces 30 press into the flange (not shown) disposed therebetween, securing the clamping structure 200 to the flange. The orientation of the toothed inner face 33 of the wedging cover or collar 32 and the toothed outer surface 31 of the clamping structure 200 prevents the wedging cover or collar 32 from retracting in the proximal direction. The wedging cover or collar 32 may be slid until a tight fit is achieved between the arms 202 and the flange retained therebetween.

Once firmly secured to a suitable projection, one or more tensioning components may be attached to or through aperture 34 of clamping structure 200, and attached to wires beneath a given panel to keep the wires taut. Removal of the clamping structure may be accomplished by pressing inward on the flexible section 29 of the arm 202, to disengage the toothed inner face 33 of the wedging cover or collar 32 and the toothed outer surface 31 of the clamping structure 200, and allow retraction of the wedging cover or collar 32 in the proximal direction.

The wedging-tooth clamping structure may be made of any suitably stable material, including but not limited to plastic, metal, or polymer. In some embodiments, at least the toothed sections 30 may be metal, metallized, or otherwise sufficiently hard to allow them to dig into the flange or other structure disposed therebetween, providing a reliable and secure connection. In other embodiments, however, a frictional fit may be used in place of toothed structures, and other changes may be made to the embodiments of clamping structures depicted herein.

FIG. 27 illustrates an alternative embodiment of a wedging-toothed clamping structure configured and dimensioned to attach to the underside of a solar panel frame 5, or other suitable surface projection. As illustrated, clamping structure 300, which may be made from any suitably robust material, may be configured as a pliers-type clamp. After the pliers-type arms of the clamping structure 300 have been squeezed sufficiently to allow opposed teeth sets 30 to embed into a desired surface projection, spring 7 provides a tension between the pliers-type arms sufficient to ensure that clamping structure 300 remains attached to the projection. In addition to spring 7, opposite ends of a pair of connected pivoting bars 38 are connected to the end of pliers-type arms via pivoting pins 37. As further illustrated, one or more tensioning components 1 may be attached to or through an aperture provided at the point of connection between the pivoting bars 38, such that when a suitable length of the one or more tensioning components 1 is selected and the free ends of tensioning components 1 are connected to wires desired to be kept taut, additional tension is created between the pliers-type arms, which serves to increase the stability of the attachment of clamping structure 300 to the desired surface projection.

FIG. 30 illustrates a left side view of an alternative embodiment of an attachment device 51 configured and dimensioned for attachment to the underside of a solar frame 5, or other suitable projection. As illustrated, attachment device 51 comprises two apertures 34, which may be circular, to or through which tensioning components 52, similar to tensioning components 1 discussed above, are attached. As illustrated, attachment device 51, which may be made from any suitably robust material, has been configured to have a receiving cavity 50 dimensioned to receive an appropriate portion of a solar panel frame 5, or other suitable surface or projection (not shown).

Once attachment device 51 is pressed onto a given structure to which it is to be attached, frame-catching or penetrating bar 48 presses down against spring 7, thereby pivoting bar 48 about metal pin 47. Spring 7 is of a suitable length and has sufficient stiffness such that the distal interior corner of frame-catching or penetrating bar 48 that initially is pushed by spring 7 into receiving cavity 50 is pushed against the frame or other structure within receiving cavity 50, which serves to maintain secure attachment of device 51 to the desired surface. In the event that one wishes to remove or reposition attachment device 51, one simply must press in on the end of frame-catching bar 48 closest to the opening of receiving cavity 50, which will have the effect of rotating bar 48 so that the distal corner of the frame-catching bar 48 no longer makes contact with the surface within receiving cavity 50, at which point attachment device 51 may be repositioned or removed from the surface to which it is/was attached.

FIG. 31 illustrates an alternative embodiment of an attachment device 51 as that described above and illustrated with regard to FIG. 30, except that, as illustrated in FIG. 31, the device has only one through hole, not two, into which one or more tensioning components 52 may emanate from or attach to, or be guided through and thereby restrained.

FIG. 32 illustrates a left side cutaway view of an alternative embodiment of an attachment device 51 similar, for example, to those described above and illustrated with regard to FIGS. 30-31. The through hole of the attachment device 51 illustrated in this figure, however, is shaped to assume a curved contour through the body of the device, as opposed to a through hole drilled straight through the body of the device.

FIG. 33 illustrates a left side cutaway view of an alternative embodiment of an attachment device 51 similar to those described above and illustrated with regard to FIGS. 30-32. However, as illustrated, a pulley 54, which rotates about a metal pin 47, is disposed within an aperture in the attachment device, or positioned such that a tensioning component can wrap around the pulley 54 without the need to pass through an aperture in the attachment device, such as by positioning the pulley 54 at the distal end of the attachment device 51. Given the specific orientation of the pulley 54 illustrated in FIG. 33, one or more tensioning components 1 restrained by pulley 54 will, when properly connected to a wire or wires intended to be kept taut, be oriented in a plane that is perpendicular to the plane in which tensioning components connected to, restrained by, or emanating from the through hole of the attachment device of FIG. 31 are oriented.

FIG. 34 illustrates a left side view of an alternative embodiment of an attachment device 51 similar to that described above and illustrated with regard to FIG. 33, except that the pulley 54 is disposed parallel to the horizontal, as opposed to vertical, dimension of receiving cavity 50.

FIG. 35 illustrates a left side cutaway view of an attachment device as that described above and illustrated with regard to FIG. 30, except that the frame-catching or penetrating bar 49 shown in FIG. 35 does not have a free end which can be externally pressed to prevent a corner of bar 49 from digging into the structure onto which receiving cavity 50 has been pressed. As a result, unlike the attachment device 51 illustrated in FIG. 30, which may be repositioned or removed at will, once the attachment device 51 depicted in FIG. 35 is secured to a suitable structure, it may be more difficult to reposition or remove it, especially if the distal inner corner of the bar 49 digs deeply into the structure on which receiving cavity 50 has been pressed.

FIG. 36 illustrates a left side cutaway view of an alternative embodiment of an attachment device 51 as that described above and illustrated with regard to FIG. 31, except that the frame-catching or penetrating bar shown in FIG. 36 does not have a free end which can be externally pressed to prevent a corner of frame-catching bar 49 from digging into the structure onto which receiving cavity 50 has been pressed, making it difficult or impossible to reposition or remove it after installation.

FIG. 37 illustrates a left side cutaway view of an alternative embodiment of an attachment device 51 similar to that described above and illustrated with regard to FIG. 32, except that the frame-catching or penetrating bar 49 shown in FIG. 37 does not have a free end which can be externally pressed to prevent a corner of bar 49 from digging into the structure onto which receiving cavity 50 has been pressed, making it difficult or impossible to reposition or remove it after installation.

FIG. 38 illustrates a left side cutaway view of an alternative embodiment of an attachment device 51 similar to that described above and illustrated with regard to FIG. 33, except that the frame-catching or penetrating bar 49 illustrated in FIG. 38 does not have a free end which can be externally pressed to prevent a corner of frame-catching bar 49 from digging into the structure onto which receiving cavity 50 has been pressed, making it difficult or impossible to reposition or remove it after installation.

FIG. 39 illustrates a left side cutaway view of an alternative embodiment of an attachment device 51 similar to that described above and illustrated with regard to FIG. 34, except that the frame-catching or penetrating bar 4 illustrated in FIG. 39 does not have a free end which can be externally pressed to prevent a corner of frame-catching bar 49 from digging into the structure onto which receiving cavity 50 has been pressed, making it difficult or impossible to reposition or remove it after installation.

FIG. 39 illustrates a left side cutaway view of an alternative embodiment of an attachment device 51 similar to that described above and illustrated with regard to FIG. 34, except that the frame-catching or penetrating bar 49 illustrated in FIG. 39 does not have a free end which can be externally pressed to prevent a corner of frame-catching bar 49 from digging into the structure onto which receiving cavity 50 has been pressed, making it difficult or impossible to reposition or remove it after installation.

FIG. 40 illustrates a left side cutaway view of an alternative embodiment of an attachment device 51 similar to that described above and illustrated with regard to FIG. 30, except that an additional releasable frame-catching or penetrating bar 48 has been provided on the opposite side of the receiving cavity 50 illustrated in FIG. 30. The additional releasable frame-catching bar 48 provided in this embodiment ensures that the attachment device 51 of this embodiment may be more securely attached to structures inserted into receiving cavity 50 than would be the case for structures inserted into receiving cavity 50 of the embodiment of the attachment device 51 illustrated in FIG. 30.

FIG. 41 illustrates a left side cutaway view of an alternative embodiment of an attachment device 51 similar to that described above and illustrated with regard to FIG. 31, except that an additional releasable frame-catching or penetrating bar 48 has been provided on the opposite side of the receiving cavity 50 illustrated in FIG. 31. The additional releasable frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 31.

FIG. 42 illustrates a left side cutaway view of an alternative embodiment of an attachment device 51 similar to that described above and illustrated with regard to FIG. 32, except that an additional releasable frame-catching or penetrating bar 48 has been provided on the opposite side of the receiving cavity 50 illustrated in FIG. 32. The additional releasable frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 32.

Figure 43:
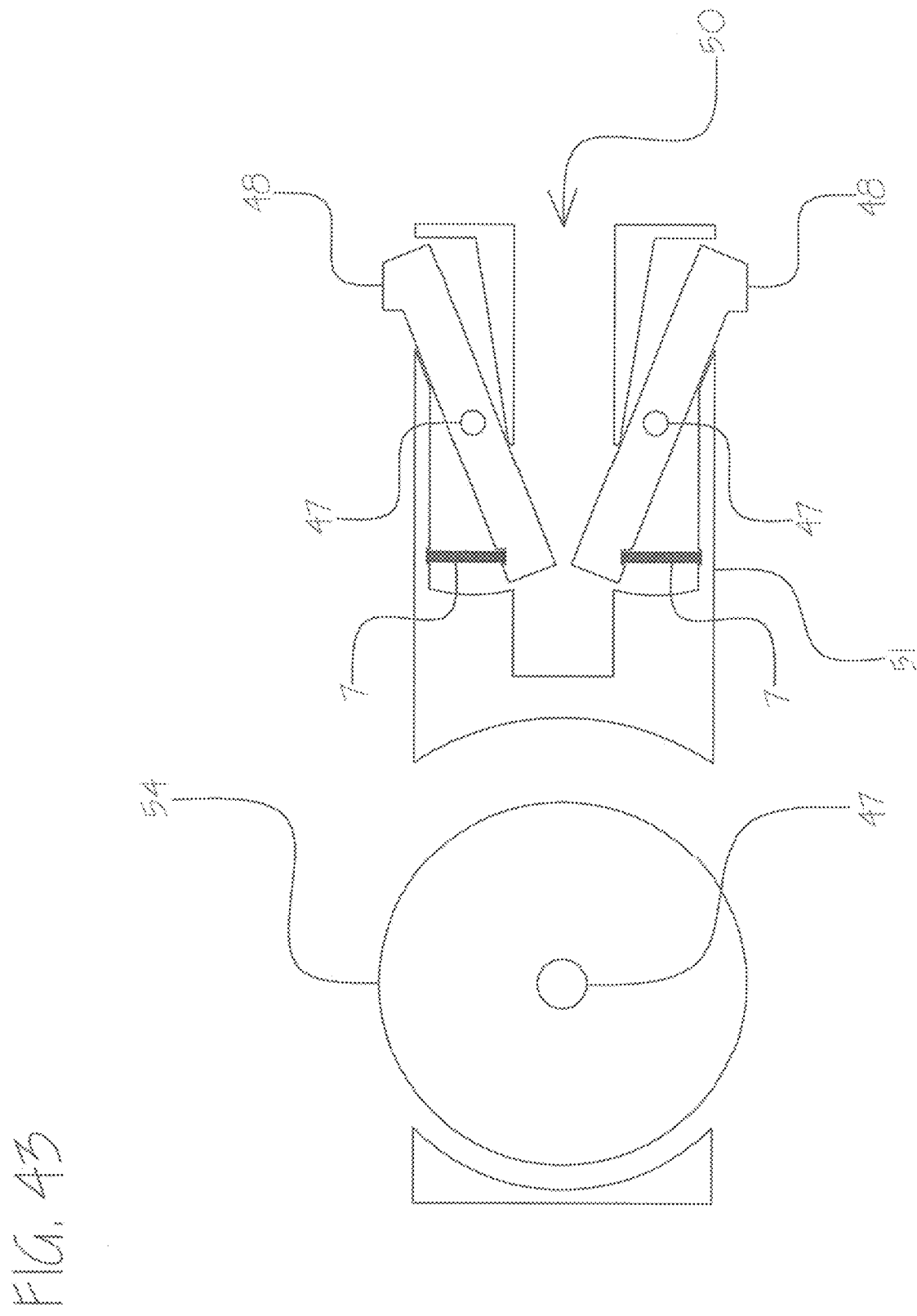
FIG. 43 illustrates a left side cutaway view of an attachment device as described with regard to FIG. 33, but with an additional releasable retaining bar disposed above a retaining cavity.

FIG. 43 illustrates a left side cutaway view of an alternative embodiment of an attachment device 51 similar to that described above and illustrated with regard to FIG. 33, except that an additional releasable frame-catching or penetrating bar 48 has been provided on the opposite side of the receiving cavity 50 illustrated in FIG. 33. The additional releasable frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 33.

Figure 44:
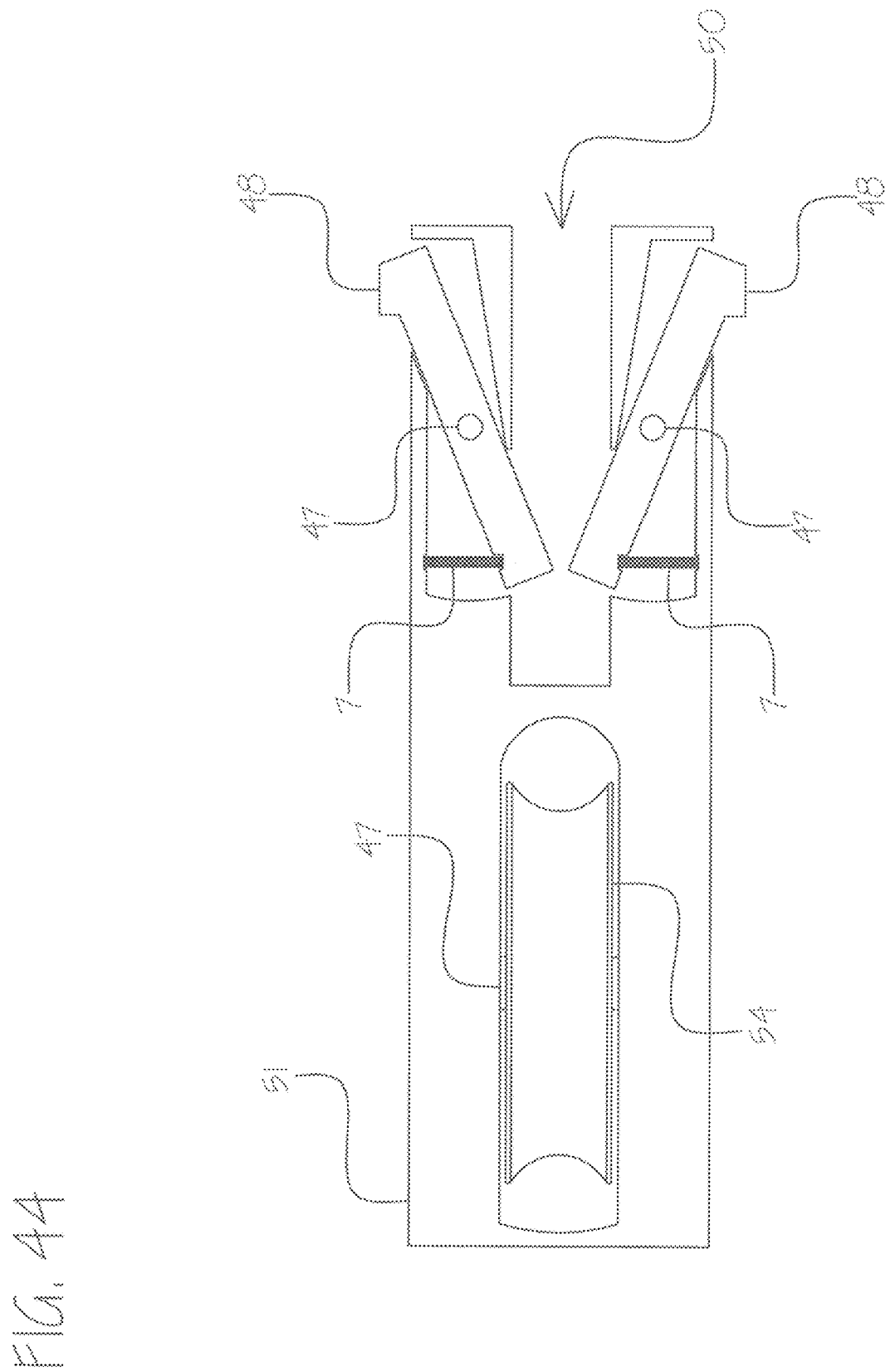
FIG. 44 illustrates a left side view of an attachment device as described with regard to FIG. 34, but with an additional releasable retaining bar disposed above a retaining cavity 50.

FIG. 44 illustrates a left side cutaway view of an alternative embodiment of an attachment device 51 similar to that described above and illustrated with regard to FIG. 34, except that an additional releasable frame-catching or penetrating) bar 48 has been provided on the opposite side of the receiving cavity 50 illustrated in FIG. 34. The additional releasable frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 34.

Figure 45:
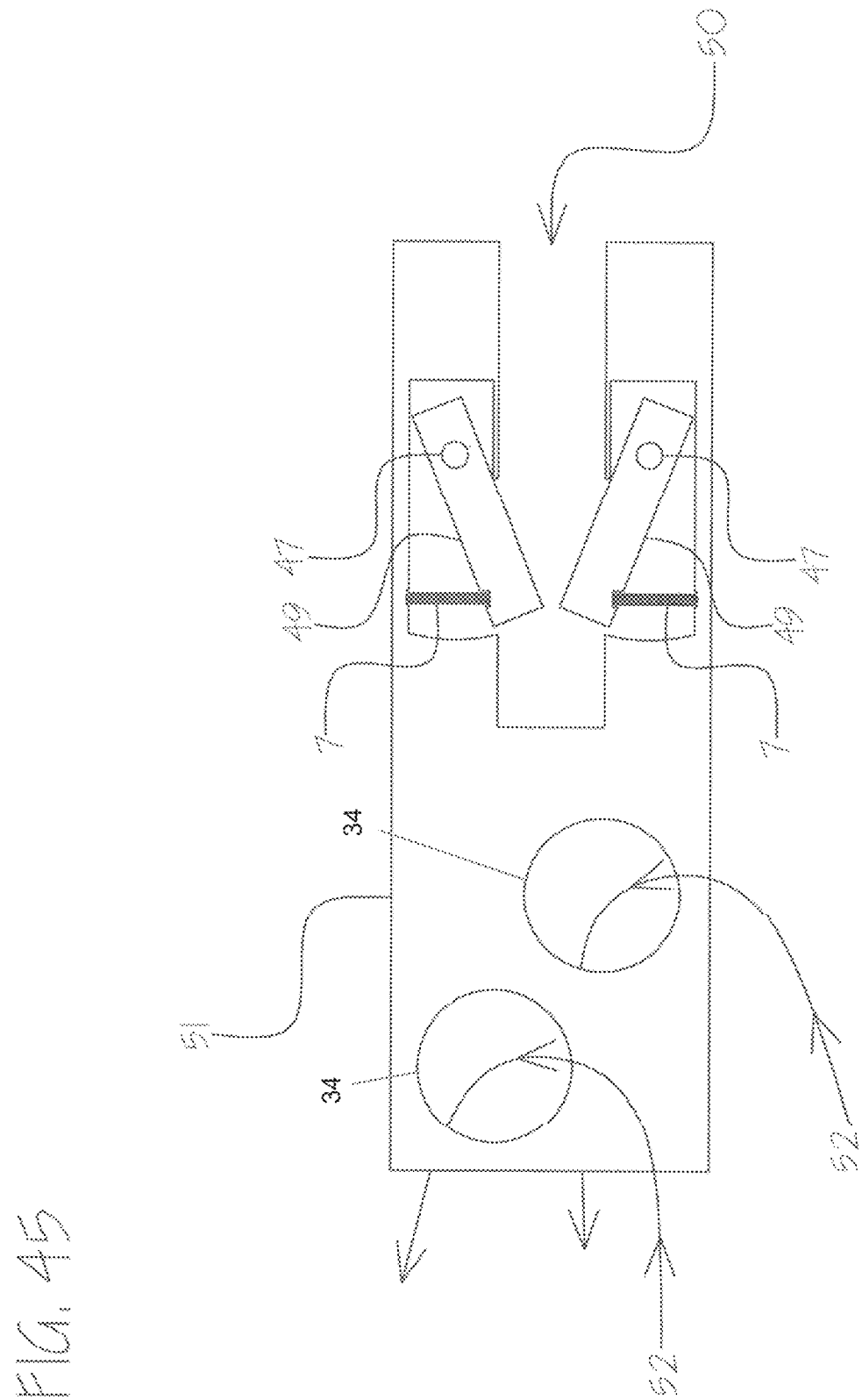
FIG. 45 illustrates a left side view of an attachment device as described in FIG. 35, but with an additional permanent frame-catching or penetrating bar disposed above a retaining cavity.

FIG. 45 illustrates a left side cutaway view of an alternative embodiment of an attachment device 51 similar to that described above and illustrated with regard to FIG. 35, except that an additional permanent frame-catching or penetrating bar 48 has been provided on the opposite side of the receiving cavity 50 illustrated in FIG. 35. The additional permanent frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 35.

Figure 46:
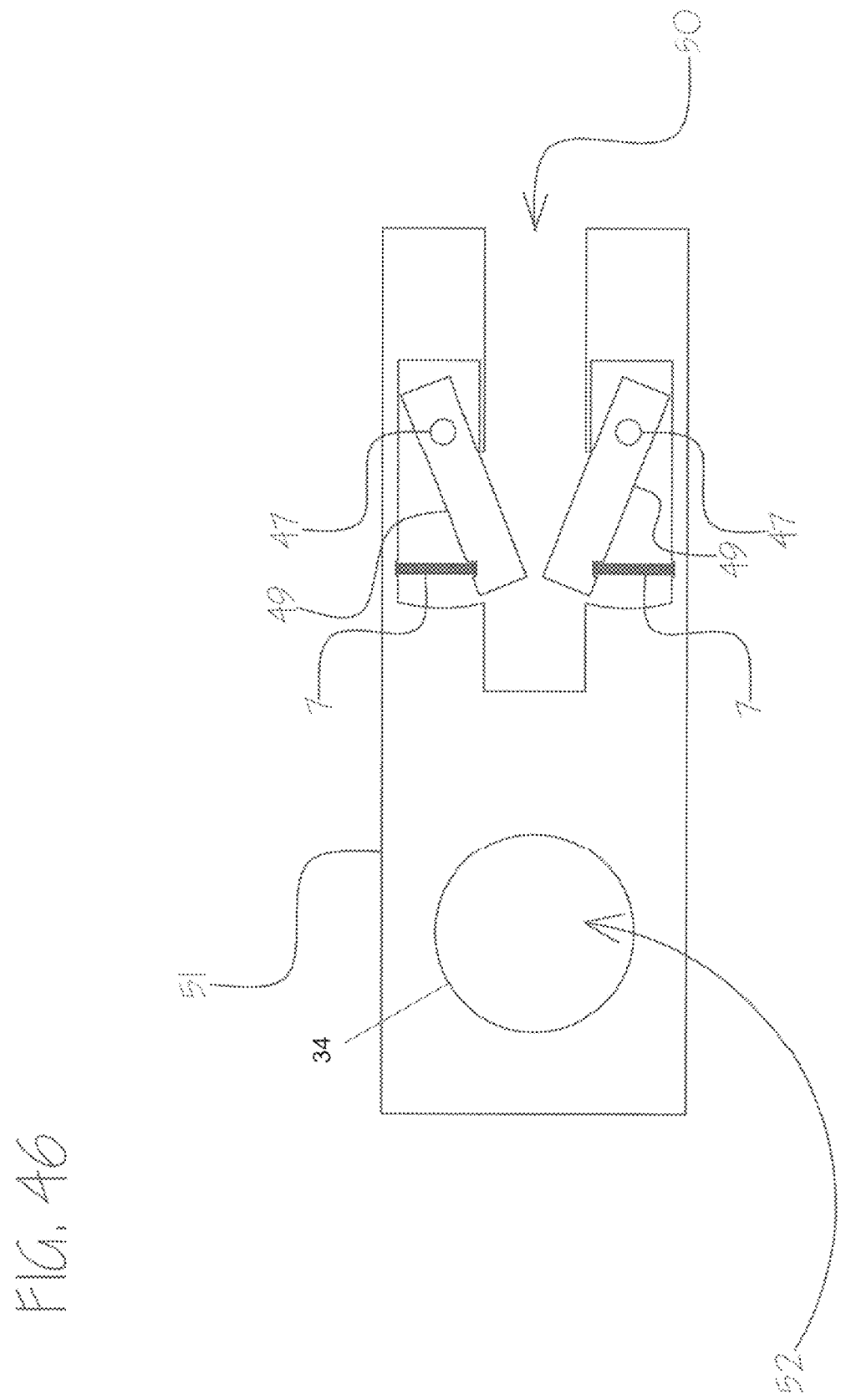
FIG. 46 illustrates a left side view of an attachment device as described above with regard to FIG. 36, but with an additional permanent frame-catching or penetrating bar disposed above a retaining cavity.

FIG. 46 illustrates a left side cutaway view of an alternative embodiment of an attachment device 51 similar to that described above and illustrated with regard to FIG. 36, except that an additional permanent frame-catching or penetrating bar 48 has been provided on the opposite side of the receiving cavity 50 illustrated in FIG. 36. The additional permanent frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 36.

Figure 47:
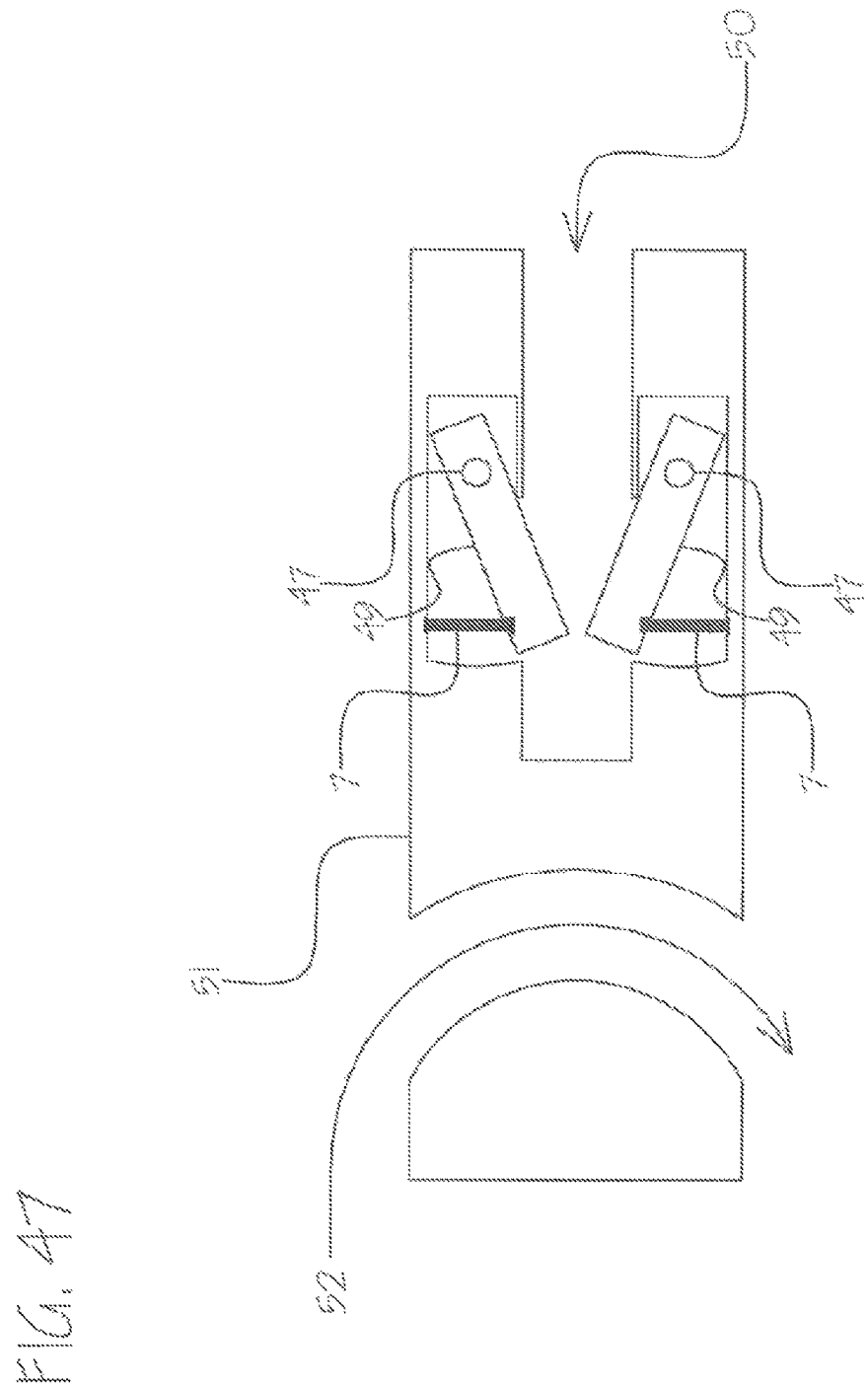
FIG. 47 illustrates a left side view of an attachment device as described above with regard to FIG. 37, but with an additional permanent frame-catching or penetrating bar disposed above a retaining cavity.

FIG. 47 illustrates a left side cutaway view of an alternative embodiment of an attachment device 51 similar to that described above and illustrated with regard to FIG. 37, except that an additional permanent frame-catching or penetrating bar 48 has been provided on the opposite side of the receiving cavity 50 illustrated in FIG. 37. The additional permanent frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 37.

Figure 48:
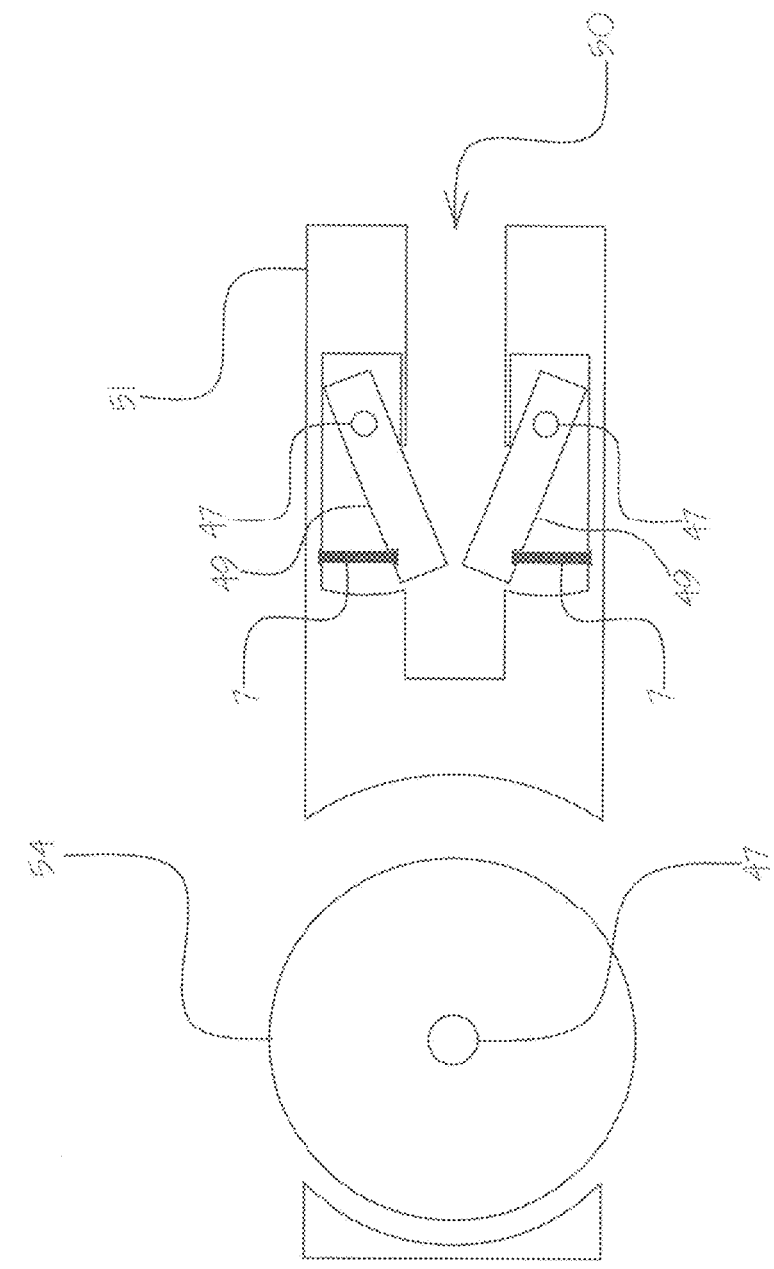
FIG. 48 illustrates a left side view of an attachment device as described above with regard to FIG. 38, but with an additional permanent frame-catching or penetrating bar disposed above a retaining cavity.

FIG. 48 illustrates a left side cutaway view of an alternative embodiment of an attachment device 51 similar to that described above and illustrated with regard to FIG. 38, except that an additional permanent frame-catching or penetrating bar 48 has been provided on the opposite side of the receiving cavity 50 illustrated in FIG. 38. The additional permanent frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 38.

Figure 49:
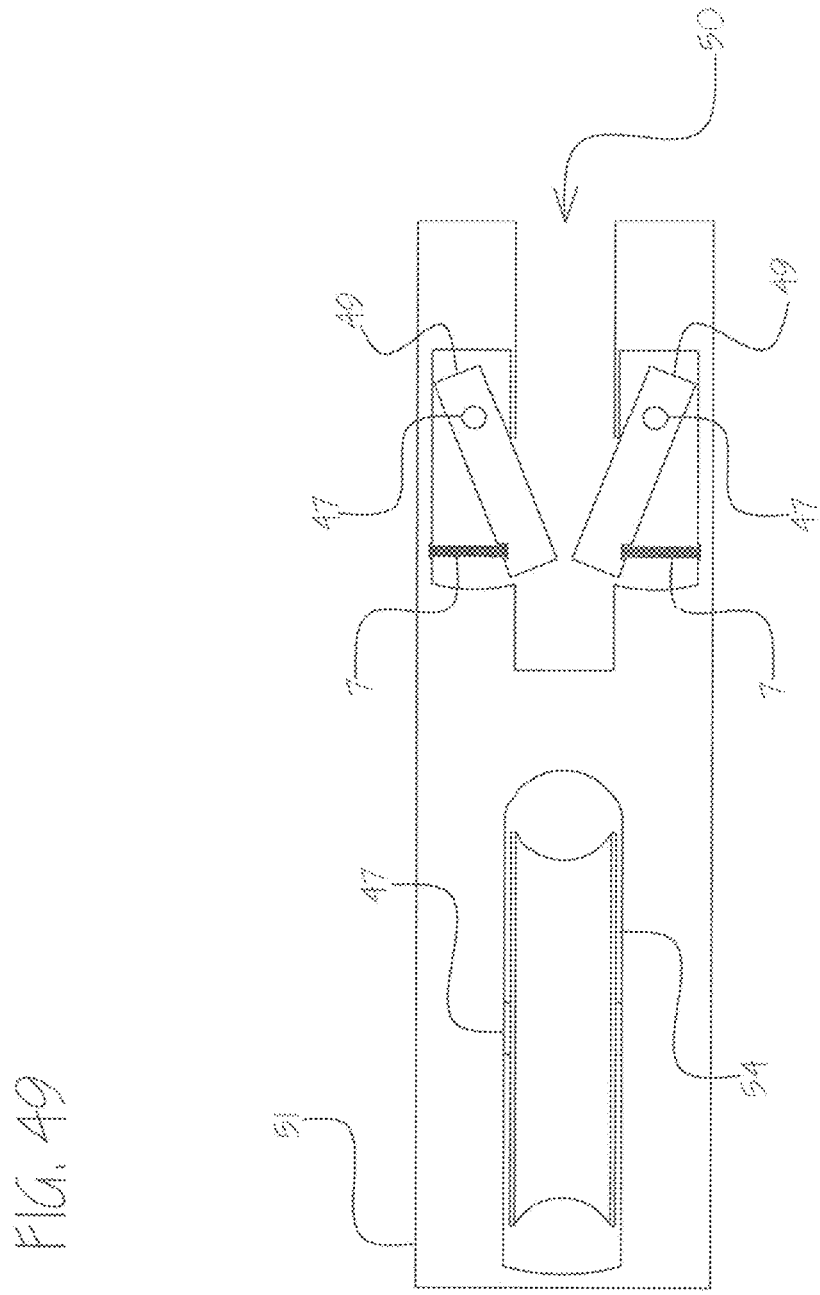
FIG. 49 illustrates a left side view of an attachment device as described above with regard to FIG. 39, but with an additional permanent frame-catching or penetrating bar disposed above a retaining cavity.

FIG. 49 illustrates a left side cutaway view of an alternative embodiment of an attachment device 51 similar to that described above and illustrated with regard to FIG. 39, except that an additional permanent frame-catching bar 48 has been provided on the opposite side of the receiving cavity 50 illustrated in FIG. 39. The additional permanent frame-catching bar 48 provided in this embodiment ensures that the attachment device 51 of this embodiment will tend to be more securely attached to structures inserted into receiving cavity 50 than would be the case for structures inserted into receiving cavity 50 of the embodiment of the attachment device 51 illustrated in FIG. 39.

Figure 50:
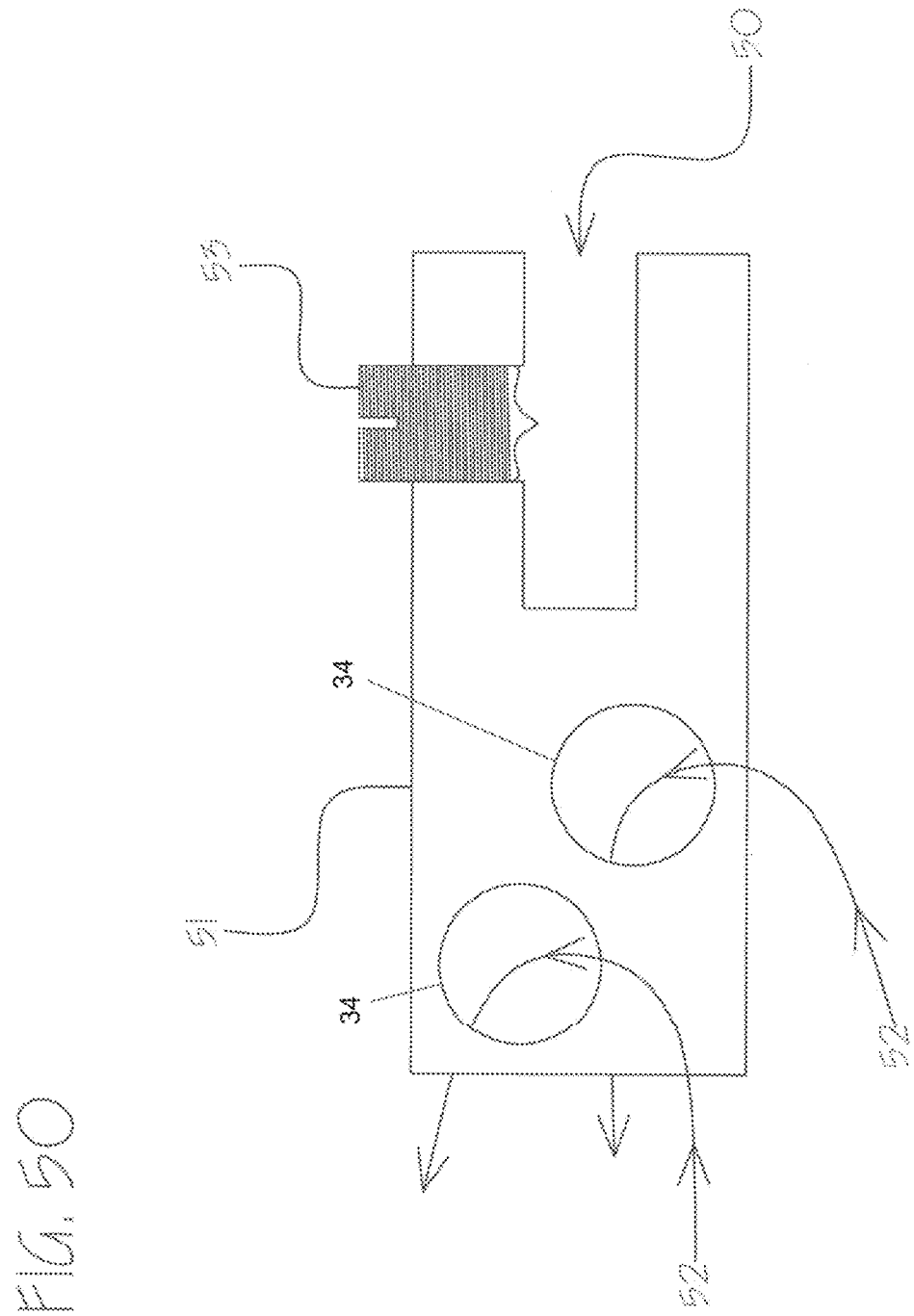
FIG. 50 illustrates a left side view of an attachment device that, as described above with regard to FIGS. 30 and 40, has two through holes, though which one or more tensioning cables may be guided and retained, and a securement set screw disposed above a receiving cavity which can be tightened against the frame of the solar panel after a projection of the frame has been seated in the receiving cavity.

FIG. 50 illustrates a left side cutaway view of an alternative embodiment of an attachment device 51 similar to those described above and illustrated with regard to both FIG. 30 and FIG. 40, except that in lieu of both the single releasable frame-catching or penetrating bar 48 of the attachment device 51 illustrated in FIG. 30, and the two releasable frame-catching bars of the attachment device 51 illustrated in FIG. 40, after the attachment device 51 of the embodiment illustrated in FIG. 50 is pressed onto a suitable structure—a portion of the frame of a solar panel 100, for example—such that a sufficient portion of the structure is accommodated in receiving cavity 50, the attachment device 51 is securely held in place by tightening a securement set screw 51, which may in some embodiments be made of or tipped in metal, until the tip of set screw 51 penetrates said structure.

Figure 51:
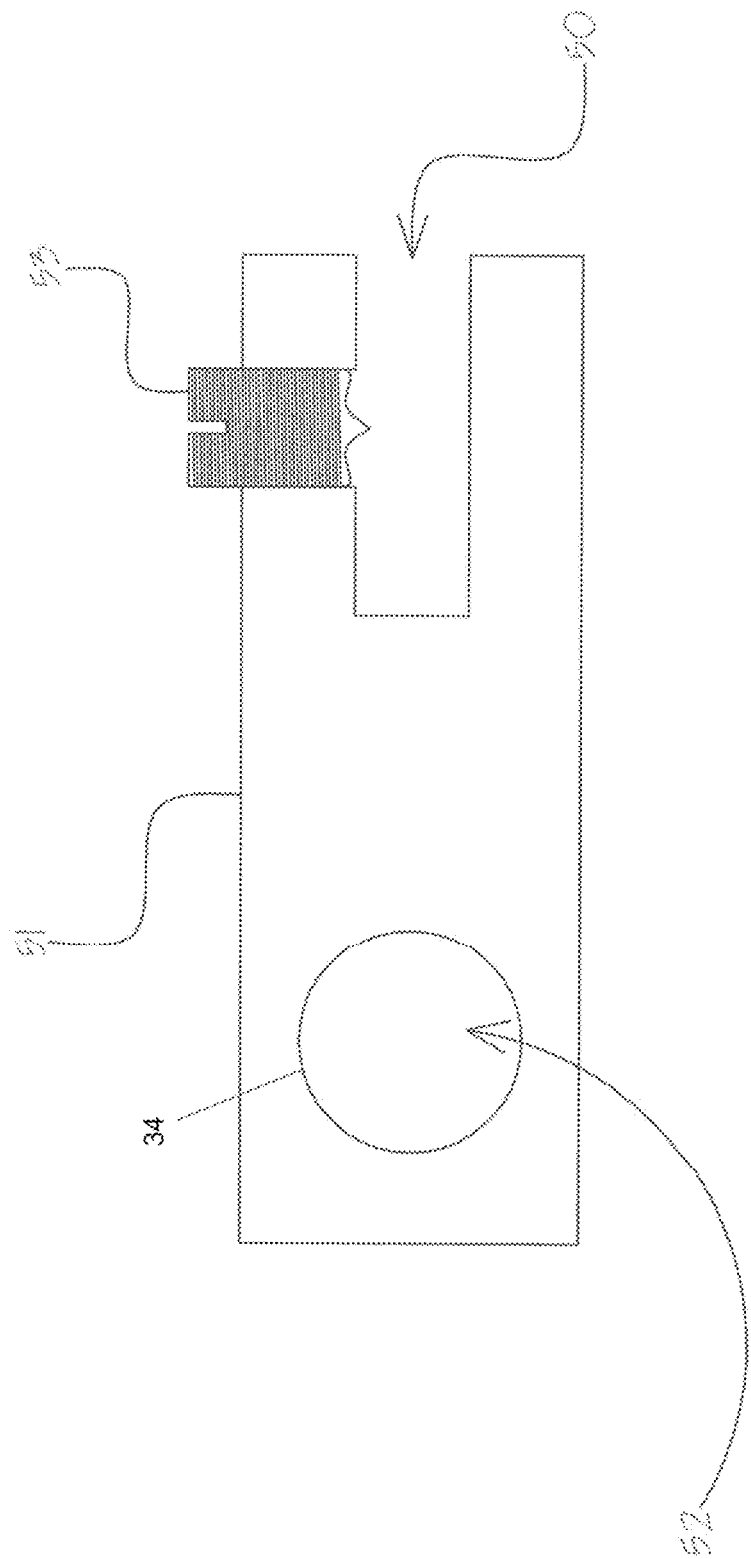
FIG. 51 illustrates a left side view of an attachment device as described above with regard to FIGS. 31 and 41, including a securement set screw to attach the device to the underside of the solar panel frame, in lieu of a permanent or releasable frame-catching bar.

FIG. 51 illustrates a left side cutaway view of an alternative embodiment of an attachment device 51 similar to those described above and illustrated with regard to both FIG. 31 and FIG. 41, except that in lieu of both the single releasable frame-catching or penetrating bar 48 of the attachment device 51 illustrated in FIG. 31, and the two releasable frame-catching bars of the attachment device 51 illustrated in FIG. 41, after the attachment device 51 of the embodiment illustrated in FIG. 51 is pressed onto a suitable structure—a portion of the frame of a solar panel 100, for example—such that a sufficient portion of the structure is accommodated in receiving cavity 50, the attachment device 51 is securely held in place by tightening a securement set screw 51, made of or tipped in metal, until the tip of set screw 51 penetrates said structure.

Figure 52:
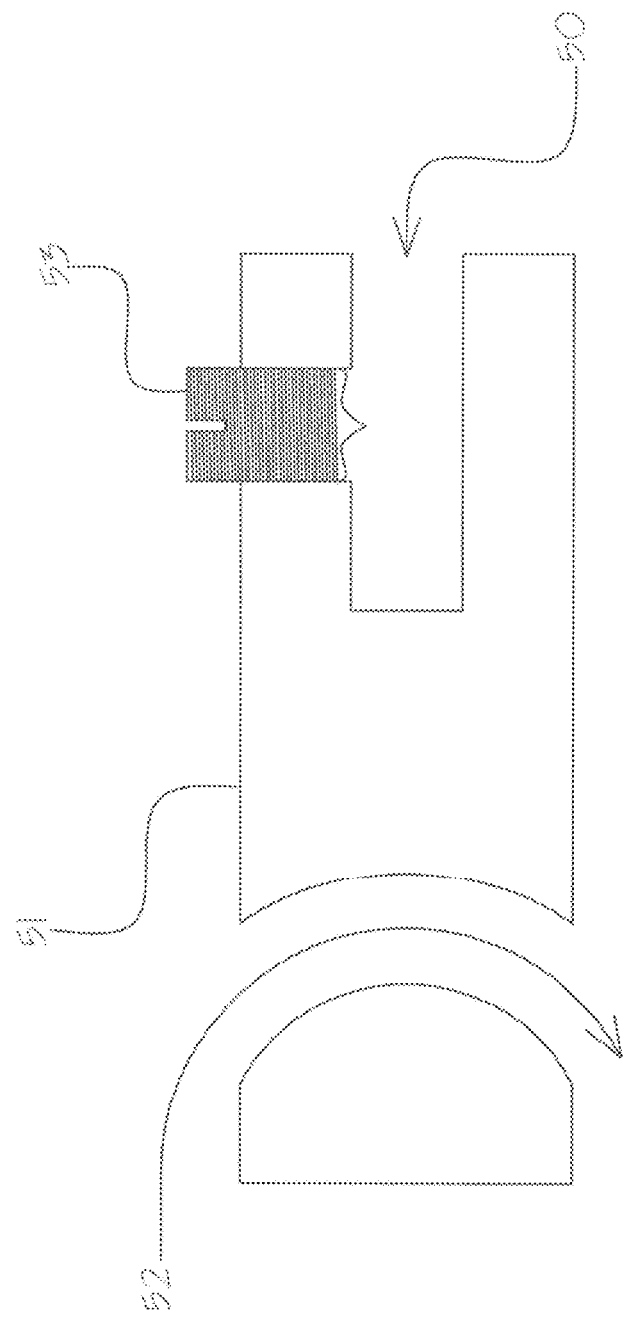
FIG. 52 illustrates a left side cutaway view of an attachment device as described above with regard to FIGS. 32 and 42, including a securement set screw to attach the device to the underside of the solar panel frame, in lieu of a permanent or releasable frame-catching bar.

FIG. 52 illustrates a left side cutaway view of an alternative embodiment of an attachment device 51 similar to those described above and illustrated with regard to both FIG. 32 and FIG. 42, except that in lieu of both the single releasable frame-catching or penetrating bar 48 of the attachment device 51 illustrated in FIG. 32, and the two releasable frame-catching bars of the attachment device 51 illustrated in FIG. 42, after the attachment device 51 of the embodiment illustrated in FIG. 52 is pressed onto a suitable structure—a portion of the frame of a solar panel 100, for example—such that a sufficient portion of the structure is accommodated in receiving cavity 50, the attachment device 51 is securely held in place by tightening a securement set screw 51, made of or tipped in metal, until the tip of set screw 51 penetrates said structure.

Figure 53:
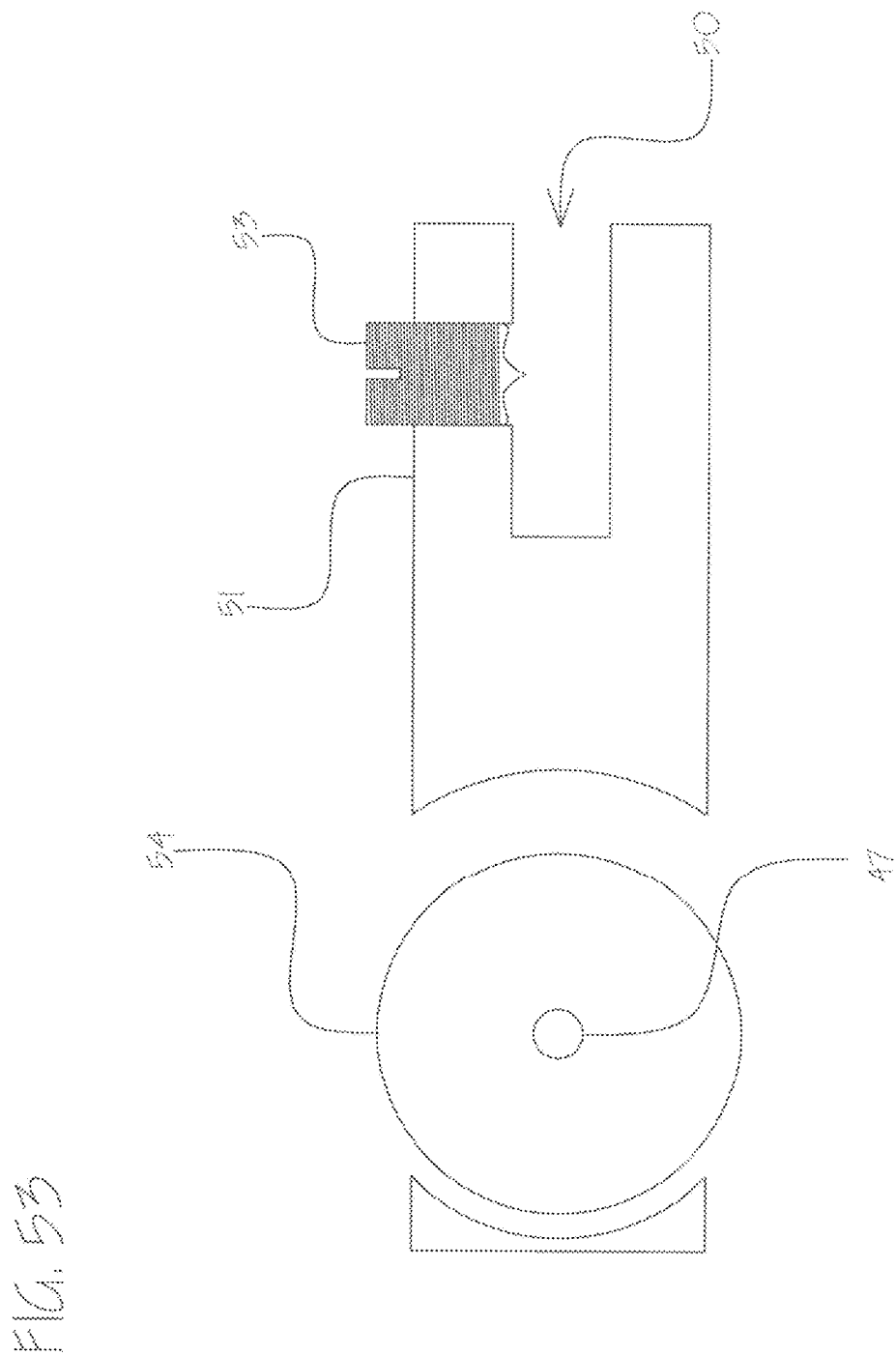
FIG. 53 illustrates a left side cutaway view of an attachment device as described above with regard to FIGS. 33 and 43, including a securement set screw to attach the device to the underside of the solar panel frame, in lieu of a permanent or releasable frame-catching bar.

FIG. 53 illustrates a left side cutaway view of an alternative embodiment of an attachment device 51 similar to those described above and illustrated with regard to both FIG. 33 and FIG. 43, except that in lieu of both the single releasable frame-catching or penetrating bar 48 of the attachment device 51 illustrated in FIG. 33, and the two releasable frame-catching bars of the attachment device 51 illustrated in FIG. 43, after the attachment device 51 of the embodiment illustrated in FIG. 53 is pressed onto a suitable structure—a portion of the frame of a solar panel 100, for example—such that a sufficient portion of the structure is accommodated in receiving cavity 50, the attachment device 51 is securely held in place by tightening a securement set screw 51, made of or tipped in metal, until the tip of set screw 51 penetrates said structure.

Figure 54:
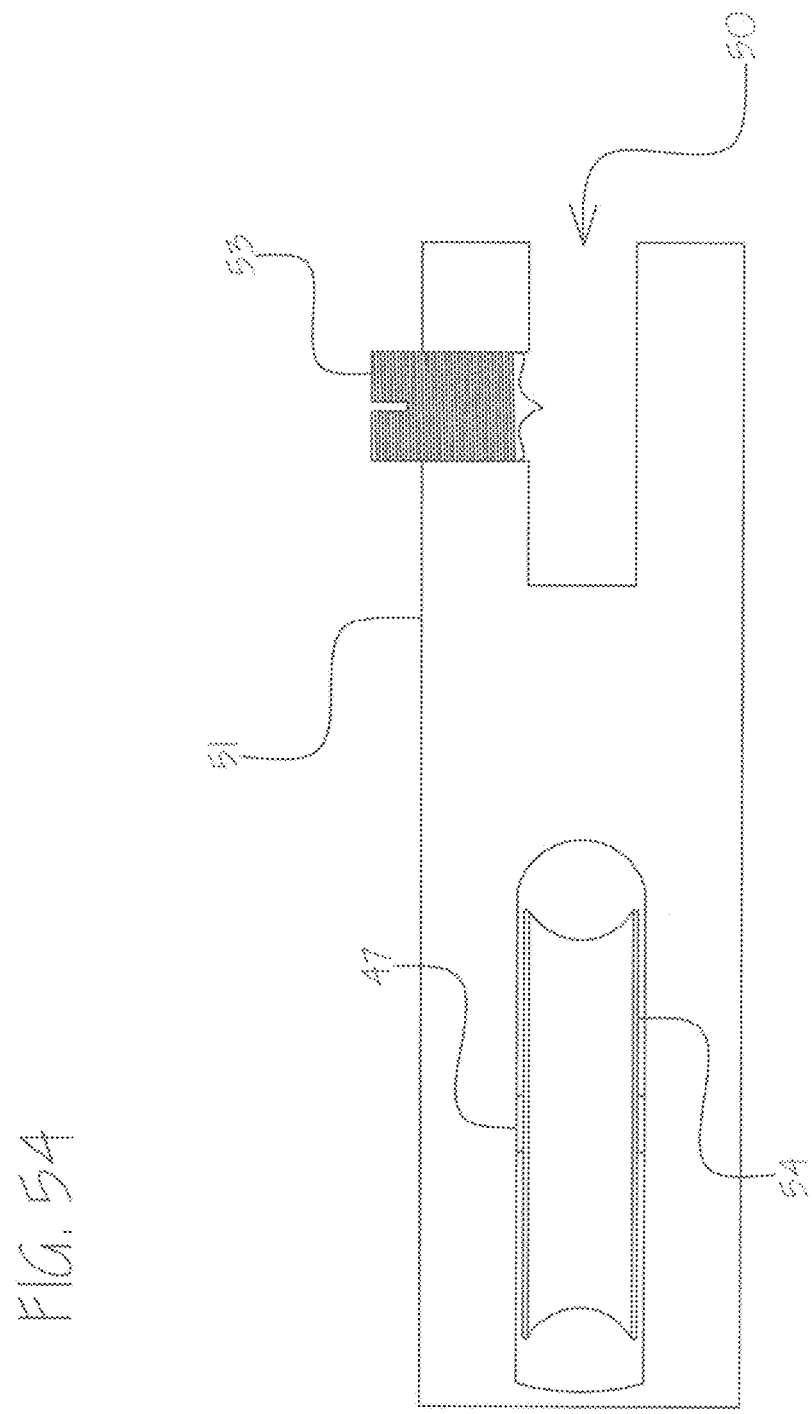
FIG. 54 illustrates a left side cutaway view of an attachment device as described above with regard to FIGS. 34 and 44, including a securement set screw to attach the device to the underside of the solar panel frame, in lieu of a permanent or releasable frame-catching bar.

FIG. 54 illustrates a left side cutaway view of an alternative embodiment of an attachment device 51 similar to those described above and illustrated with regard to both FIG. 34 and FIG. 44, except that in lieu of both the single releasable frame-catching or penetrating bar 48 of the attachment device 51 illustrated in FIG. 34, and the two releasable frame-catching bars of the attachment device 51 illustrated in FIG. 44, after the attachment device 51 of the embodiment illustrated in FIG. 54 is pressed onto a suitable structure—a portion of the frame of a solar panel 100, for example—such that a sufficient portion of the structure is accommodated in receiving cavity 50, the attachment device 51 is securely held in place by tightening a securement set screw 51, made of or tipped in metal, until the tip of set screw 51 penetrates said structure.

Figure 55:
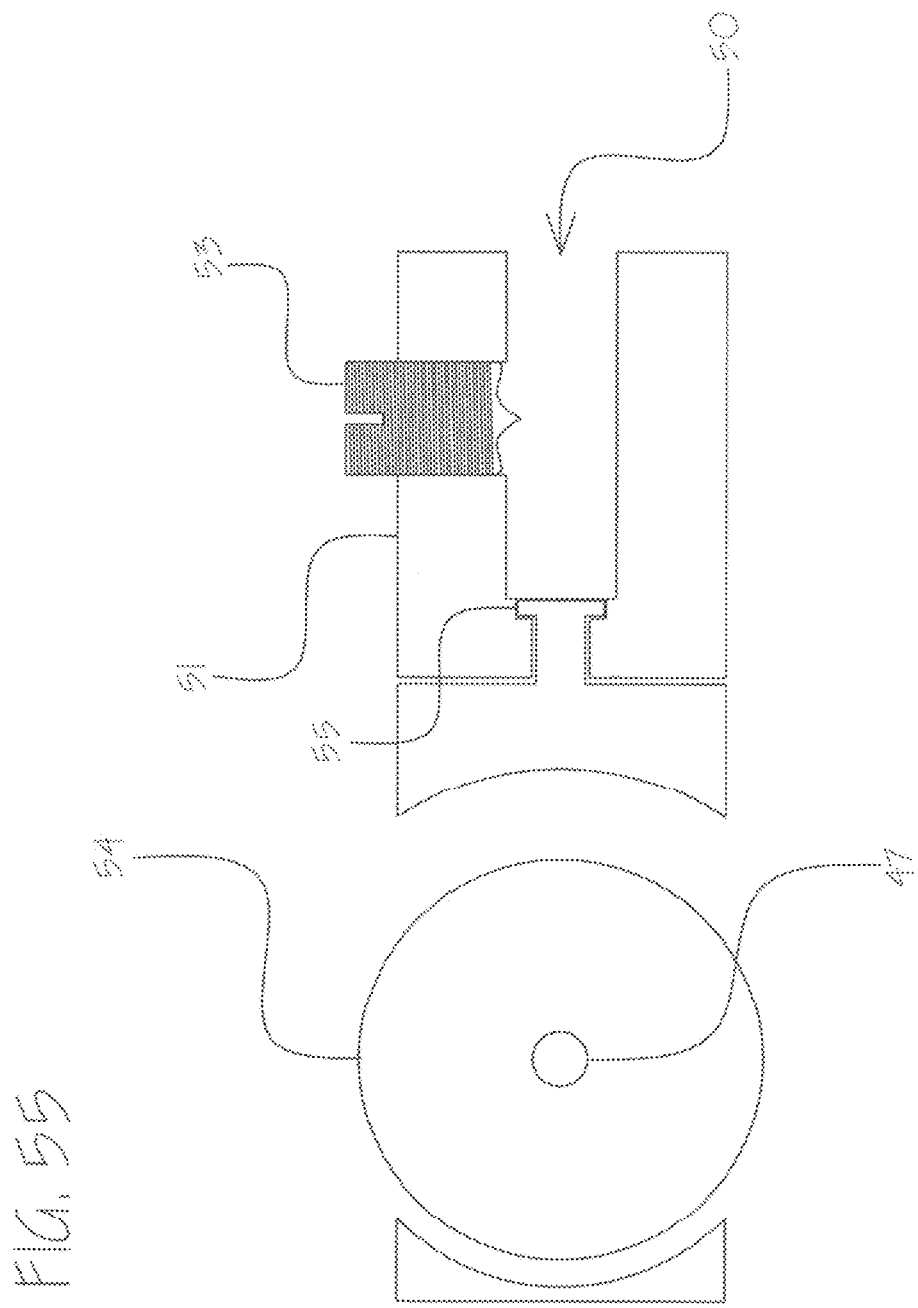
FIG. 55 illustrates a left side cutaway view of an attachment device, which which a guide or cavity 50 is configured to fit on a projection of a solar panel, and an attachment device may include a pulley through which one or more tensioning wires may be run, and then connected to electrical wiring of the solar panel.
Figure 67:
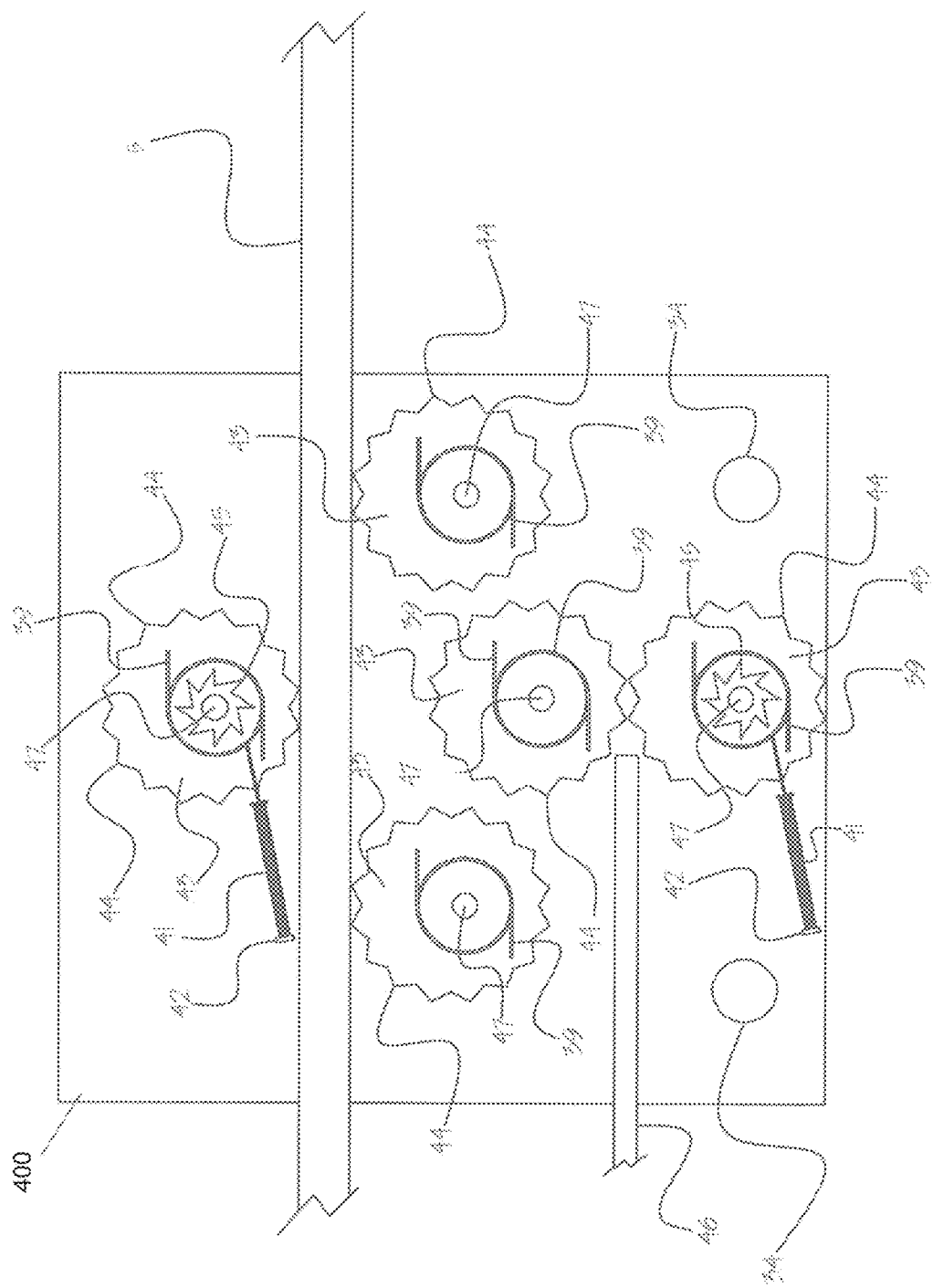

FIG. 55 illustrates a left side cutaway view of an alternative embodiment of an attachment device 51 similar to that described above and illustrated with regard to FIG. 53, except that the body of the attachment device 51 illustrated in FIG. 55 comprises two portions, distal and proximate, the boundary between the two portions being perpendicular to the longitudinal dimension of the attachment device, the distal portion of the device having a projection or neck 55 captively retained in or by the proximate portion, such that the distal portion of the device is free to rotate, as needed, perpendicularly to the longitudinal dimension of the device.

FIG. 56 illustrates a left side cutaway view of an alternative embodiment of an attachment device 51 similar to that described above and illustrated with regard to FIG. 48, except that the body of the attachment device 51 illustrated in FIG. 56 comprises two portions, distal and proximate, the boundary between the two portions being perpendicular to the longitudinal dimension of the attachment device, the distal portion of the device having a projection or neck 55 captively retained in or by the proximate portion, such that the distal portion of the device is free to rotate, as needed, perpendicularly to the longitudinal dimension of the device.

Figure 57:
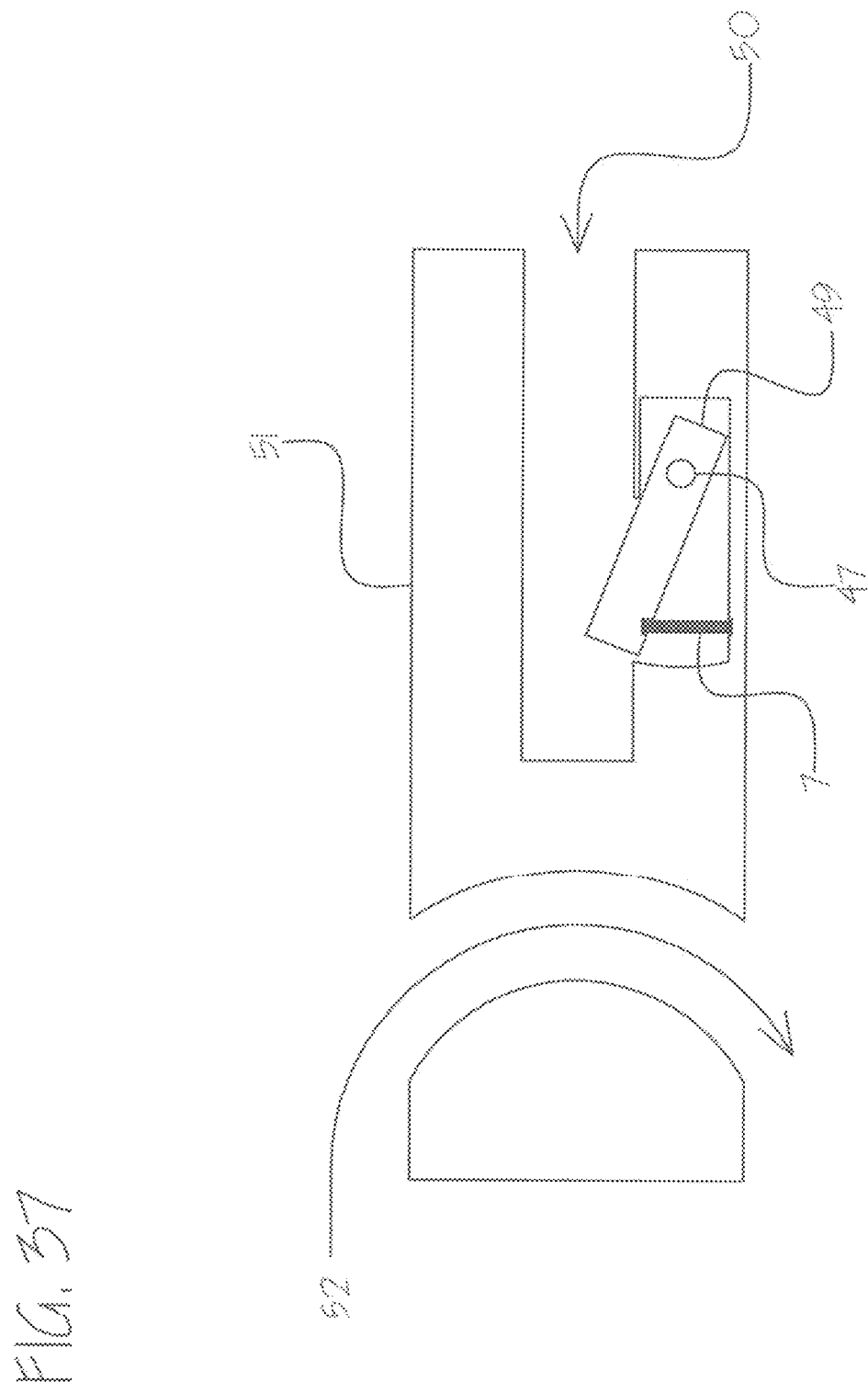

FIG. 57 illustrates a left side cutaway view of an alternative embodiment of an attachment device 51 similar to that described above and illustrated with regard to FIG. 56, except that device illustrated in FIG. 57 has only one more permanent frame-catching or penetrating bar 49, located to the right of receiving cavity 50, as opposed to two more permanent frame-catching bars, one on both sides of receiving cavity 50.

FIG. 58 illustrates a left side cutaway view of an alternative embodiment of an attachment device 51 similar to that described above and illustrated with regard to FIG. 56, except that each of the two frame-catching or penetrating bars 48 are of the more easily releasable type, not the more permanent type.

FIG. 59 illustrates a left side cutaway view of an alternative embodiment of an attachment device 51 similar to that described above and illustrated with regard to FIG. 57, except that the frame-catching or penetrating bar 49 is of the more easily releasable type, not the more permanent type.

FIGS. 60 and 61 illustrates a front view of a grounding wire device 400 attached, as illustrated, to a portion, such as a projection or flange of a solar frame 5. The device is configured and dimensioned so that it may be attached to the solar frame 5 by positioning, as illustrated, the portion of the device between the three uppermost gears 43 of the device adjacent to the desired portion of the frame. The device is then laterally pressed onto the frame. A grounding wire 46, which may be a copper wire, is then inserted between The gears 43 may be eccentric gears, as shown, and may be supported by a pin 47 and biased through the use of spring, coil, or coil spring 39. The gears may be covered in a non-corrosive material such as stainless steel or tin-covered copper, and may include sharp prongs or toothed elements 44 which can be used, for example, to penetrate through an anodized layer of an anodized aluminum frame 5 to allow for an electrical connection A retaining spring 41, along with a screw 42 which can be used to release the retainer spring, can be used to engage the retainer gear 45 to inhibit rotation of the gears 43. FIG. 61 shows the retainer screw disengaged, while FIG. 60 shows the retainer screw engaged. The grounding wire device 400 thus allows for grounding of the solar panel without the need for tools.

Figure 63:
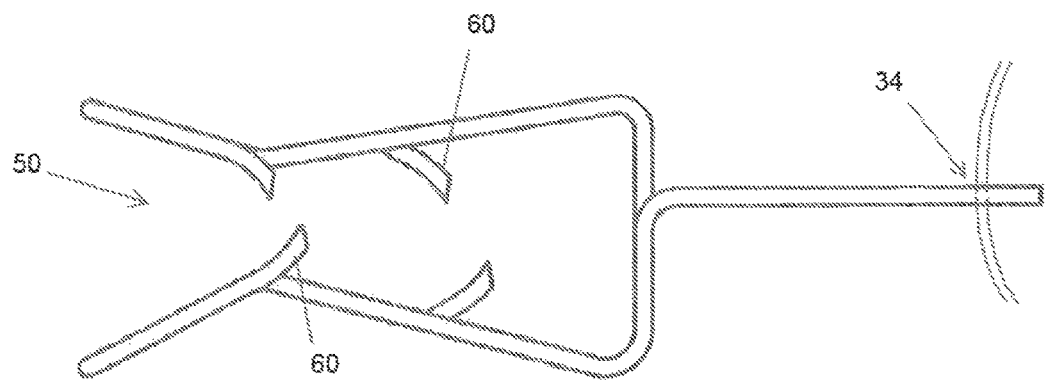
FIG. 63 illustrates another embodiment of a wire tensioning device, including a receiving cavity or guide channel that allows a portion of a solar panel to be received therein, and at least one securing mechanism disposed along the receiving cavity to contact and secure the structure that is received by the cavity.

FIG. 63 depicts an embodiment of a toothed attachment clip which can be used to attach to a frame, projection, or other fixed component, and provide an anchor location for a tensioning member to be attached. In the illustrated embodiment, the clip includes an attachment end having inwardly extending prongs on both sides of a retaining space and biased towards the retaining space, such that the clip can be inserted over the frame or projection and forced on to spread the retaining space wider, allowing passage of the clip onto the frame. The angled prongs can dig into the frame or frictionally retain the clip on the frame, inhibiting removal of the clip. A loop or aperture 34 or similar structure can then be used as an attachment point for a tensioning component of a wire tensioning system such as those described elsewhere herein.

A wide range of other attachment clip designs may be used. In some embodiments, an attachment clip may be configured to engage one or more holes in the frame of the solar panel. For example, a clip may include a retention space defined by two arms, the retention space configured to receive a portion of the frame. At least one of the arms may include at least one prong dimensioned to fit into the frame. The prong may extend substantially orthogonally from the arm. Such an attachment clip may be made from a material which is sufficiently flexible to allow deformation of the arms of the clip including or opposite the prong to allow insertion of the prong into the hole, and once inserted, the prong may inhibit removal of the attachment clip.

In some embodiments, an attachment clip may include a toothed jaw which is configured to clamp onto a portion of the frame, or a biased jaw which is configured to frictionally retain a portion of the frame. The jaw may be biased internally, or may include a separate biasing structure.

In some embodiments, an attachment clip may include a shaped portion of wire or other structure which is configured to be pressed over a section of the frame, and/or inserted through a hole in the frame. In some embodiments, an attachment clip may not have an aperture or loop through which the tensioning structure will pass, but may instead include a bend or other shape which constrains the position of the tensioning structure to a particular location, notch, or channel when the tensioning structure is under load. In some embodiments, an attachment structure may include a wire with a stop at one end which is wider than the dimensions of a hole in the frame.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted herein may be combined, interchanged or excluded from other embodiments.

What is claimed is:

1. A method for managing electrical wiring for a solar panel system that includes a plurality of solar panels and an inter-panel wire arrangement of wires that carry power generated by the solar panels, each solar panel including a front side configured to receive light for converting into energy and a back side, the wire arrangement disposed proximal to the back side, the method comprising:
   coupling an attachment device to a portion of one of the plurality of solar panels, the attachment device comprising
      a body having a first end and a second end,
      at least one aperture arranged proximate to a first end of the body,
      a channel having an opening on the second end of the body, and
      a securing mechanism disposed along at least a portion of the channel, the securing mechanism configured to allow a structure received in the channel to extend past the securing mechanism and secure the structure in the channel to couple the attachment device to the portion of one of the plurality of solar panels;
   securing a portion of a tensioning component to the attachment device by placing a portion of the tensioning component through the at least one aperture, the tensioning component comprising an elastic material configured to permit elongation of the tensioning component, the tensioning component including a first end having a first fastener; and
   attaching the first fastener to a portion of the wire arrangement, such that a portion of the tensioning component extends between the attachment device and the portion of the wire arrangement, to provide tension on the wire arrangement via a restoring force of the tensioning component.

2. The method of claim 1, wherein the tensioning component further comprises a second end having a second fastener, and wherein the method further comprises attaching the second fastener to a second portion of the wire arrangement to provide tension on the wire arrangement.

3. The method of claim 1, wherein the attachment device further comprises two or more apertures arranged in the body.

4. The method of claim 1, further comprising coupling a second tensioning component to the attachment device, the second tensioning component including a first end with a first fastener, and wherein the method further comprises attaching the first fastener of the second tensioning component to a second portion of the wire arrangement.

5. The method of claim 1, wherein the attachment device includes a spring biasing a contact member to secure the structure in the guide channel.

6. The method of claim 1, wherein the securing mechanism includes at least one member protruding into the guide channel, the at least one member configured to allow the structure to move past the at least one member and secure the structure into the guide channel.

7. The method of claim 1, wherein the attachment device further comprises a pulley.

8. The method of claim 1, wherein the channel is configured to allow a projection of a solar panel to be inserted therein.

9. The method of claim 1, wherein the guide channel is disposed between two elongated members of the guide channel.

10. A solar panel system having a wire tensioning device installed thereon, the solar panel system comprising:
    a solar panel including a front side configured to receive light for converting into energy and a back side;
    a wire arrangement that carries power generated by the solar panel, the wire arrangement disposed proximal to the back side the solar panel;
    an attachment device coupled to a portion of the solar panel, the attachment device comprising:
       a body having a first end and a second end;
       at least one aperture arranged proximate to a first end of the body;
       a guide channel arranged proximate to the second end of the body and extending into the body, the guide channel having an opening on the second end of the body; and
       a securing mechanism disposed along at least a portion of the guide channel, the securing mechanism configured to allow a structure in the guide channel to extend past the securing mechanism and secure the structure in the guide channel; and
    a tensioning component, a portion of the tensioning component secured to the attachment device by placing a portion of the tensioning component through the at least one aperture, the tensioning component comprising an elastic material configured to permit elongation of the tensioning component, the tensioning component including a first end having a first fastener, the first fastener attached to a portion of the wire arrangement, such that a portion of the tensioning component extends between the attachment device and the portion of the wire arrangement, to provide tension on the wire arrangement via an axial restoring force of the tensioning component.

11. The system of claim 10, further comprising two or more apertures arranged in the body.

12. The system of claim 10, further comprising a tensioning component, the tensioning component and the aperture correspondingly sized to allow a portion of the tensioning component to pass through the aperture.

13. The system of claim 12, wherein the tensioning component has a first end and a second end, and wherein the tensioning component includes an attachment mechanism on each end of the first and second end.

14. The system of claim 10, wherein the securing mechanism includes a spring biasing a contact member to secure the structure in the guide channel.

15. The system of claim 10, further comprising a pulley.

16. The system of claim 10, wherein the guide channel is configured to allow a projection of a solar panel to be inserted therein.

17. The system of claim 12, wherein the tensioning component comprises a spring.

18. The system of claim 13, wherein the aperture is sized to allow an attachment mechanism of the tensioning component to pass through the aperture.

19. The method of claim 1, wherein the tension on the wire arrangement maintains at least one wire of the wire arrangement in a sufficiently taut position to prevent contact between the wire and an underlying structure.

20. The method of claim 1, wherein attaching the first fastener to a portion of the wire arrangement comprises elongating the tensioning component, and wherein the restoring force of the elongated tensioning component provides tension on the wire arrangement.

\* \* \* \* \*